United States Patent
Hitomi et al.

(10) Patent No.: US 10,184,052 B2
(45) Date of Patent: Jan. 22, 2019

(54) NEAR INFRARED RADIATION-ABSORBING COMPOSITION, NEAR INFRARED RADIATION CUT-OFF FILTER AND PRODUCTION METHOD THEREFOR, AND CAMERA MODULE AND PRODUCTION METHOD THEREFOR

(71) Applicant: FUJIFILM Corporation, Tokyo (JP)

(72) Inventors: Seiichi Hitomi, Haibara-gun (JP); Takashi Kawashima, Haibara-gun (JP); Kouitsu Sasaki, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 15/192,284

(22) Filed: Jun. 24, 2016

(65) Prior Publication Data
US 2016/0304730 A1 Oct. 20, 2016

Related U.S. Application Data

(63) Continuation of application No. PCT/JP2015/051171, filed on Jan. 19, 2015.

(30) Foreign Application Priority Data

Jan. 21, 2014 (JP) .................................. 2014-008919
Oct. 28, 2014 (JP) .................................. 2014-219260

(51) Int. Cl.
*C01G 3/00* (2006.01)
*C01B 25/00* (2006.01)
(Continued)

(52) U.S. Cl.
CPC .............. *C09D 5/32* (2013.01); *C01B 21/082* (2013.01); *C01B 25/00* (2013.01); *C01G 3/006* (2013.01);
(Continued)

(58) Field of Classification Search
CPC ........ C01G 3/00; C01G 3/006; C01B 21/082; C01B 17/98; C01B 25/00; H01B 1/00; H01B 1/06
See application file for complete search history.

(56) References Cited

U.S. PATENT DOCUMENTS 6,218,072 B1 * 4/2001 Otaguro ................. G11B 7/246
369/283

FOREIGN PATENT DOCUMENTS

JP 61-26686 A * 2/1986
JP 11-052127 A 2/1999
(Continued)

OTHER PUBLICATIONS

International Search Report of PCT/JP2015/051171 dated Feb. 17, 2015.
(Continued)

*Primary Examiner* — Mark T Kopec
(74) *Attorney, Agent, or Firm* — Sughrue Mion, PLLC

(57) ABSTRACT

An object of the present invention is to provide a near infrared radiation-absorbing composition having favorable shielding properties in a near infrared range when used to produce cured films, a near infrared radiation cut-off filter and a production method therefor, and a camera module and a production method therefor. The near infrared radiation-absorbing composition including a copper complex formed by reacting a compound (A) having two or more coordinating atoms that form bonds using unshared electron pairs with a copper component.

17 Claims, 2 Drawing Sheets

(51) Int. Cl.
  *C09D 5/32* (2006.01)
  *C01B 21/082* (2006.01)
  *C08L 63/00* (2006.01)
  *G02B 5/22* (2006.01)
  *H01L 27/14* (2006.01)
  *G02B 5/20* (2006.01)
  *C08K 5/00* (2006.01)
  *C09D 163/04* (2006.01)
  *H01L 27/146* (2006.01)
  *H04N 5/225* (2006.01)
  *C09D 7/63* (2018.01)

(52) U.S. Cl.
  CPC ............ *C08K 5/0091* (2013.01); *C08L 63/00* (2013.01); *C09D 7/63* (2018.01); *C09D 163/04* (2013.01); *G02B 5/208* (2013.01); *G02B 5/22* (2013.01); *G02B 5/223* (2013.01); *H01L 27/14* (2013.01); *H01L 27/1462* (2013.01); *H01L 27/14685* (2013.01); *H04N 5/2257* (2013.01)

(56) References Cited

FOREIGN PATENT DOCUMENTS

| JP | 11-208118 A | | 8/1999 |
|----|----|----|----|
| JP | 2000-007870 A | | 1/2000 |
| JP | 2001-174626 | * | 6/2001 |
| JP | 2002-069305 A | | 3/2002 |
| JP | 2011-063814 A | | 3/2011 |
| JP | 2013-253224 A | | 12/2013 |
| RU | 2119533 | * | 9/1998 |
| TW | 201009024 A1 | | 3/2010 |
| WO | 2010/024203 A1 | | 3/2010 |
| WO | 2013/168824 A1 | | 11/2013 |

OTHER PUBLICATIONS

Written Opinion of PCT/JP2015/051171 dated Feb. 17, 2015.
Office Action dated Nov. 17, 2017, issued from Korean Intellectual Property Office in corresponding Korean Application No. 10-2016-7017337.
International Preliminary Report on Patentability dated Aug. 4, 2016, issued by the International Bureau in corresponding International Application No. PCT/JP2015/051171.
Office Action dated Mar. 21, 2017 from the Japanese Patent Office in counterpart Japanese Application No. 2014-219260.
Office Action dated Jul. 25, 2017, issued from the Japanese Patent Office in corresponding Japanese Application No. 2014-219260.
Office Action dated Jul. 26, 2018 issued by the Intellectual Property Office of Taiwan in corresponding Taiwanese Application No. 104101267.

* cited by examiner

NEAR INFRARED RADIATION-ABSORBING COMPOSITION, NEAR INFRARED RADIATION CUT-OFF FILTER AND PRODUCTION METHOD THEREFOR, AND CAMERA MODULE AND PRODUCTION METHOD THEREFOR

This application is a Continuation of PCT International Application No. PCT/JP2015/051171 filed on Jan. 19, 2015, which claims priority under 35 U.S.C § 119(a) to Japanese Patent Application No. 2014-008919 filed on Jan. 21, 2014 and Japanese Patent Application No. 2014-219260 filed on Oct. 28, 2014. Each of the above application(s) is hereby expressly incorporated by reference, in its entirety, into the present application.

BACKGROUND OF THE INVENTION

1. Field of the Invention

The present invention relates to a near infrared radiation-absorbing composition, a near infrared radiation cut-off filter and a production method therefor, and a camera module and a production method therefor.

2. Description of the Related Art

CCD or CMOS image sensors which are solid image pickup elements for color images have been used for video cameras, digital still cameras, mobile phones equipped with a camera function, and the like. In the solid image pickup elements, since a silicon photodiode having sensitivity to near infrared radiation is used in the light receiving section, it is necessary to correct the luminosity factor, and a near infrared radiation cut-off filter is frequently used.

As a material for forming the above-described near infrared radiation cut-off filter, for example, near infrared radiation-absorbing compositions for which a phosphate ester copper complex is used are known (JP2002-69305A, JP1999-52127A (JP-H11-52127A), and JP2011-63814A).

SUMMARY OF THE INVENTION

Here, it was found that, when the near infrared radiation cut-off filters, for which a copper complex is used, described in JP2002-69305A, JP1999-52127A (JP-H11-52127A), and JP2011-63814A are used as cured films, there are cases in which shielding properties are insufficient in the near infrared range.

The present invention intends to solve such a problem, and an object of the present invention is to provide a near infrared radiation-absorbing composition having favorable shielding properties in the near infrared range when used to produce cured films. In addition, another object of the present invention is to provide a near infrared radiation cut-off filter for which the near infrared radiation-absorbing composition is used and a production method therefor, and a camera module and a production method therefor.

As a result of intensive studies by the present inventors in consideration of the above-described status, it was found that the above-described problems can be solved using a specific copper complex. The present invention provides the followings.

<1> A near infrared radiation-absorbing composition comprising a copper complex formed by reacting a compound (A) having two or more coordinating atoms that form bonds using unshared electron pairs with a copper component.

<2> A near infrared radiation-absorbing composition comprising a copper complex in which copper is a central metal and a compound (A) having two or more coordinating atoms that form bonds using unshared electron pairs.

<3> The near infrared radiation-absorbing composition according to <1> or <2>, in which, in the copper complex, a 5-membered ring and/or a 6-membered ring is formed of copper and the compound (A).

<4> The near infrared radiation-absorbing composition according to any one of <1> to <3>, in which, in the compound (A), the coordinating atom that forms a bond using the unshared electron pair is an oxygen atom, a nitrogen atom, a sulfur atom, or a phosphorous atom.

<5> The near infrared radiation-absorbing composition according to any one of <1> to <4>, in which the compound (A) has 2 to 5 coordinating atoms that form bonds using unshared electron pairs.

<6> The near infrared radiation-absorbing composition according to any one of <1> to <5>, in which the number of atoms that link two coordinating atoms that form bonds using unshared electron pairs is in a range of 1 to 3.

<7> The near infrared radiation-absorbing composition according to any one of <1> to <6>, in which a molecular weight of the compound (A) is in a range of 50 to 1,000.

<8> The near infrared radiation-absorbing composition according to any one of <1> to <7>, in which the compound (A) is represented by General Formula (IV) or (IV-18) below;

General Formula (IV)

in General Formula (IV), each of $Y^1$ and $Y^2$ independently represents a ring including a coordinating atom that forms a bond using an unshared electron pair or a partial structure represented by Group (UE), and $L^1$ represents a single bond or a divalent linking group;

(IV-18)

in General Formula (IV-18), each of $Z^{25}$ to $Z^{27}$ independently represents a ring including a coordinating atom that forms a bond using an unshared electron pair or a partial structure represented by Group (UE); $Z^{201}$ represents at least one selected from Group (UE-2) below; and each of $L^{17}$ to $L^{19}$ independently represents a single bond or a divalent linking group; and

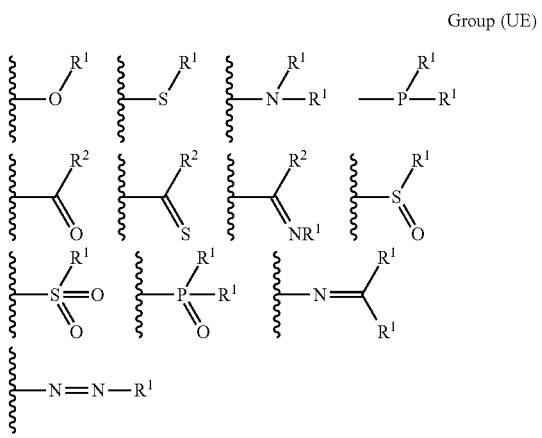
Group (UE)

Group (UE-2)

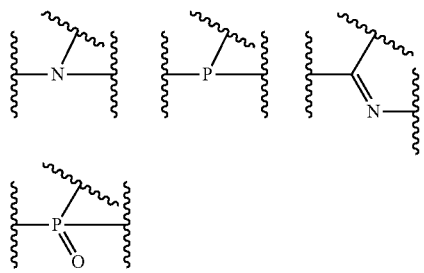

in Group (UE), wavy lines represent bonding positions to atomic groups that constitute the compound (A), each of $R^1$'s independently represents a hydrogen atom, an alkyl group, an alkenyl group, an alkynyl group, an aryl group, or a heteroaryl group, and each of $R^2$'s independently represents a hydrogen atom, an alkyl group, an alkenyl group, an alkynyl group, an aryl group, a heteroaryl group, an alkoxy group, an aryloxy group, a heteroaryloxy group, an alkylthio group, an arylthio group, a heteroarylthio group, an amino group, or an acyl group.

<9> The near infrared radiation-absorbing composition according to any one of <1> to <7>, in which the compound (A) is a compound including a 5-membered ring or a 6-membered ring, and coordinating atoms that form bonds using the unshared electron pairs constitute the 5-membered ring or the 6-membered ring.

<10> The near infrared radiation-absorbing composition according to any one of <1> to <9>, in which the coordinating atom that forms a bond using the unshared electron pair is a nitrogen atom.

<11> The near infrared radiation-absorbing composition according to any one of <1> to <10>, further comprising a curable compound; and a solvent.

<12> A near infrared radiation cut-off filter formed by curing the near infrared radiation-absorbing composition according to any one of <1> to <11>.

<13> A production method for a near infrared radiation cut-off filter, comprising: a step of forming a film on a light-receiving side of a solid image pickup element substrate by applying the near infrared radiation-absorbing composition according to any one of <1> to <11> thereto.

<14> A camera module comprising: a solid image pickup element substrate; and a near infrared radiation cut-off filter disposed on a light-receiving side of the solid image pickup element substrate, in which the near infrared radiation cut-off filter is a near infrared radiation cut-off filter formed by curing the near infrared radiation-absorbing composition according to any one of <1> to <11>.

<14-1> A camera module, in which a near infrared radiation cut-off filter is the near infrared radiation cut-off filter according to <12> or a near infrared radiation cut-off filter obtained using the production method for a near infrared radiation cut-off filter according to <14>.

<15> A production method for a camera module including a solid image pickup element substrate and a near infrared radiation cut-off filter disposed on a light-receiving side of the solid image pickup element substrate, the method comprising: a step of forming a film by applying the near infrared radiation-absorbing composition according to any one of <1> to <11> to a light-receiving side of the solid image pickup element substrate.

According to the present invention, it has become possible to provide a near infrared radiation-absorbing composition having favorable shielding properties in the near infrared range when used to produce cured films. In addition, it has become possible to provide a near infrared radiation cut-off filter for which the near infrared radiation-absorbing composition is used and a production method therefor, and a camera module and a production method therefor.

DESCRIPTION OF THE PREFERRED EMBODIMENTS

Figure 1:
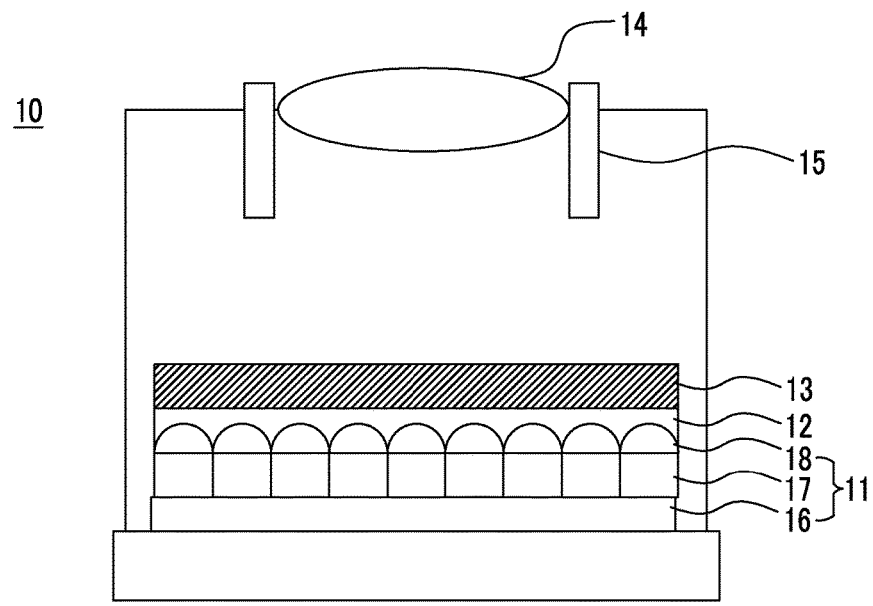
FIG. 1 is a schematic sectional view illustrating a constitution of a camera module having a near infrared radiation cut-off filter according to the present embodiment of the present invention.

Hereinafter, the contents of the present invention will be described in detail.

In the present specification, "to" used to express numerical ranges will be used with a meaning that numerical values before and after the "to" are included in the numerical ranges as the lower limit value and the upper limit value.

Regarding the denoting of groups (atomic groups) in the present specification, groups not denoted with 'substituted' or 'unsubstituted' refer to both groups (atomic groups) having no substituents and groups (atomic groups) having a substituent. For example, "alkyl groups" refer not only to alkyl groups having no substituents (unsubstituted alkyl groups) but also to alkyl groups having a substituent (substituted alkyl groups).

In the present specification, "(meth)acrylates" represent acrylates and methacrylates, "(meth)acrylic" represents acrylic and methacrylic, and "(meth)acryloyl" represents acryloyl and methacryloyl.

In addition, in the present specification, "monomers" and "monomers" refer to the same thing. "Polymers" in the present invention are classified into oligomers and polymers and refer to compounds having a weight-average molecular weight of 2,000 or less.

In the present specification, polymerizable compounds refer to compounds having a polymerizable functional group and may be monomers or polymers. The polymerizable functional group refers to a group that participates in polymerization reactions. Furthermore, regarding the denoting of groups (atomic groups) in the present specification, groups not denoted with 'substituted' or 'unsubstituted' refer to both groups (atomic groups) having no substituents and groups (atomic groups) having a substituent.

The weight-average molecular weights and the number-average molecular weights of compounds that are used in the present invention can be measured by means of gel permeation chromatography (GPC) and are defied as polystyrene-equivalent values obtained by GPC measurement. For example, the weight-average molecular weights and the number-average molecular weights of compounds can be obtained using HLC-8220 (manufactured by Tosho Corporation), a 6.0 mmID×15.0 cm TSKgel Super AWM-H (manufactured by Tosho Corporation), as a column, and 10 mmol/L of a lithium bromide N-methyl pyrrolidinone (NMP) solution as an eluent.

Near infrared radiation rays refer to rays (electromagnetic waves) having a maximum absorption wavelength in a range of 700 nm to 2,500 nm.

In the present specification, the total solid content refers to the total mass of all the components of a composition excluding a solvent. Solid contents in the present invention refer to solid contents at 25° C.

<Near Infrared Radiation-Absorbing Composition>

A near infrared radiation-absorbing composition of the present invention (hereinafter, also referred to as the composition of the present invention) includes a copper complex faulted by reacting a compound (A) having two or more coordinating atoms that form bonds using unshared electron pairs with a copper component. In addition, the composition of the present invention may also include a copper complex in which copper is a central metal and the compound (A) having two or more coordinating atoms that form bonds using unshared electron pairs (hereinafter, also referred to as the compound (A)).

When the composition of the present invention is used, it is possible to enhance near infrared radiation shielding properties when cured films are produced. In addition, it is also possible to enhance heat resistance. Furthermore, according to the composition of the present invention, near infrared radiation cut-off filters capable of realizing favorable near infrared radiation shielding properties can be obtained. In addition, according to the present invention, it is possible to reduce the film thicknesses of near infrared radiation cut-off filters and to contribute to the thickness reduction of camera modules.

The reasons for obtaining the above-described effects of the present invention are not clear, but are assumed as described below. The compound (A) having two or more coordinating atoms that form bonds using unshared electron pairs acts as a chelate ligand with respect to the copper component. That is, it is considered that the coordinating atoms that form bonds using unshared electron pairs in the compound (A) form chelate bonds with copper in the copper component and thus the structure of the copper complex distorts, favorable transmitting properties in the visible light range are obtained, near infrared radiation-absorbing capabilities can be improved, and color values also improve.

The composition of the present invention may include a copper complex formed by reacting the above-described compound (A) with a copper component. For example, the composition may include a copper complex obtained by reacting a copper compound (copper complex) as the copper component and the compound (A) or may include a copper complex obtained by reacting a copper compound which is not the copper complex (for example, copper hydroxide), a ligand that forms a bond using an anion, and the compound (A). Any anion may be used as the anion in the ligand as long as the anion is capable of bonding to a copper atom, and examples thereof include an oxygen anion, a nitrogen anion, a sulfur anion, a chlorine anion, and the like.

The copper complex that is used in the present invention has a form of a copper complex (copper compound) coordinated with the coordinating atoms that form bond using two unshared electron pairs in the compound (A). Copper in the copper complex that is used in the present invention is generally divalent copper and can be obtained by mixing and reacting the compound (A) with a copper component (copper or a compound including copper).

In addition, examples of the copper complex include tetracoordinate complexes, pentacoordinate complexes, and hexacoordinate complexes, and a tetracoordinate complex or an pentacoordinate complex is more preferred. The copper complex preferably has at least one ligand that forms using an anion.

Here, when a structure of copper and the compound (A) can be detected from the composition of the present invention, it can be said that a copper complex in which the compound (A) acts as a ligand is formed in the composition of the present invention. Examples of a method for detecting copper and the compound (A) from the composition of the present invention include an ICP emission analysis.

The copper complex that is used in the present invention preferably has a maximum absorption wavelength ($\lambda_{max}$) in the near infrared wavelength range of 700 nm to 2,500 nm, more preferably has a maximum absorption wavelength in a range of 720 nm to 890 nm, and still more preferably has a maximum absorption wavelength in a range of 730 nm to 880 nm. The maximum absorption wavelength can be measured using, for example, a Cary 5000 UV-Vis-NIR (spectrometer, manufactured by Agilent Technologies).

<<Compound (A) Having Two or More Coordinating Atoms that Form Bonds Using Unshared Electron Pairs>>

The compound (A) needs to have two or more coordinating atoms that form bonds using unshared electron pairs in a single molecule, may have three or more coordinating atoms, preferably has 2 to 5 coordinating atoms, and more preferably has 4 coordinating atoms.

The maximum absorption wavelength ($\lambda_{max}$) of the compound (A) is preferably 420 nm or shorter, more preferably 400 nm or shorter, and still more preferably 350 nm or shorter. In addition, the maximum absorption wavelength of the compound (A) is preferably 10 nm or longer and more preferably 50 nm or longer. In addition, the maximum absorption wavelength of the compound (A) is preferably absent at 430 nm or longer.

The compound (A) may or may not have a coordination site that is coordinated with an anion in the molecule. Here, the coordination site that is coordinated with an anion refers to a site including an anion capable of bonding to a copper atom in the copper component, and examples thereof include sites including an oxygen anion, a nitrogen anion, or a sulfur anion.

The compound (A) can be singly used or two or more compounds (A) can be jointly used.

In the compound (A), the number of atoms that link the coordinating atoms that form bonds using unshared electron pairs is preferably in a range of 1 to 6, more preferably in a range of 1 to 3, and still more preferably 2 or 3. When the above-described constitution is provided, the structure of the copper complex becomes capable of more easily distorting, and thus it is possible to further improve color values.

The coordinating atoms that form bonds using unshared electron pairs may be linked to each other using one or more kinds of atoms. The atom that links the coordinating atoms that form bonds using unshared electron pairs is preferably a carbon atom.

In the following exemplary compounds, the coordinating atom that forms a bond using an unshared electron pair is a nitrogen atom, the atom that links the coordinating atoms that form bonds using unshared electron pairs is a carbon atom, and the number of carbon atoms that link nitrogen atoms together is two.

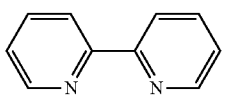 [SMILES: c1ccc(-c2ccccn2)nc1]

The number of unsaturated bonds that the compound (A) may have is preferably 9 or less and preferably in a range of 1 to 9.

The molecular weight of the compound (A) is preferably in a range of 50 to 1,000 and more preferably in a range of 50 to 600.

In the compound (A), the coordinating atom that forms a bond using an unshared electron pair is preferably an oxygen atom, a nitrogen atom, a sulfur atom, or a phosphorous atom, more preferably an oxygen atom, a nitrogen atom, or a sulfur atom, and still more preferably a nitrogen atom.

In the compound (A), in a case in which the coordinating atom that forms a bond using an unshared electron pair is a nitrogen atom, it is preferable that an atom adjacent to the nitrogen atom is a carbon atom and the carbon atom has a substituent.

The coordinating atom that forms a bond using an unshared electron pair is preferably included in a ring or at least one partial structure selected from Group (UE) below.

Group (UE)

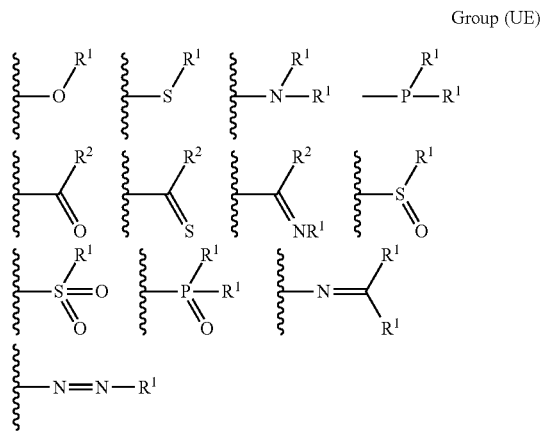

(In Group (UE), wavy lines represent bonding positions to atomic groups that constitute the compound (A), each of $R^1$'s independently represents a hydrogen atom, an alkyl group, an alkenyl group, an alkynyl group, an aryl group, or a heteroaryl group, and each of $R^2$'s independently represents a hydrogen atom, an alkyl group, an alkenyl group, an alkynyl group, an aryl group, a heteroaryl group, an alkoxy group, an aryloxy group, a heteroaryloxy group, an alkylthio group, an arylthio group, a heteroarylthio group, an amino group, or an acyl group.)

In a case in which the coordinating atom that forms a bond using an unshared electron pair is included in a ring, the ring including the coordinating atom that forms a bond using an unshared electron pair may be a monocycle or a polycycle and may be an aromatic ring or a non-aromatic ring. The ring including the coordinating atom that forms a bond using an unshared electron pair is preferably one of 5- to 12-membered rings and more preferably one of 5- to 7-membered rings.

The ring including the coordinating atom that forms a bond using an unshared electron pair may have a substituent, and examples of the substituent include linear, branched, or cyclic alkyl groups having 1 to 10 carbon atoms, aryl groups having 6 to 12 carbon atoms, halogen atoms, silicon atoms, alkoxy groups having 1 to 12 carbon atoms, acyl groups having 1 to 12 carbon atoms, alkylthio groups having 1 to 12 carbon atoms, carboxyl groups, and the like.

In a case in which the ring including the coordinating atom that forms a bond using an unshared electron pair has a substituent, the ring may have another substituent, and examples thereof include groups made of a ring including a coordinating atom that forms a bond using an unshared electron pair, groups made of at least one partial structure selected from Group (UE) described above, alkyl groups having 1 to 12 carbon atoms, acyl groups having 1 to 12 carbon atoms, and hydroxyl groups.

In a case in which the coordinating atom that forms a bond using an unshared electron pair is included in the particle structure represented by Group (UE), it is preferable that each of $R^1$'s independently represents a hydrogen atom, an alkyl group, an alkenyl group, an alkynyl group, an aryl group, or a heteroaryl group.

The alkyl group may have a linear shape, a branched shape, or a cyclic shape and preferably has a linear shape. The number of carbon atoms in the alkyl group is preferably in a range of 1 to 10, more preferably in a range of 1 to 6, and still more preferably in a range of 1 to 4. Examples of the alkyl group include methyl group. The alkyl group may have a substituent, and examples of the substituent include halogen atoms, carboxyl groups, and heterocyclic groups. The heterocyclic group as the substituent may be a monocycle or a polycycle and may be an aromatic ring or a non-aromatic ring. The number of hetero atoms that constitute a heterocycle is preferably in a range of 1 to 3 or more preferably 1 or 2. The hetero atom that constitutes the heterocycle is preferably a nitrogen atom. In a case in which the alkyl group has a substituent, the alkyl group may have another substituent.

The number of carbon atoms in the alkenyl group is preferably in a range of 1 to 10 and more preferably in a range of 1 to 6.

The number of carbon atoms in the alkynyl group is preferably in a range of 1 to 10 and more preferably in a range of 1 to 6.

The aryl group may be a monocycle or a polycycle and is preferably a monocycle. The number of carbon atoms in the aryl group is preferably in a range of 6 to 18, more preferably in a range of 6 to 12, and still more preferably 6.

The heteroaryl group may be a monocycle or a polycycle. The number of hetero atoms that constitute the heteroaryl group is preferably in a range of 1 to 3. The hetero atom that constitutes the heteraryl group is preferably a nitrogen atom, an oxygen atom, or a sulfur atom. The number of carbon atoms in the heteroaryl group is preferably in a range of 6 to 18 and more preferably in a range of 6 to 12.

In a case in which the coordinating atom that forms a bond using an unshared electron pair is included in the particle structure represented by Group (UE), it is preferable that each of $R^2$'s independently represents a hydrogen atom, an alkyl group, an alkenyl group, an alkynyl group, an aryl group, a heteroaryl group, an alkoxy group, an aryloxy group, a heteroaryloxy group, an alkylthio group, an arylthio group, a heteroarylthio group, an amino group, or an acyl group.

The alkyl group, the alkenyl group, the alkynyl group, the aryl group, and the heteroaryl group are identical to those described in the section of Group (UE), and preferred ranges thereof are also identical.

The number of carbon atoms in the alkoxy group is preferably in a range of 1 to 12.

The number of carbon atoms in the aryloxy group is preferably in a range of 6 to 18.

The heteroaryloxy group may be a monocycle or a polycycle. The heteroaryl group that constitutes the heteroaryloxy group is identical to the heteroaryl group described in the section of Group (UE), and a preferred range thereof is also identical.

The number of carbon atoms in the alkylthio group is preferably in a range of 1 to 12.

The number of carbon atoms in the arylthio group is preferably in a range of 6 to 18.

The heteroarylthio group may be a monocycle or a polycycle. The heteroaryl group that constitutes the heteroarylthio group is identical to the heteroaryl group described in the section of Group (UE), and a preferred range thereof is also identical.

The number of carbon atoms in the acyl group is preferably in a range of 2 to 12.

The compound (A) is also preferably represented by General Formula (IV) below.

$$Y^1\text{-}L^1\text{-}Y^2 \qquad \text{General Formula (IV)}$$

(In General Formula (IV), each of $Y^1$ and $Y^2$ independently represents a ring including a coordinating atom that forms a bond using an unshared electron pair or a partial structure represented by Group (UE). $L^1$ represents a single bond or a divalent linking group.)

In General Formula (IV), $Y^1$ and $Y^2$ are identical to the above-described ring including a coordinating atom that forms a bond using an unshared electron pair or the above-described partial structure including a coordinating atom that forms a bond using an unshared electron pair, and preferred ranges thereof are also identical.

In General Formula (IV), in a case in which $L^1$ represents a divalent linking group, an alkylene group having 1 to 12 carbon atoms, an arylene group having 6 to 12 carbon atoms, —SO—, —O—, or a group made of a combination thereof is preferred, an alkylene group having 1 to 3 carbon atoms, a phenylene group, or —SO$_2$— is preferred, and an alkylene group having 1 to 3 carbon atoms is more preferred.

More detailed examples of the compound (A) also include compounds represented by General Formula (IV-1) or (IV-2) below.

$$Y^3\text{-}L^2\text{-}Y^4\text{-}L^3\text{-}Y^5 \qquad \text{(IV-1)}$$

$$Y^6\text{-}L^6\text{-}Y^7\text{-}L^7\text{-}Y^8\text{-}L^8\text{-}Y^9 \qquad \text{(IV-2)}$$

In General Formula (IV-1) or (IV-2), each of $Y^3$, $Y^5$, $Y^6$, and $Y^9$ independently represents a ring including a coordinating atom that forms a bond using an unshared electron pair or a partial structure represented by Group (UE).

In addition, each of $Y^4$, $Y^7$, and $Y^8$ independently represents a ring including a coordinating atom that forms a bond using an unshared electron pair or at least one selected from Group (UE-1) below. R's in Group (UE-1) are identical to $R^1$'s in a case in which a coordinating atom that forms a bond using an unshared electron pair is included in the partial structure represented by Group (UE).

Group (UE-1)

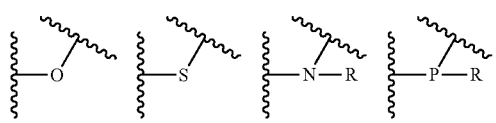

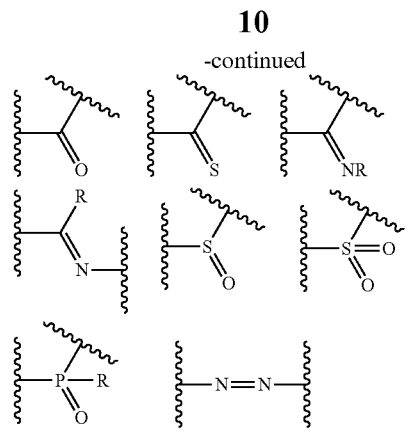

In General Formula (IV-1) or (IV-2), each of $L^2$ to $L^8$ independently represents a single bond or a divalent linking group. The divalent linking group is identical to that in a case in which $L^1$ In General Formula (IV) represents a divalent linking group, and a preferred range thereof is also identical.

The compound (A) is also preferably one of compounds represented by General Formulae (IV-11) to (IV-20). Among these, the compound represented by General Formula (IV-18) below is more preferred.

(IV-11)

(IV-12)

(IV-13)

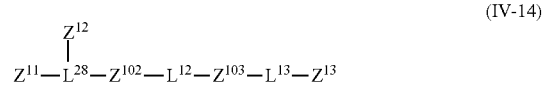
(IV-14)

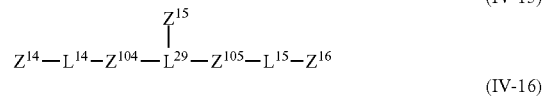
(IV-15)

(IV-16)

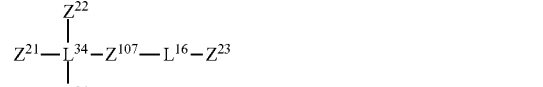
(IV-17)

(IV-18)

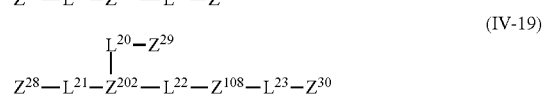
(IV-19)

(IV-20)

In General Formulae (IV-11) to (IV-20), each of $Z^1$ to $Z^{34}$, $Z^{101}$ to $Z^{108}$, and $Z^{201}$ to $Z^{203}$ independently represents a coordination site, each of $L^{11}$ to $L^{25}$ independently represents a single bond or a divalent linking group, each of $L^{26}$ to $L^{32}$ independently represents a trivalent linking group, and each of $L^{33}$ and $L^{34}$ independently represents a tetravalent linking group.

Each of $Z^1$ to $Z^{34}$ independently represents a group made of a ring including a coordinating atom that forms a bond using an unshared electron pair or at least one selected from Group (UE) above.

Each of $Z^{101}$ to $Z^{108}$ independently represents a group made of a ring including a coordinating atom that forms a bond using an unshared electron pair or at least one selected from Group (UE-1) above.

Each of $Z^{201}$ to $Z^{203}$ independently represents at least one selected from Group (UE-2) below.

Each of $L^{11}$ to $L^{25}$ independently represents a single bond or a divalent linking group. The divalent linking group is preferably an alkylene group having 1 to 12 carbon atoms, an arylene group having 6 to 12 carbon atoms, —SO—, —O—, —SO$_2$—, or a group made of a combination thereof and more preferably an alkylene group having 1 to 3 carbon atoms, a phenylene group, —SO$_2$—, or a group made of a combination thereof.

Each of $L^{26}$ to $L^{32}$ independently represents a trivalent linking group. Examples of the trivalent linking group include groups obtained by removing one hydrogen atom from the above-described divalent linking group.

Each of $L^{33}$ and $L^{34}$ independently represents a tetravalent linking group. Examples of the tetravalent linking group include groups obtained by removing two hydrogen atoms from the above-described divalent linking group.

Group (UE-2)

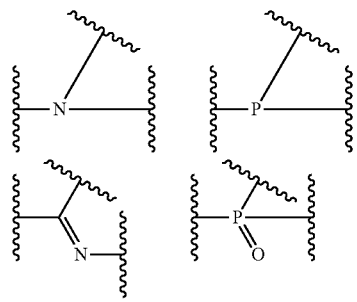

The compound (A) is also preferably a compound including a 5-membered ring or a 6-membered ring, and it is also preferable that coordinating atoms that form bonds using unshared electron pairs constitute the 5-membered ring or the 6-membered ring.

The coordinating atom that forms a bond with an unshared electron pair in the compound (A) is also preferably a nitrogen atom. In addition, it is also preferable that an atom adjacent to the nitrogen atom as the coordinating atom that forms a bond with an unshared electron pair in the compound (A) is a carbon atom and the carbon atom has a substituent. When the above-described constitution is provided, the structure of the copper complex becomes capable of more easily distorting, and thus it is possible to further improve color values. The substituent is identical to the substituent that the above-described ring including a coordinating atom that forms a bond using an unshared electron pair may have, and an alkyl group having 1 to 10 carbon atoms, an aryl group having 6 to 12 carbon atoms, a carboxyl group, an alkoxy group having 1 to 12 carbon atoms, an acyl group having 2 to 12 carbon atoms, an alkylthio group having 1 to 12 carbon atoms, or a halogen atom is preferred.

Specific examples of the compound (A) include the following compounds, but are not limited thereto.

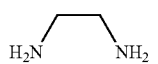
AA2-1

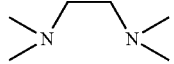
AA2-2

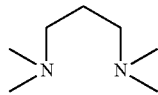
AA2-3

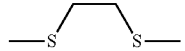
AA2-4

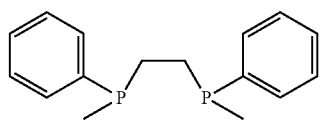
AA2-5

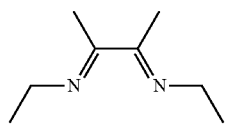
AA2-6

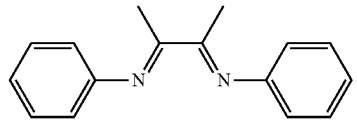
AA2-7

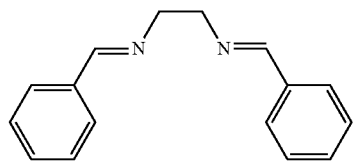
AA2-8

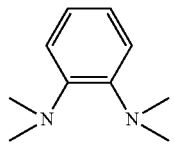
AA2-9

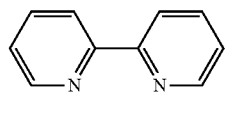
AA2-10

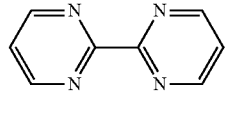
AA2-11

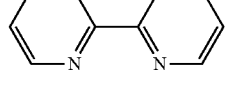
AA2-12

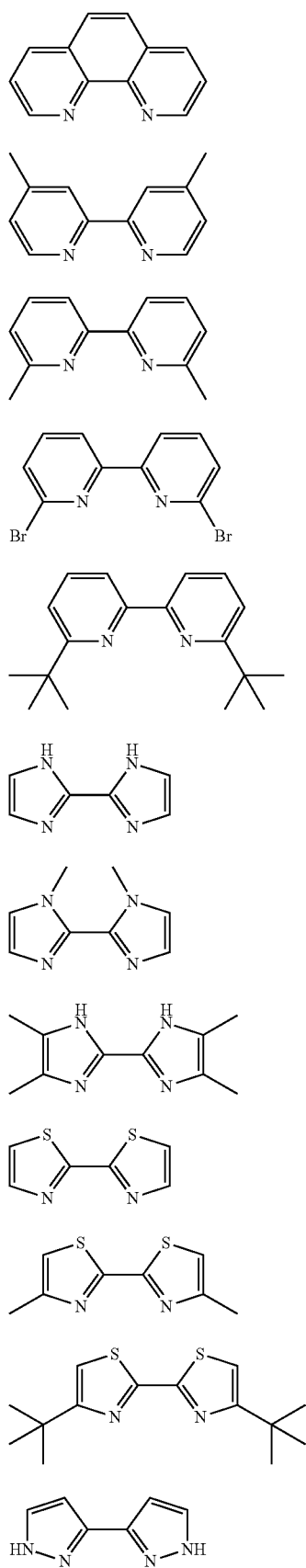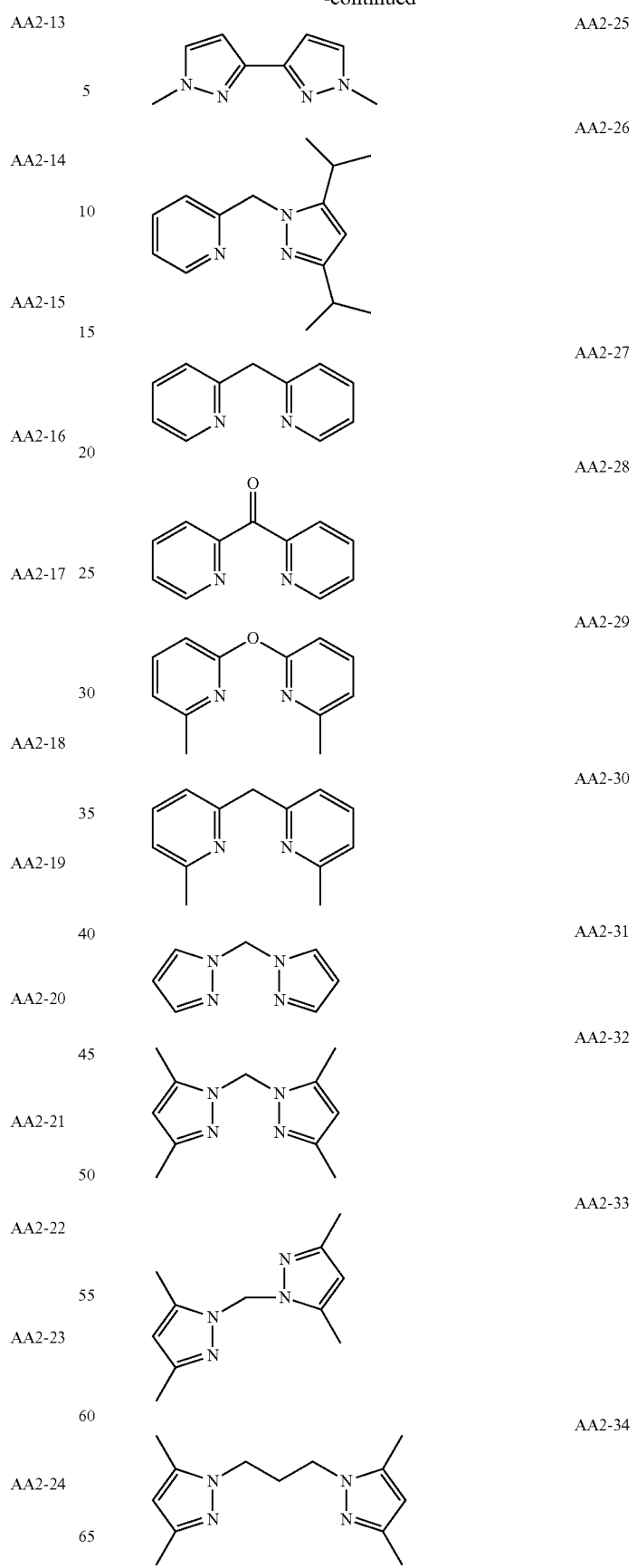

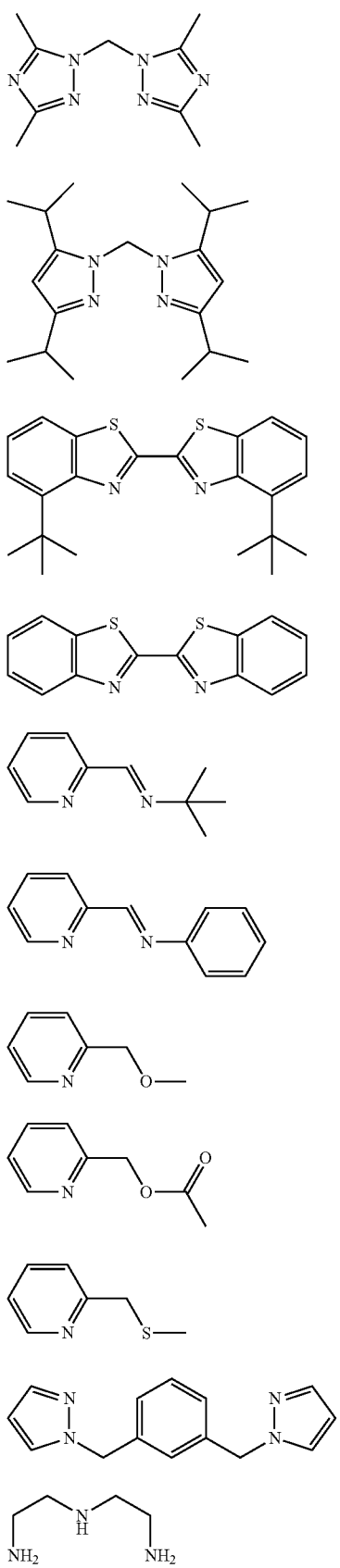
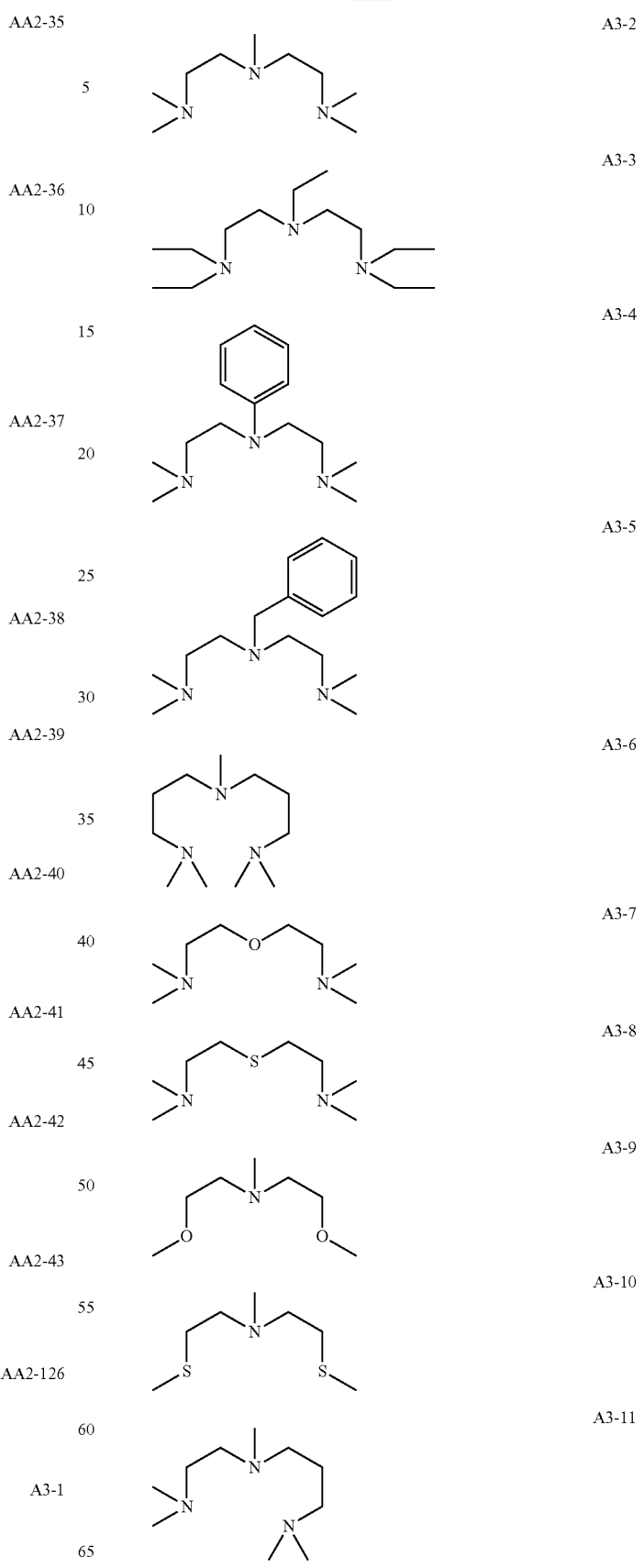

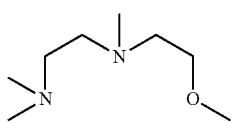
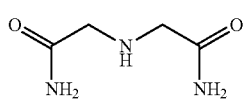
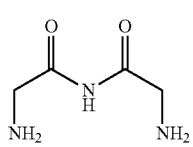
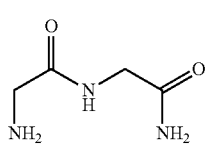
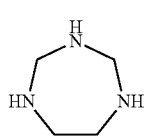
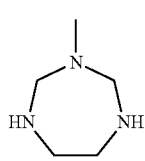
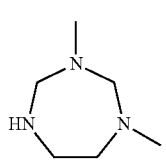
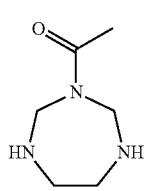
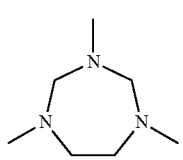
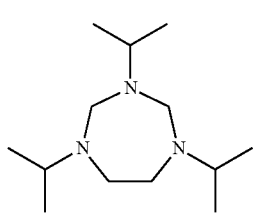
A3-12
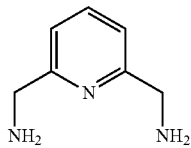
A3-13
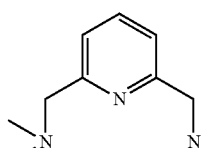
A3-14
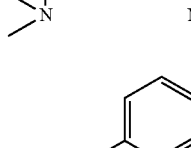
A3-15
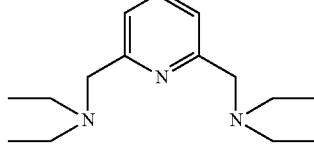
A3-16
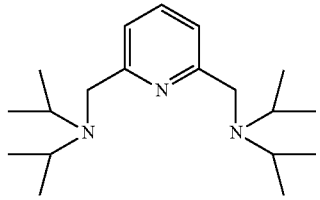
A3-17
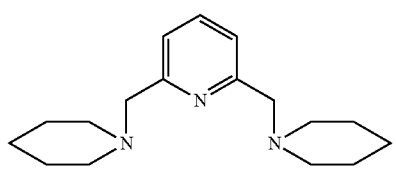
A3-18
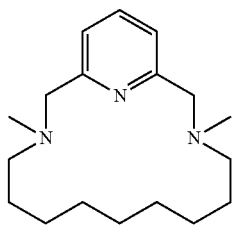
A3-19
A3-20
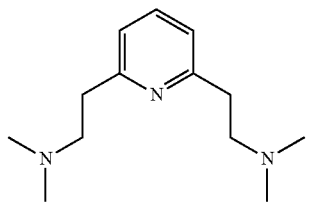
A3-21
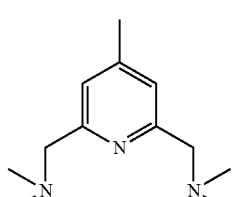
A3-22
A3-23
A3-24
A3-25
A3-26
A3-27
A3-28
A3-29

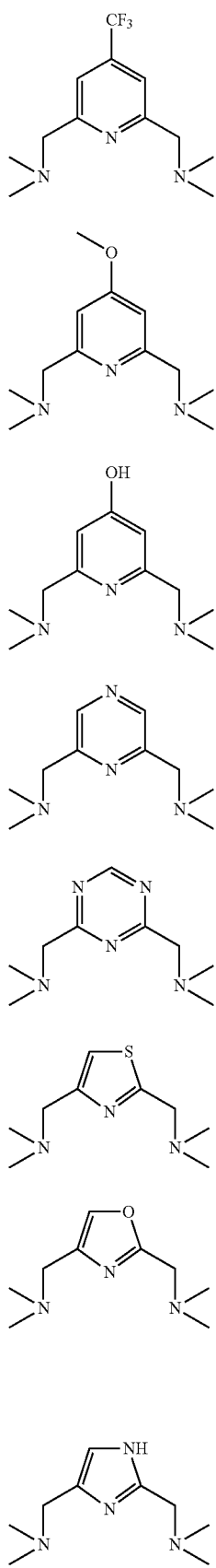
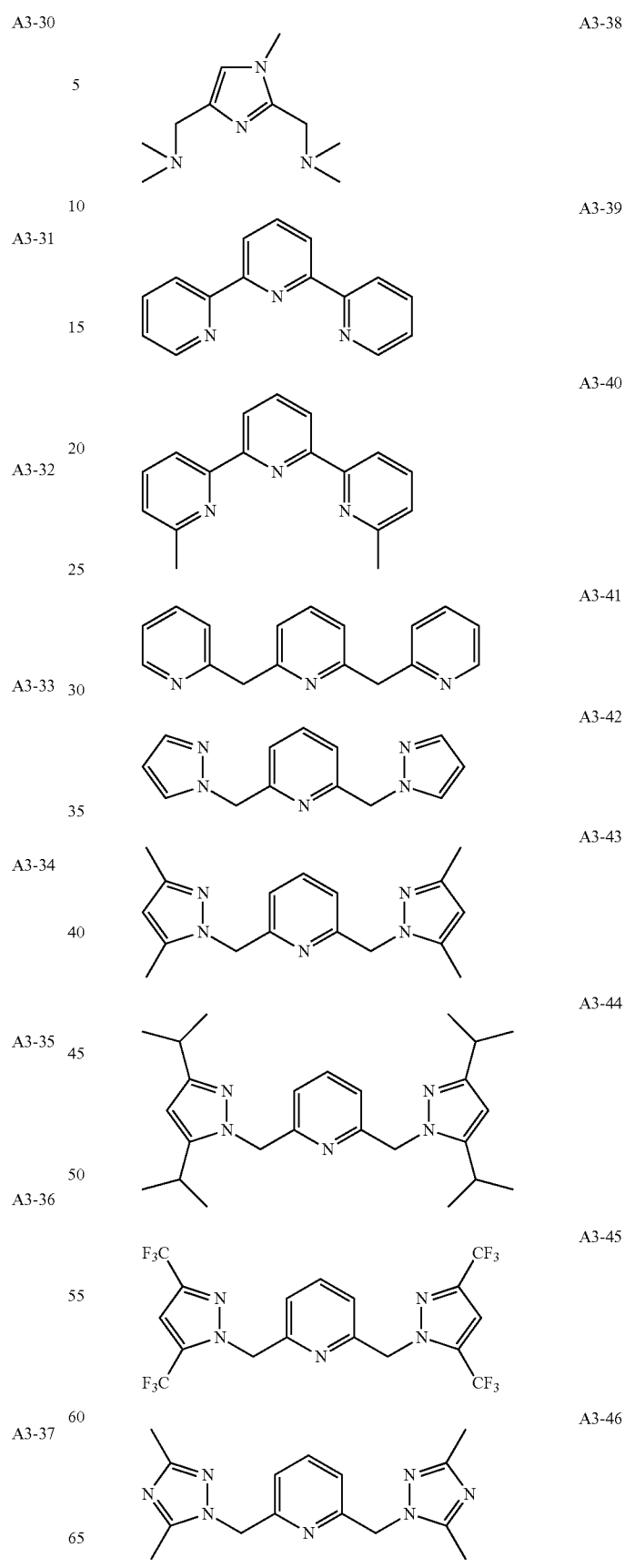

-continued
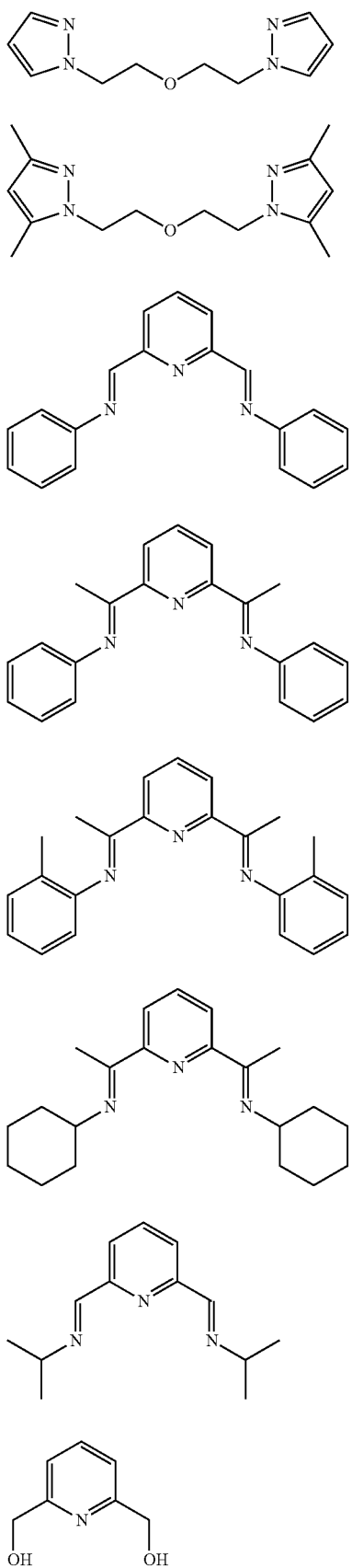
-continued
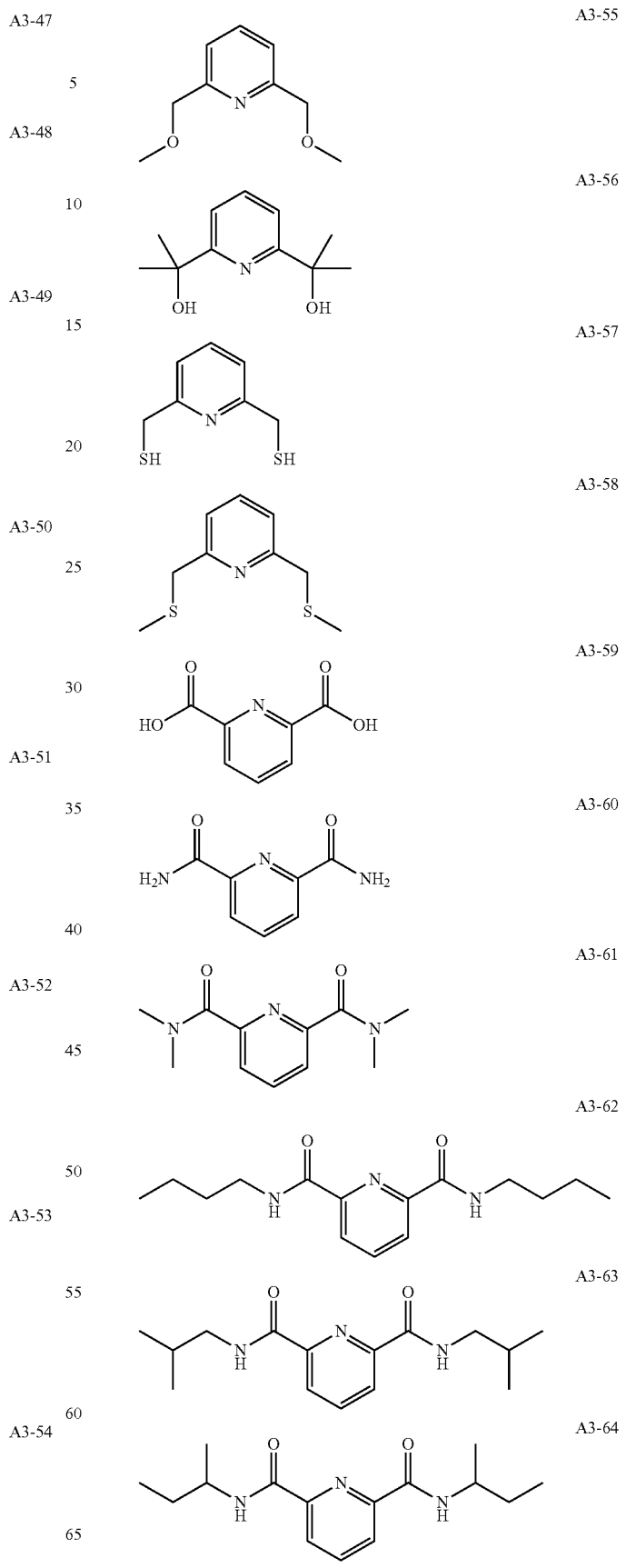

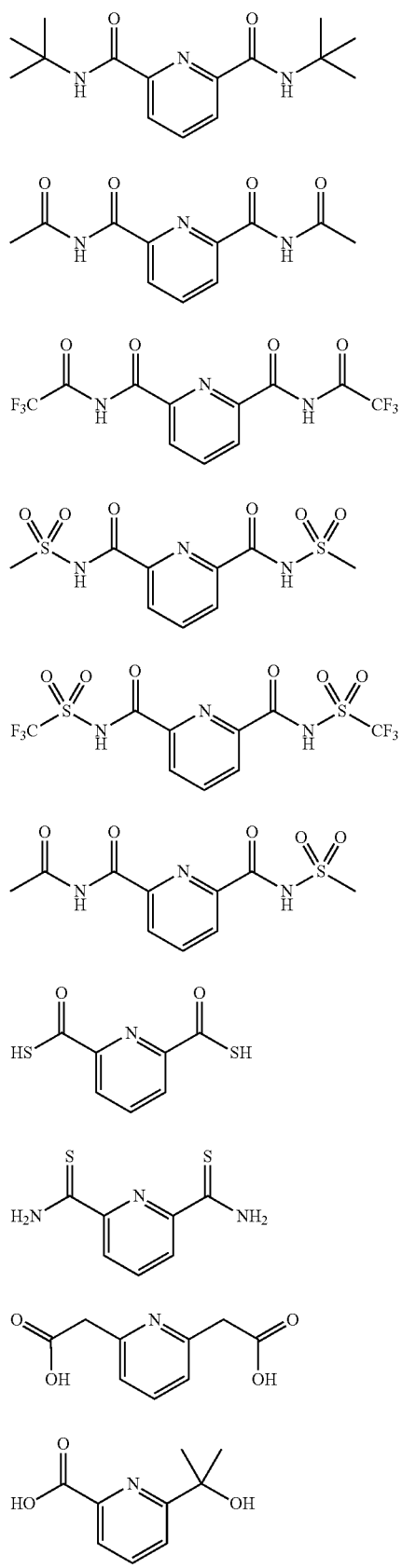
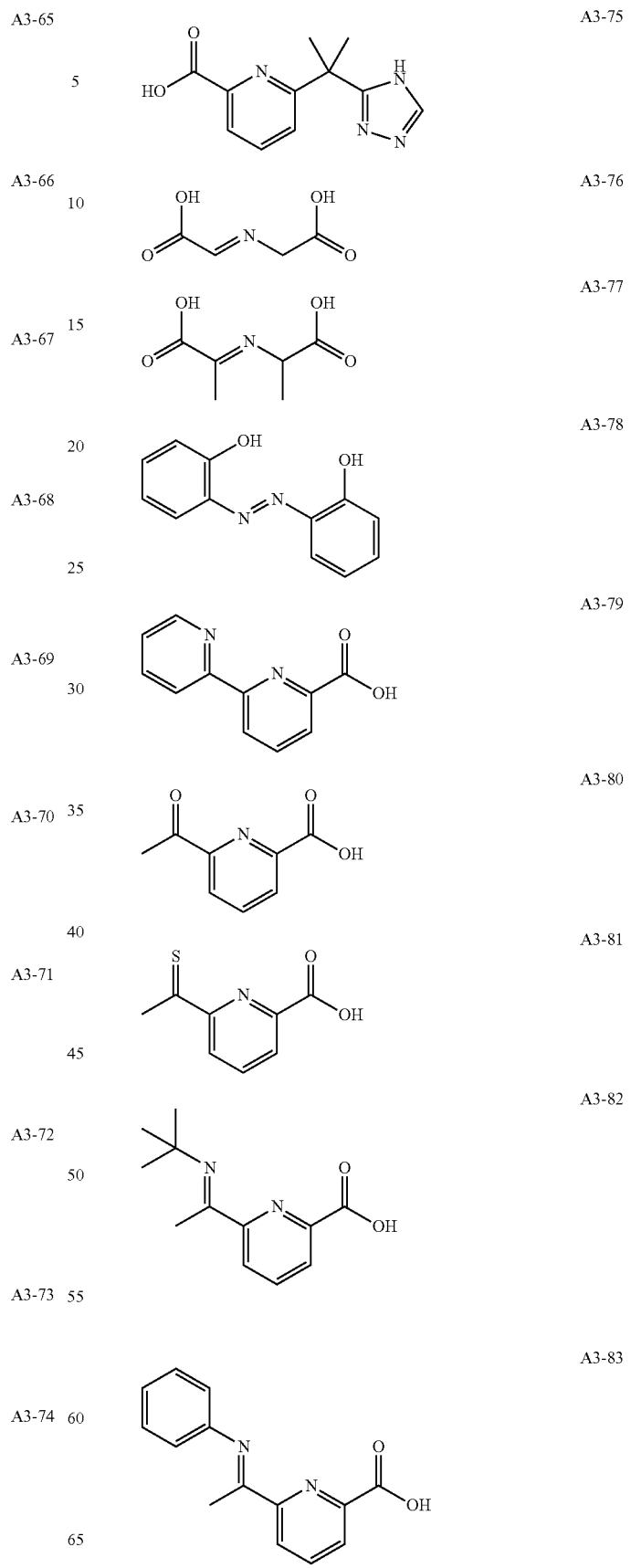

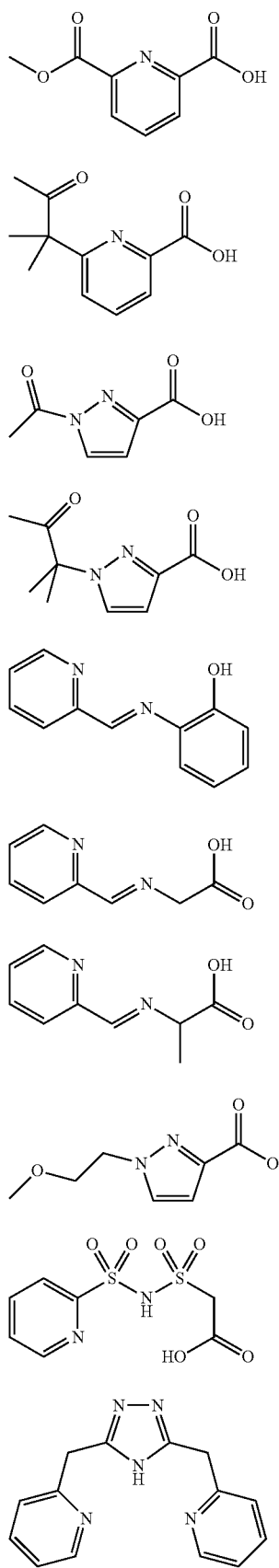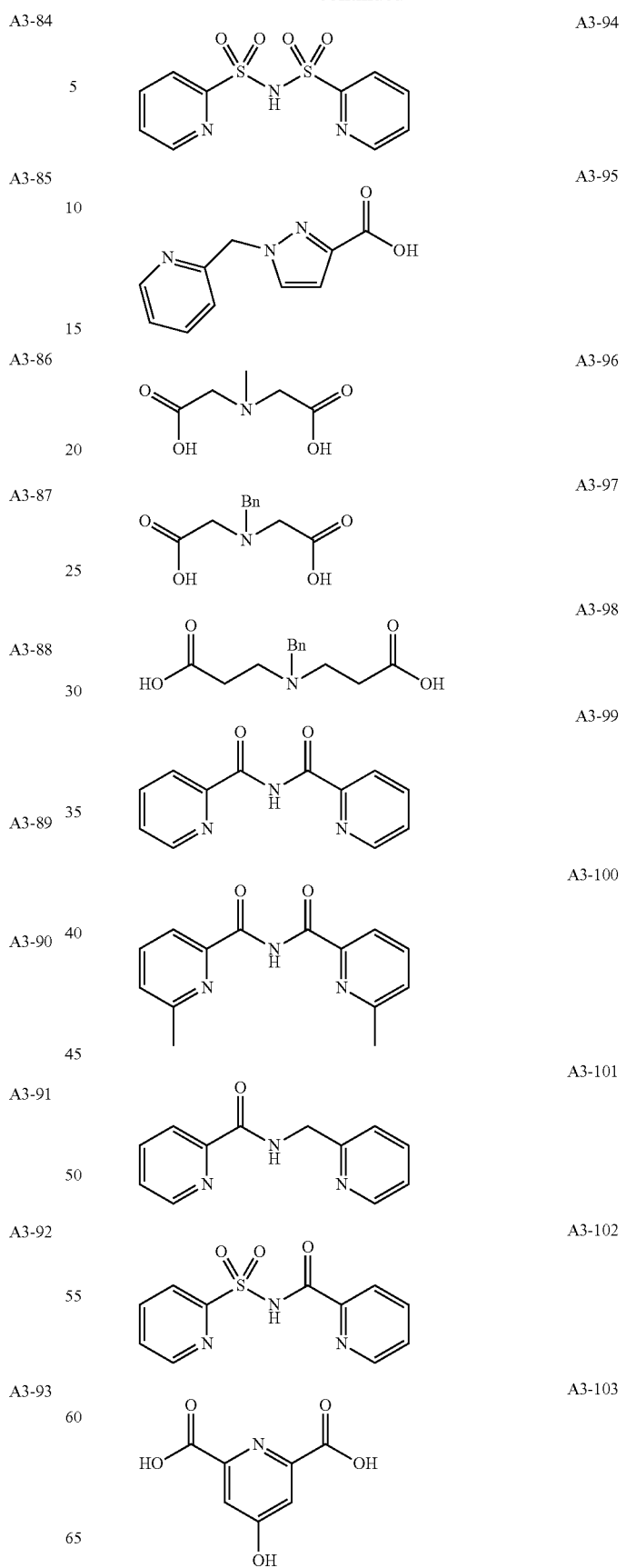

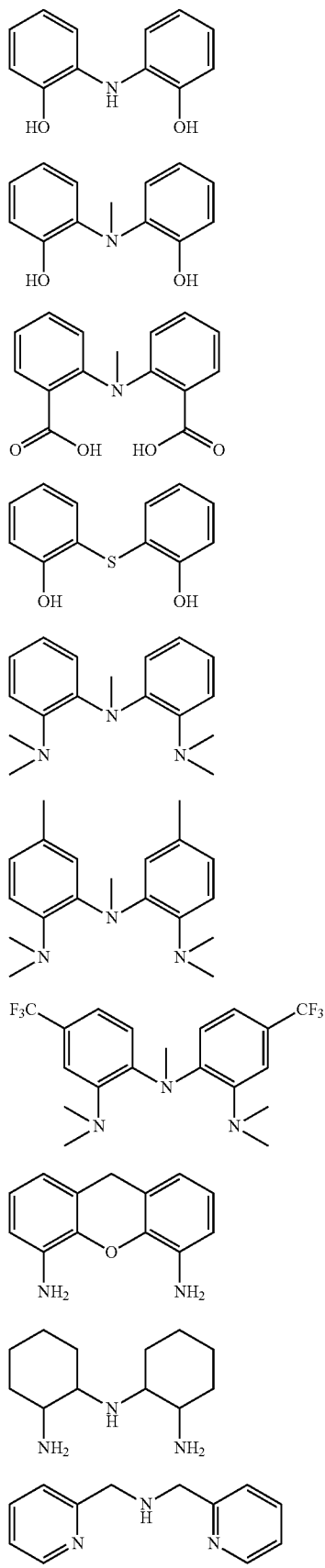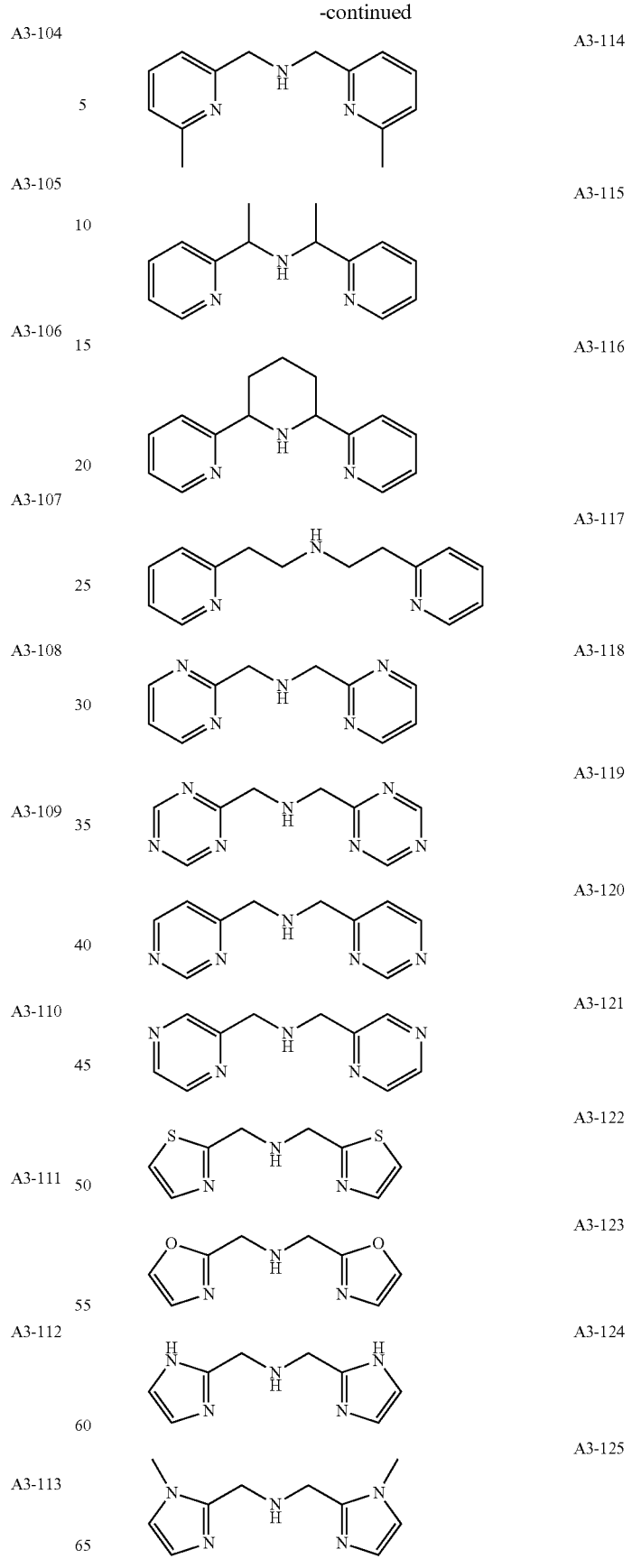

A3-126 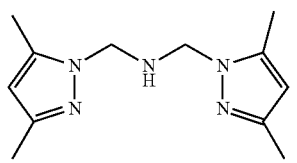
A3-127 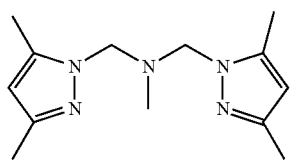
A3-128 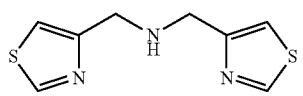
A3-129 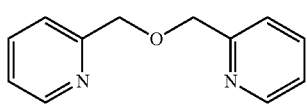
A3-130 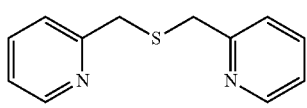
A3-131 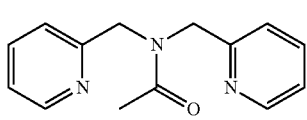
A3-132 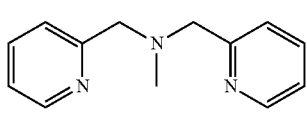
A3-133 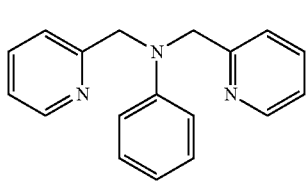
A3-134 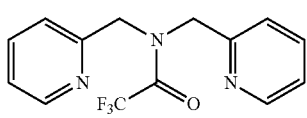
A3-135 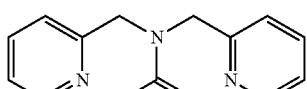
A3-136 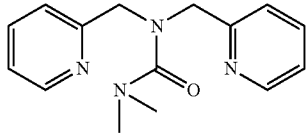
A3-137 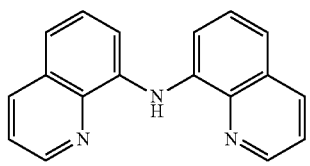
A3-138 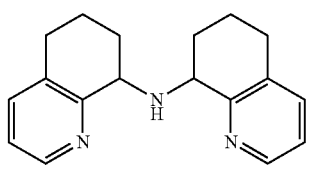
A3-139 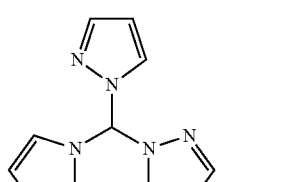
A3-140 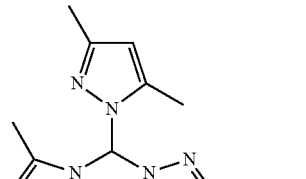
A3-141 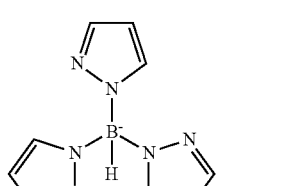
A3-142 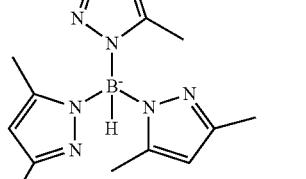
A3-143 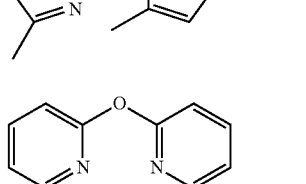
A4-1 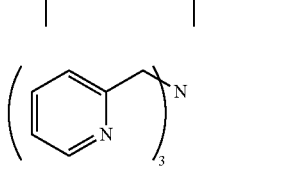

A4-2 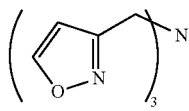
A4-3 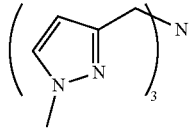
A4-4 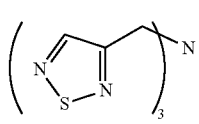
A4-5 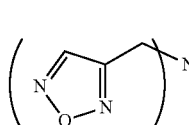
A4-6 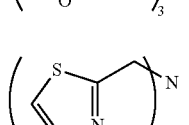
A4-7 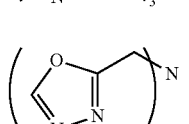
A4-8 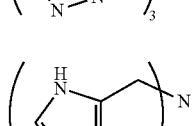
A4-9 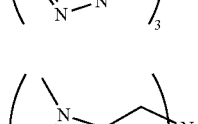
A4-10 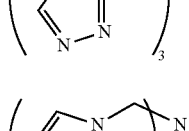
A4-11 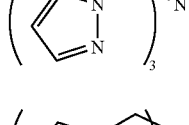
A4-12 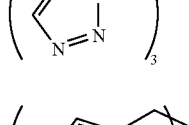
A4-13 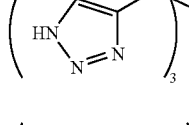
A4-14 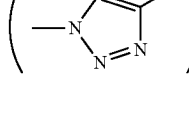
A4-15 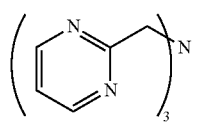
A4-16 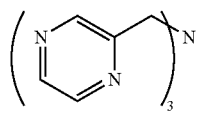
A4-17 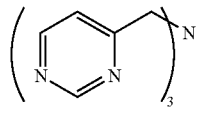
A4-18 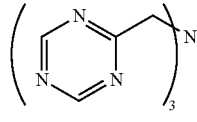
A4-19 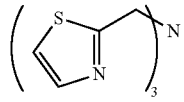
A4-20 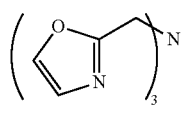
A4-21 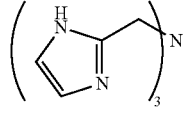
A4-22 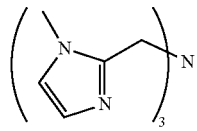
A4-23 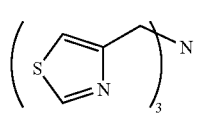
A4-24 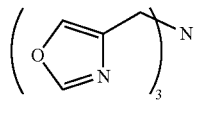
A4-25 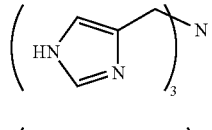
A4-26 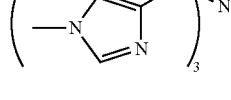

-continued
A4-27
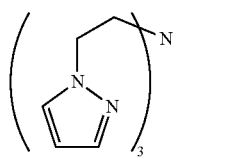
A4-28
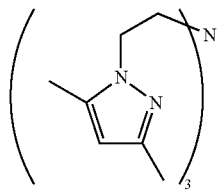
A4-29
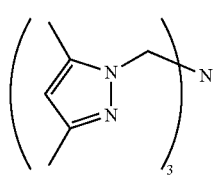
A4-30
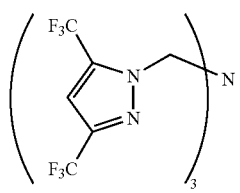
A4-31
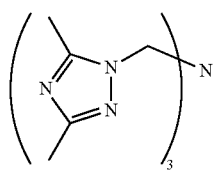
A4-32
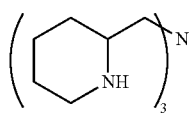
A4-33
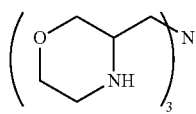
A4-34
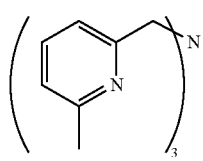
A4-35
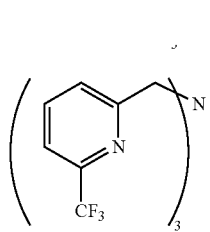
-continued
A4-36
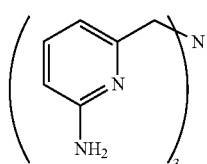
A4-37
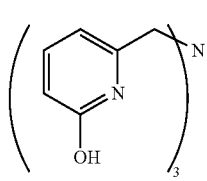
A4-38
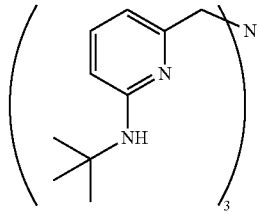
A4-39
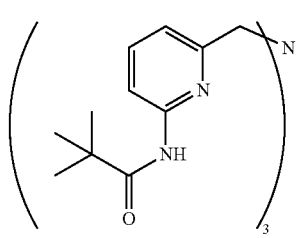
A4-40
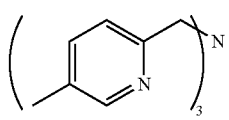
A4-41
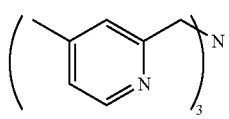
A4-42
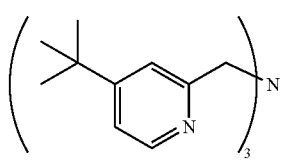
A4-43
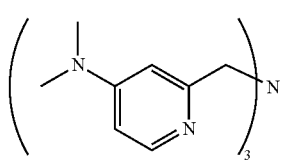
A4-44
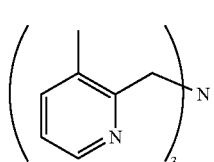

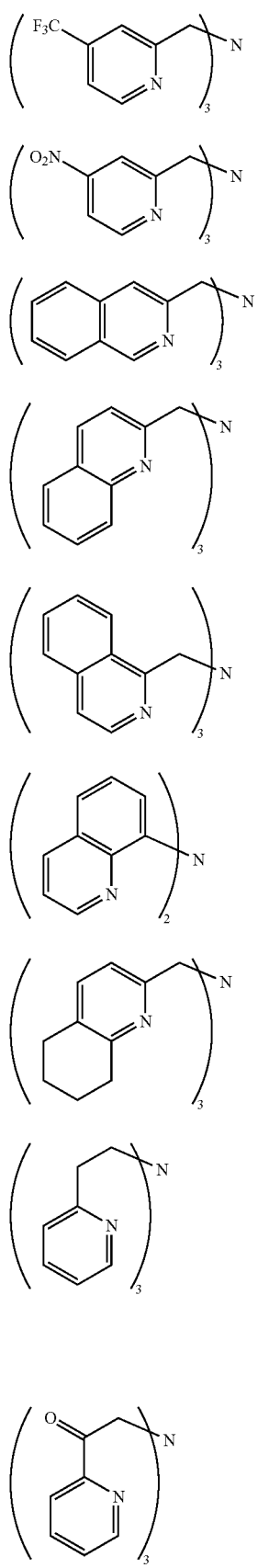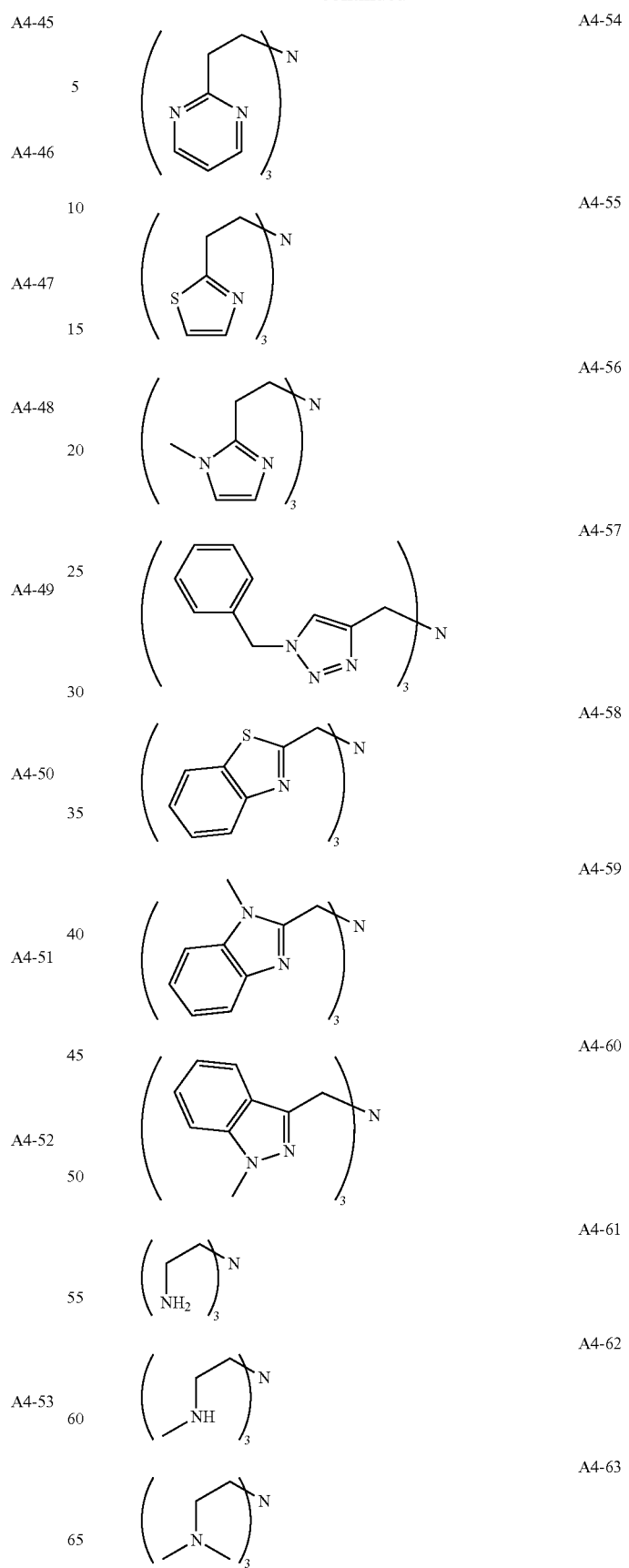

| | |
|---|---|
| 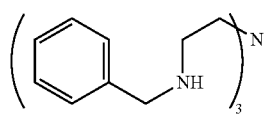 A4-64 | 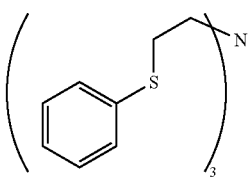 A4-75 |
| 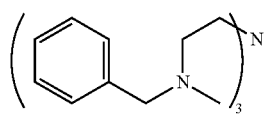 A4-65 | 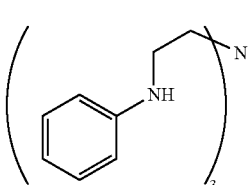 A4-76 |
| 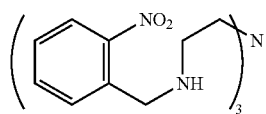 A4-66 | 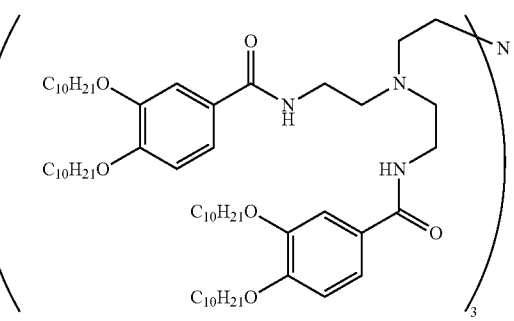 A4-77 |
| 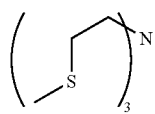 A4-67 | |
| 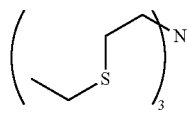 A4-68 | |
| 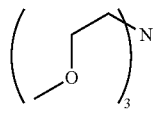 A4-69 | 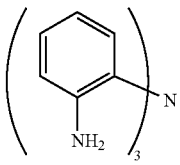 A4-78 |
| 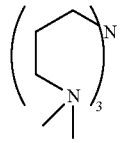 A4-70 | 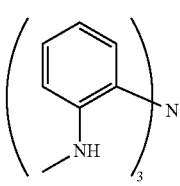 A4-79 |
| 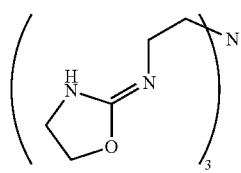 A4-71 | |
| 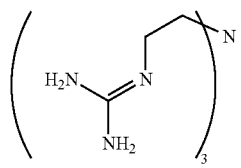 A4-72 | 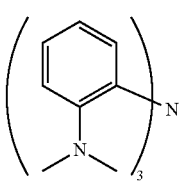 A4-80 |
| 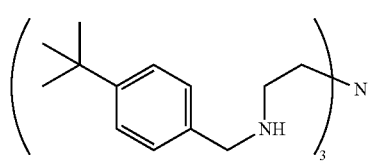 A4-73 | |
| 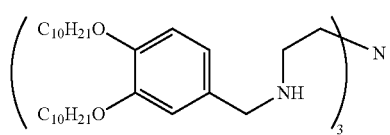 A4-74 | 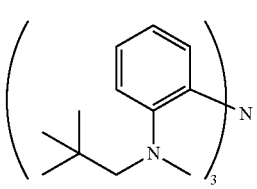 A4-81 |

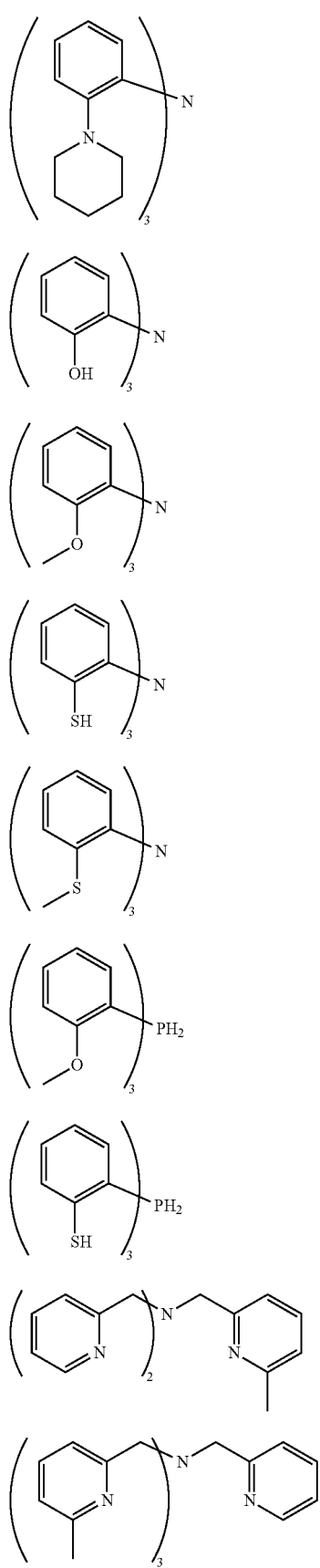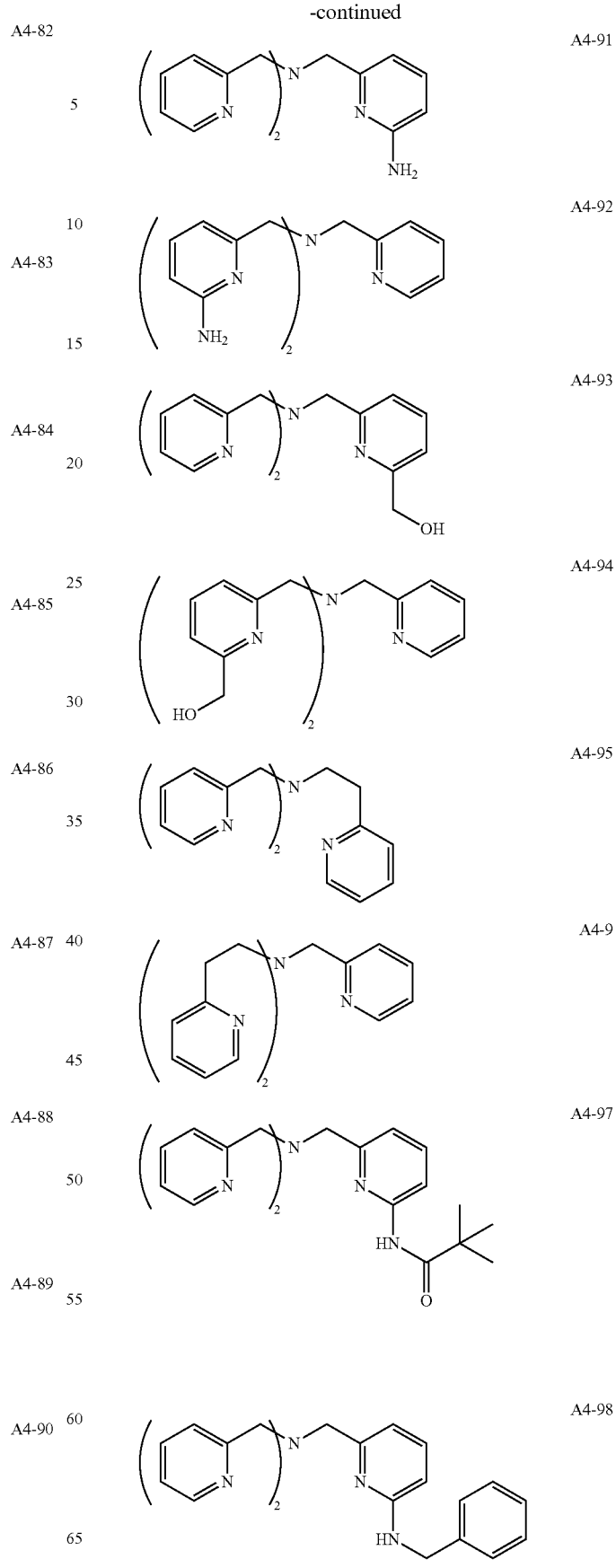

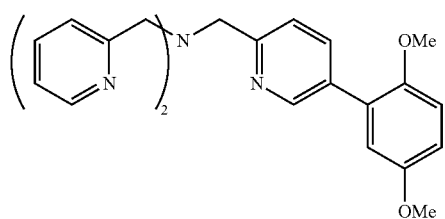 A4-99
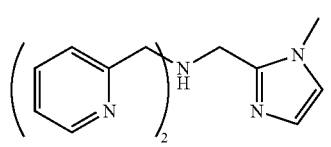 A4-100
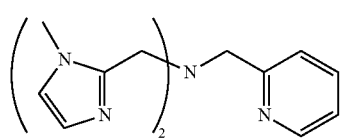 A4-101
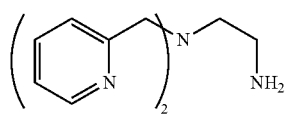 A4-102
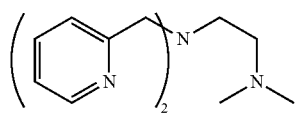 A4-103
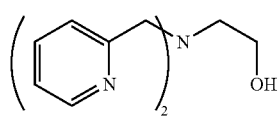 A4-104
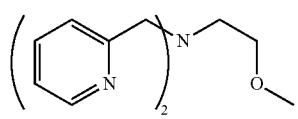 A4-105
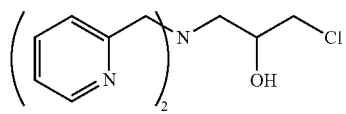 A4-106
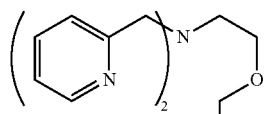 A4-107
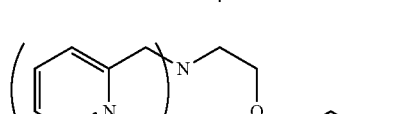 A4-108
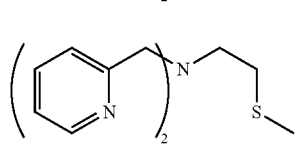 A4-109
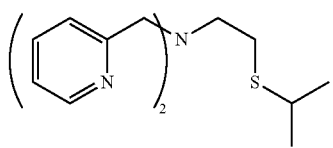 A4-110
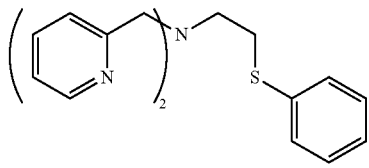 A4-111
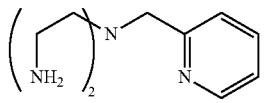 A4-112
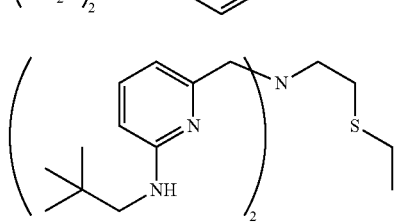 A4-113
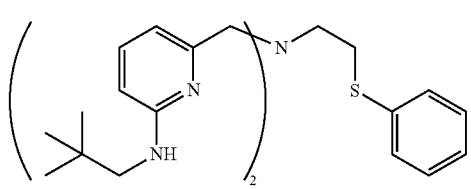 A4-114
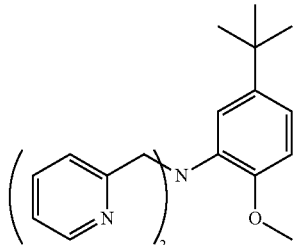 A4-115
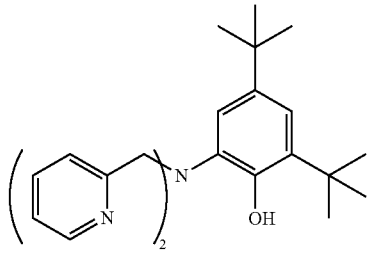 A4-116
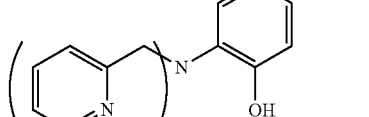 A4-117

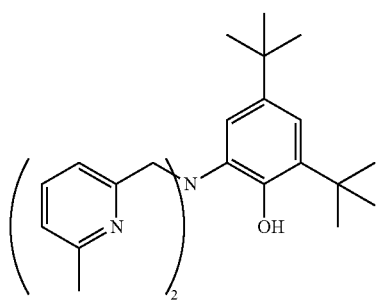
A4-118
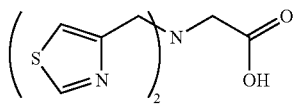
A4-126
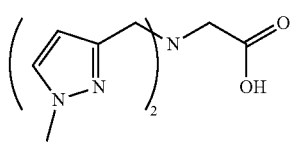
A4-127
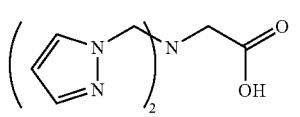
A4-128
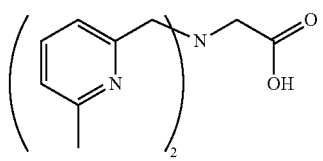
A4-129
A4-119
A4-120
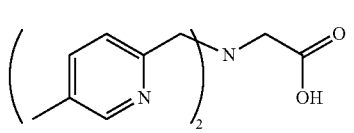
A4-130
A4-121
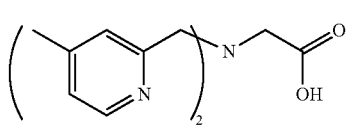
A4-131
A4-122
A4-123
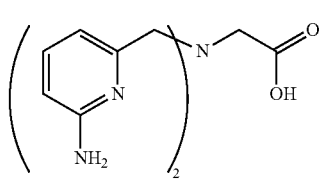
A4-132
A4-124
A4-125
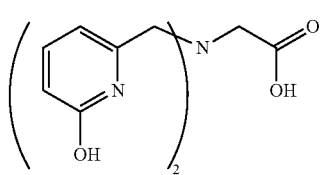
A4-133

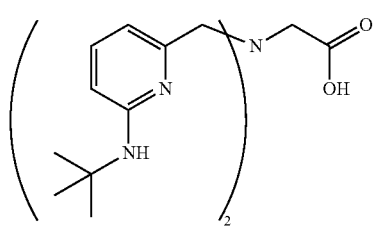
A4-135
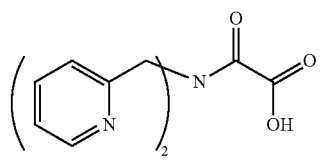
A4-139
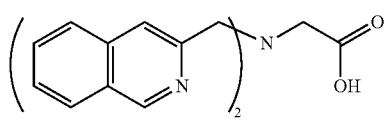
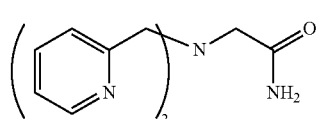
A4-140
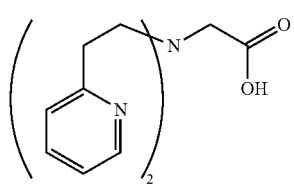
A4-136
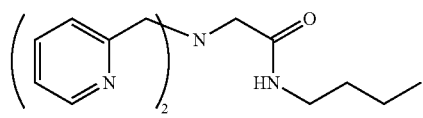
A4-141
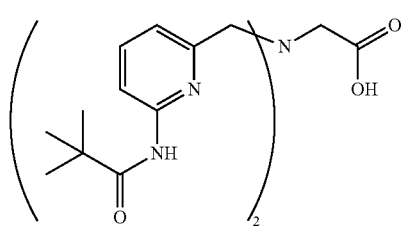
A4-137
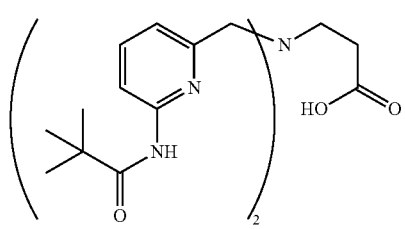
A4-138
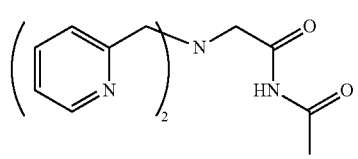
A4-142
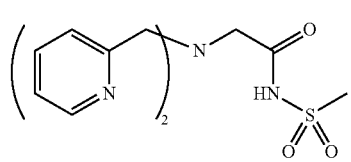
A4-143

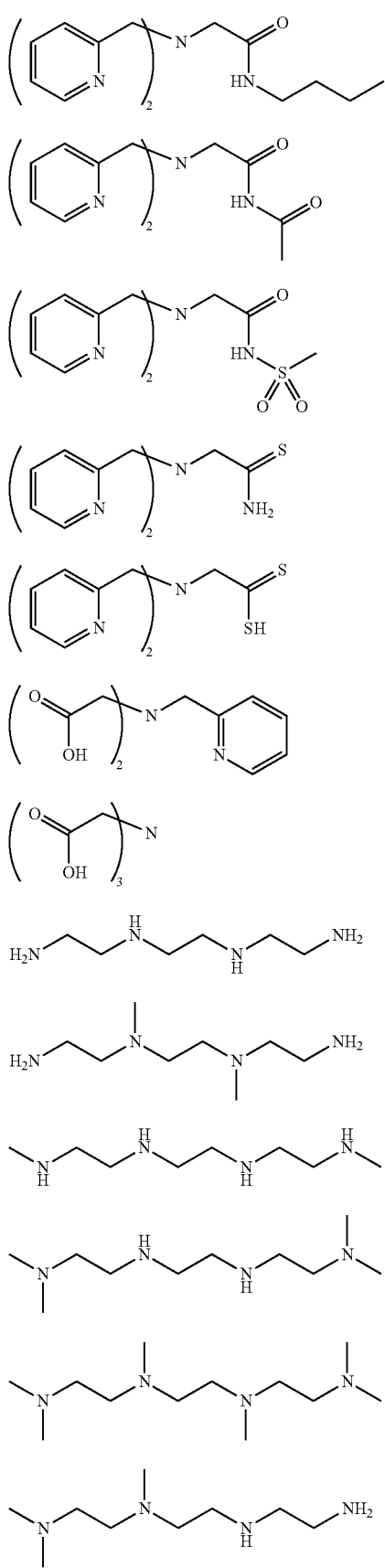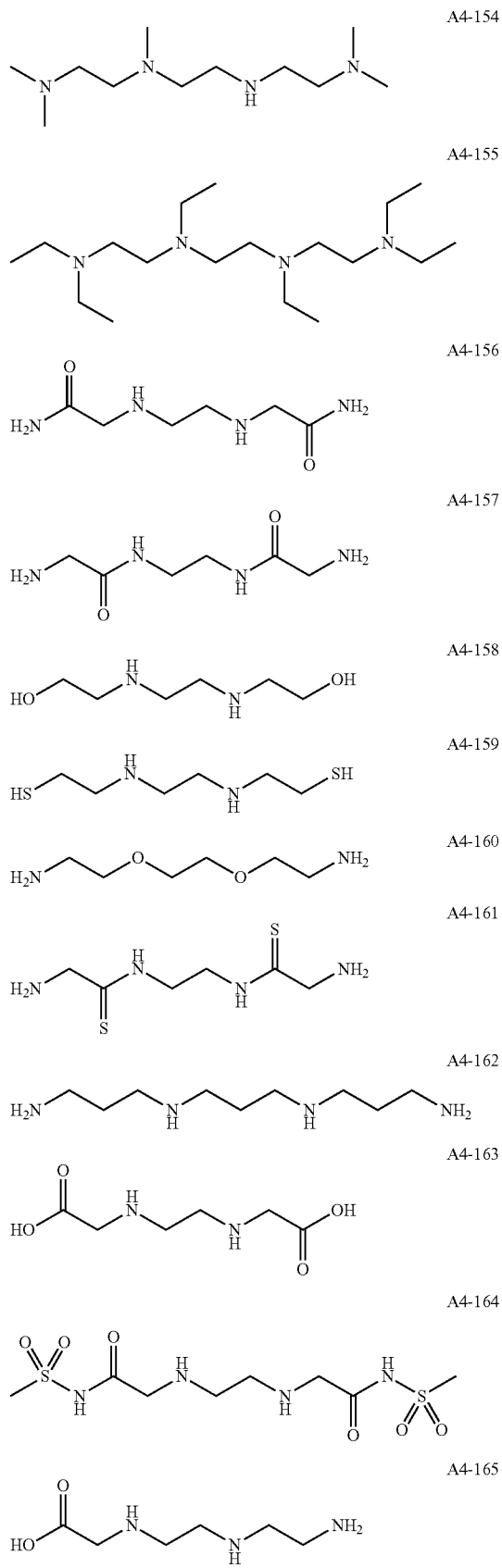

A4-166 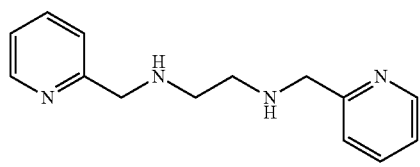
A4-167 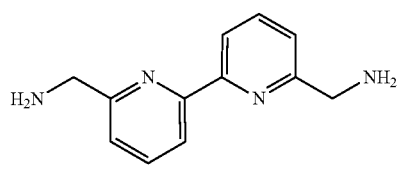
A4-168 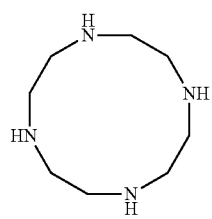
A4-169 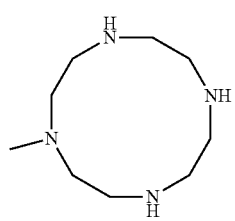
A4-170 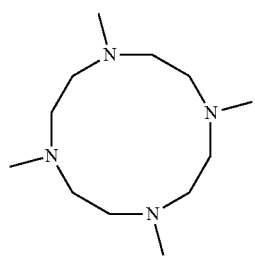
A4-171 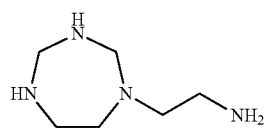
A4-172 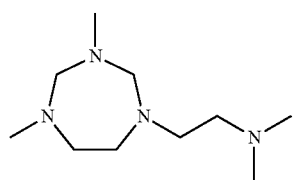
A4-173 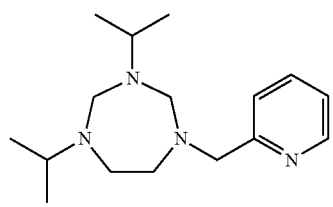
A4-174 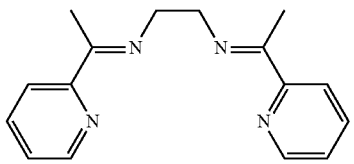
A4-175 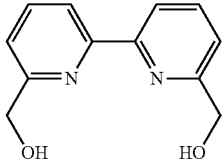
A4-176 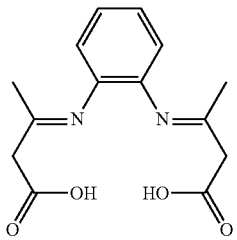
A4-177 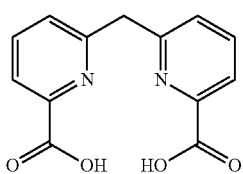
A4-178 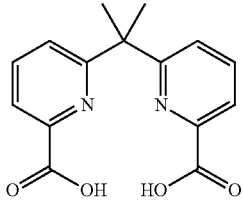
A4-179 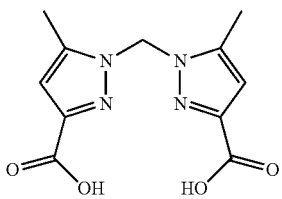
A4-180 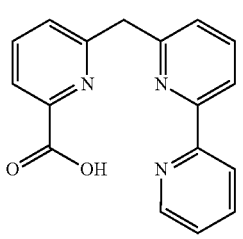
A4-181 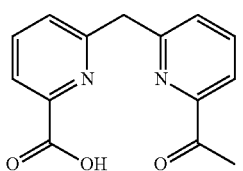

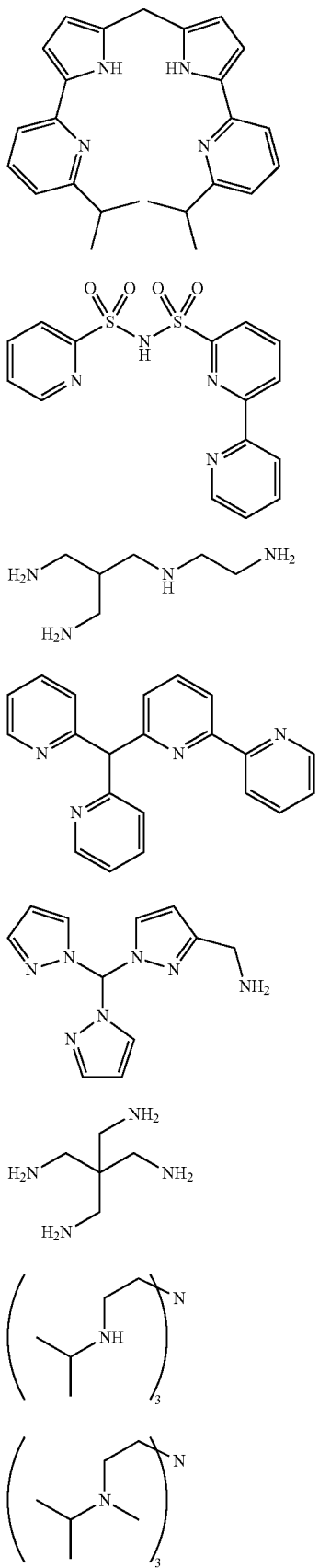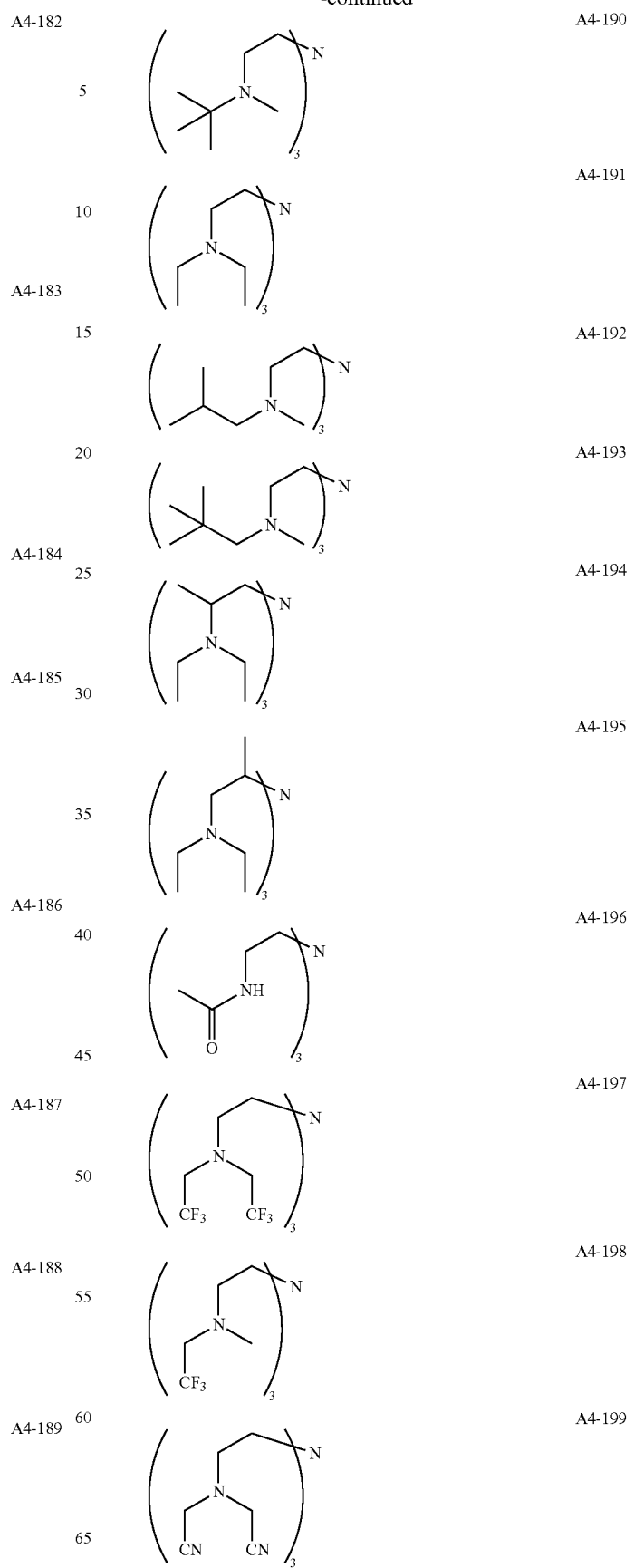

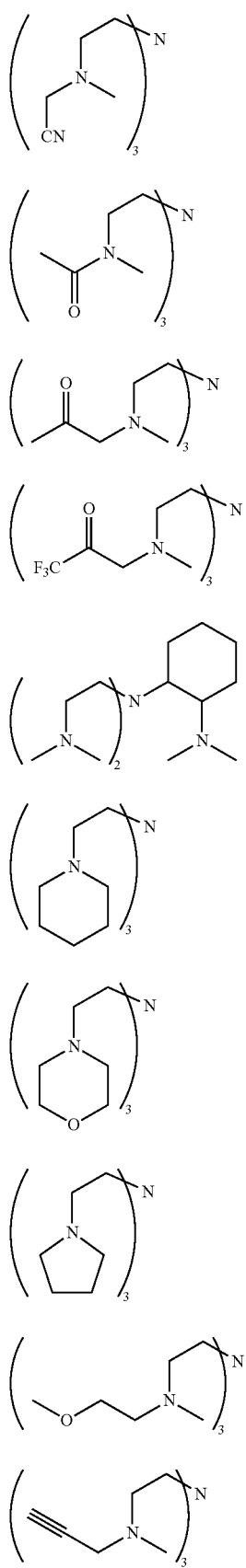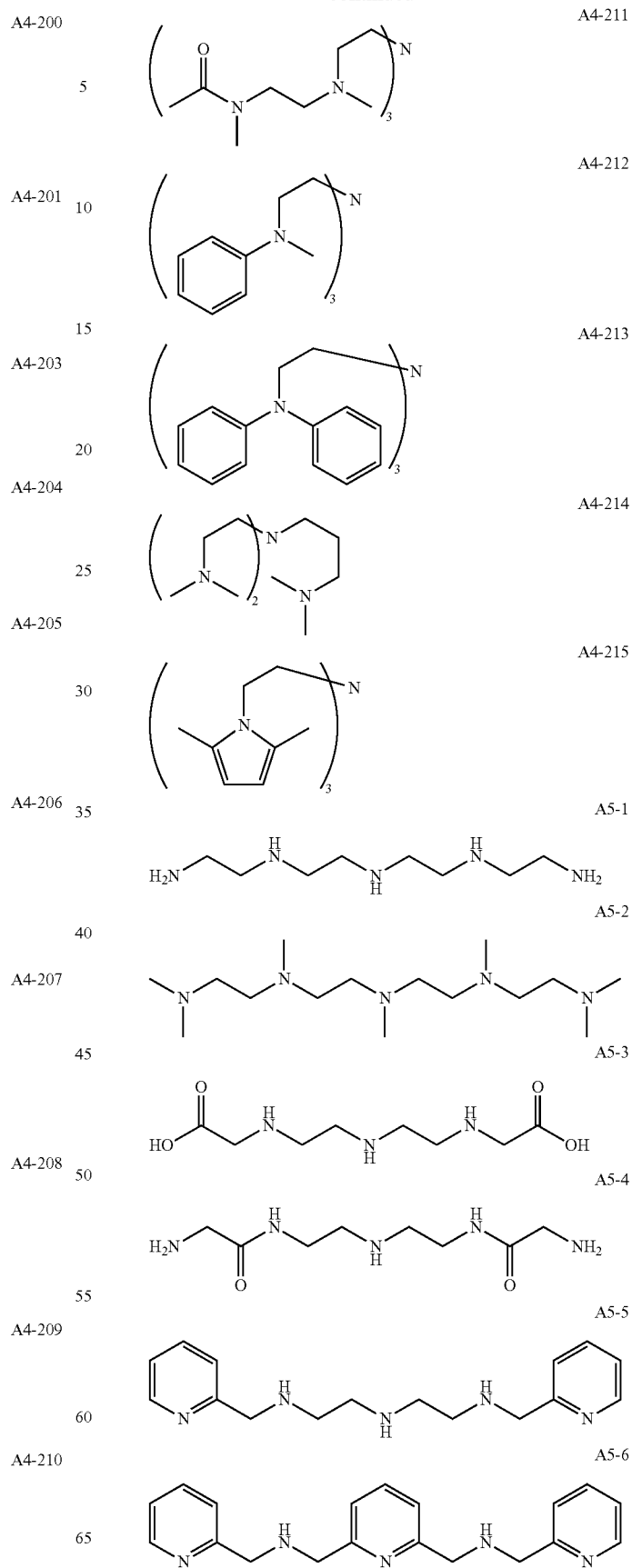

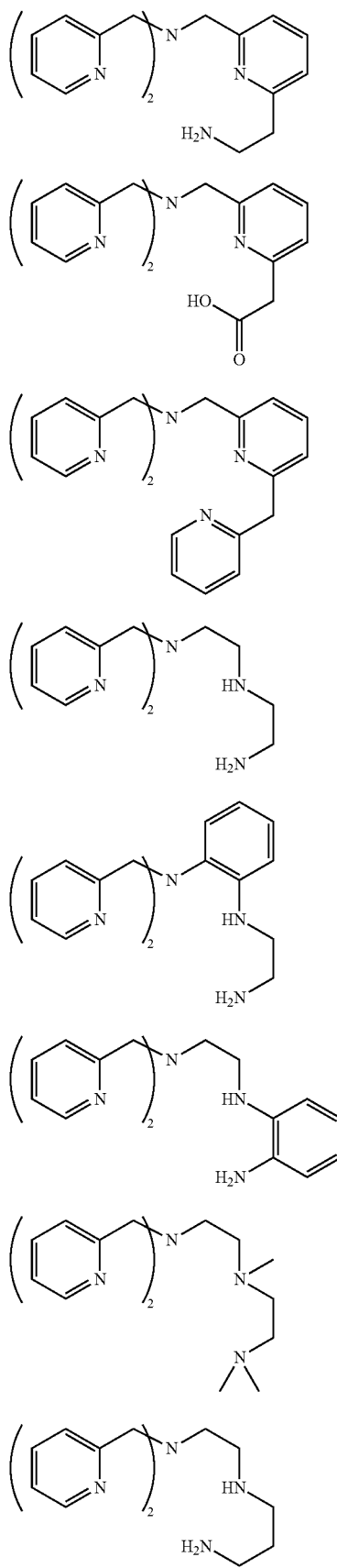
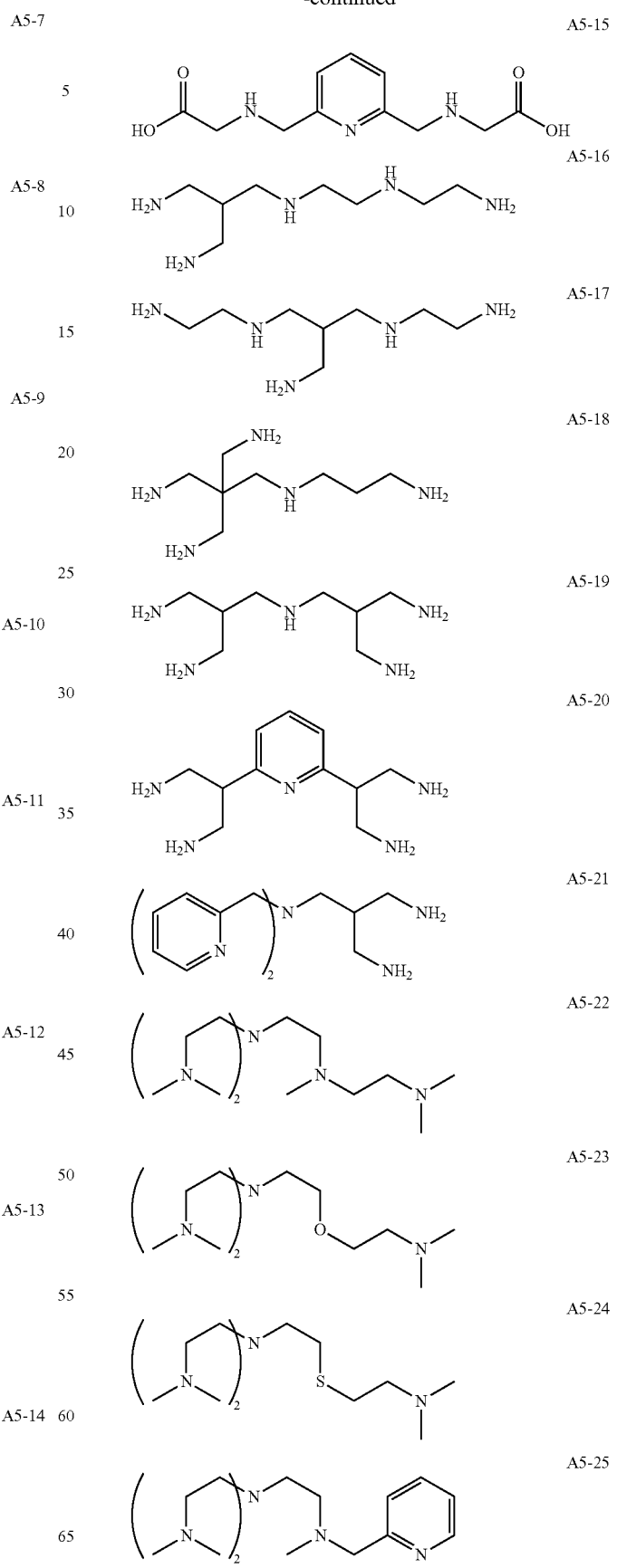

A5-26 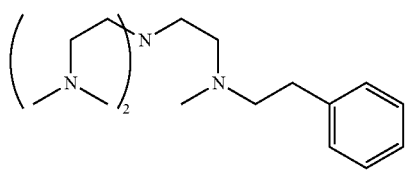

A5-27 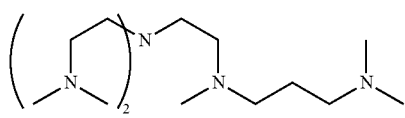

A5-28 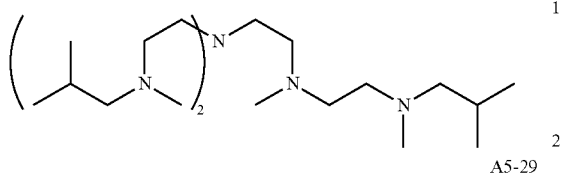

A5-29 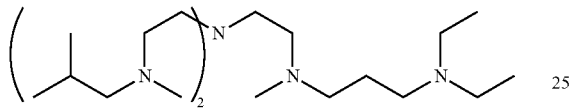

A5-30 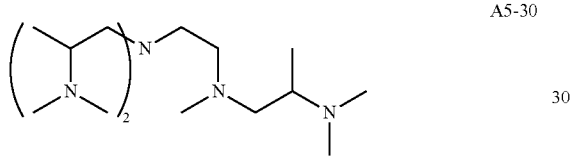

A5-31 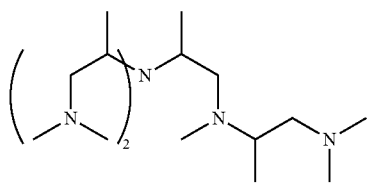

A5-32 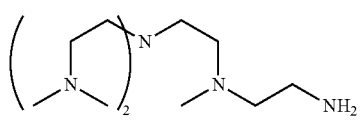

A5-33 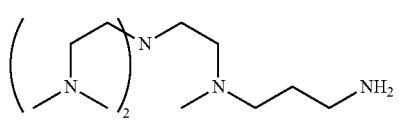

A5-34 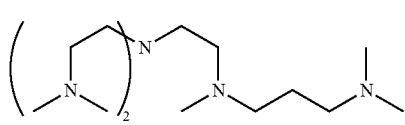

A5-35 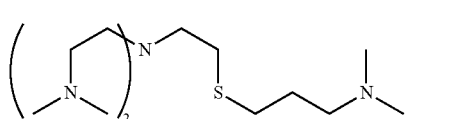

A5-36 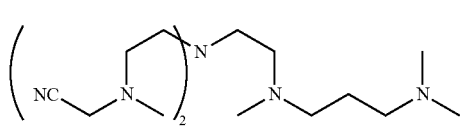

<<Other Compounds>>

The copper complex that is used in the present invention may have a compound having one coordination site that is coordinated with an anion and one coordinating atom that forms a bond using an unshared electron pair or a compound having two coordination sites that are coordinated with anions and no coordinating atoms that form bonds using unshared electron pairs as a ligand. Examples of the above-described compound include the following compounds.

AA2-44 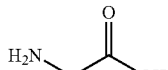

AA2-45 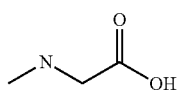

AA2-46 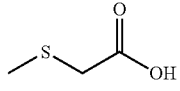

AA2-47 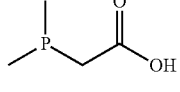

AA2-48 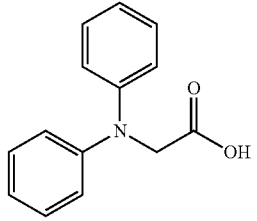

AA2-49 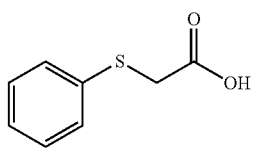

AA2-50 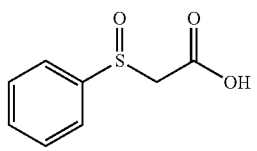

AA2-51 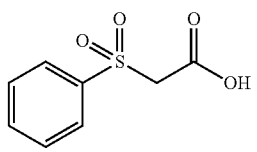

AA2-52 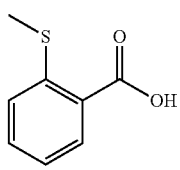

| | |
|---|---|
| AA2-53 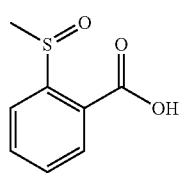 | AA2-62 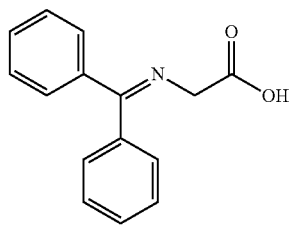 |
| AA2-54 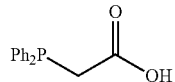 | AA2-63 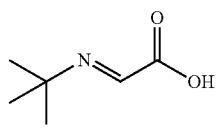 |
| AA2-55 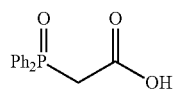 | AA2-64 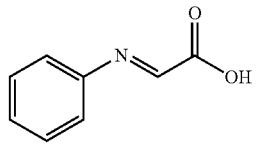 |
| AA2-56 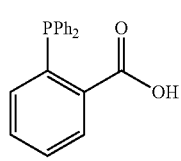 | AA2-65 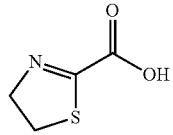 |
| AA2-57 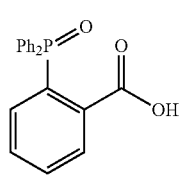 | AA2-66 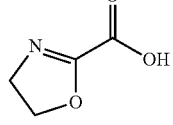 |
| AA2-58 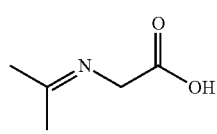 | AA2-67 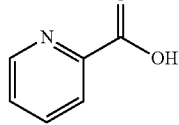 |
| AA2-59 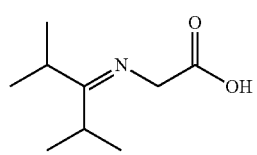 | AA2-68 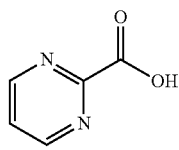 |
| AA2-60 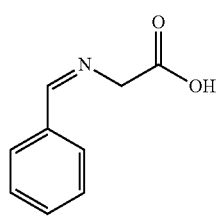 | AA2-69 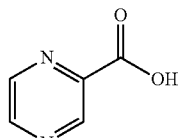 |
| AA2-61 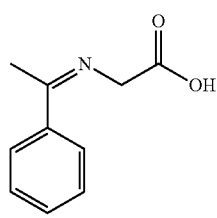 | AA2-70 <br> AA2-71 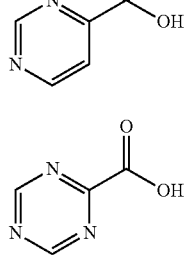 |

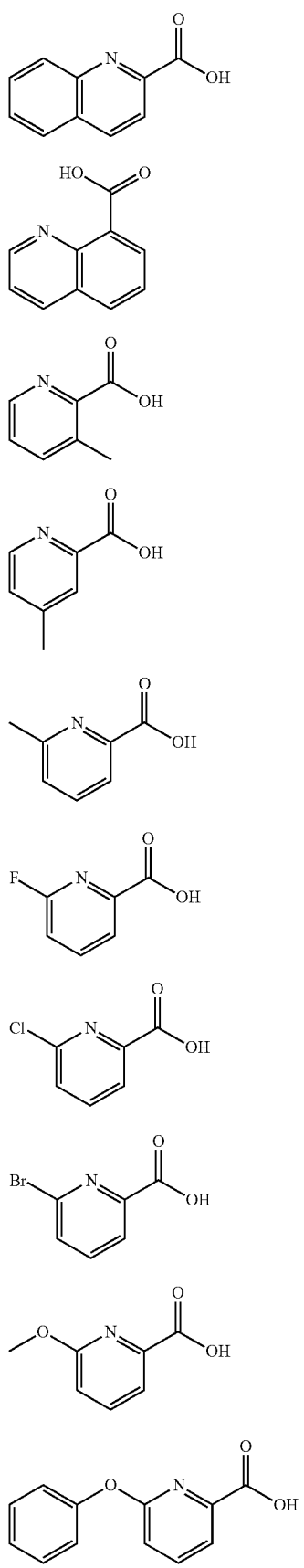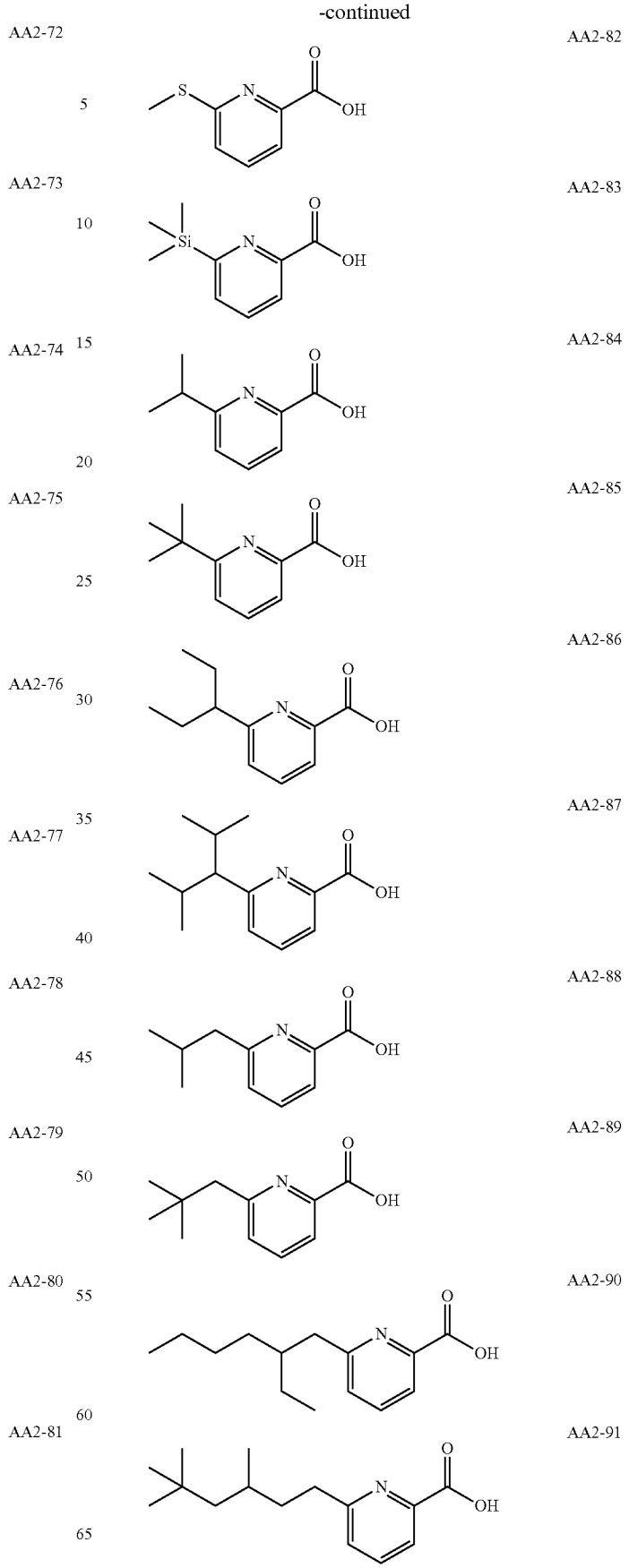

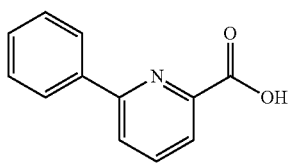
AA2-92
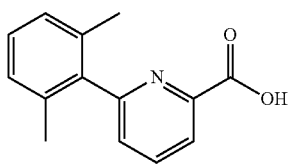
AA2-93
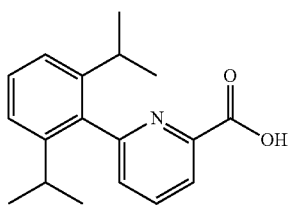
AA2-94
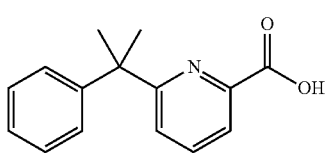
AA2-95
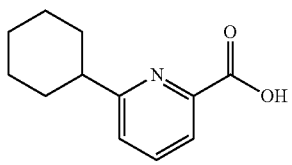
AA2-96
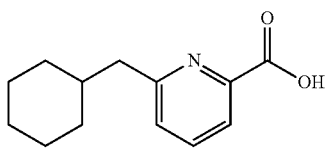
AA2-97
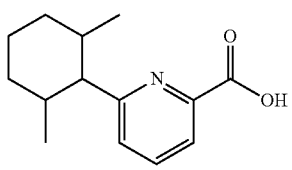
AA2-98
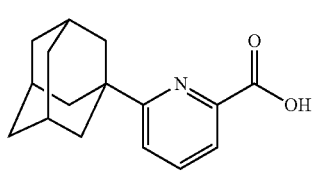
AA2-99
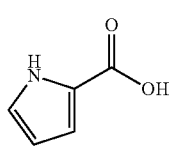
AA2-100
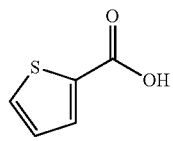
AA2-101
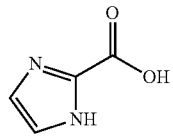
AA2-102
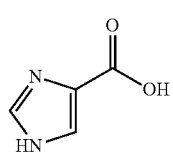
AA2-103
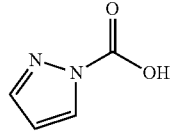
AA2-104
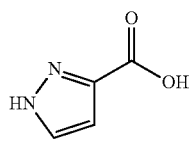
AA2-105
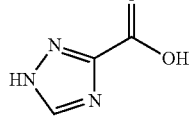
AA2-106
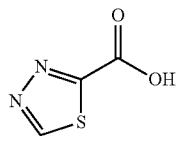
AA2-107
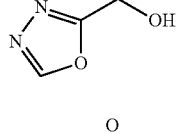
AA2-108
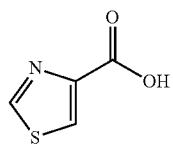
AA2-109
AA2-110

| | |
|---|---|
| 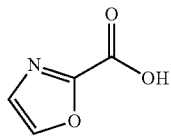 | AA2-111 |
| 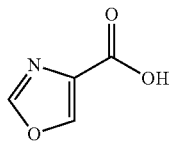 | AA2-112 |
| 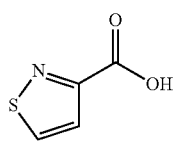 | AA2-113 |
| 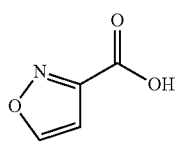 | AA2-114 |
| 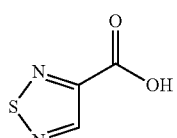 | AA2-115 |
| 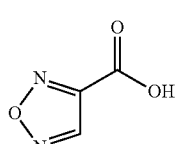 | AA2-116 |
| 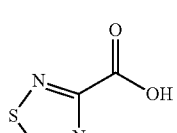 | AA2-117 |
| 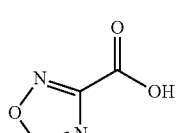 | AA2-118 |
| 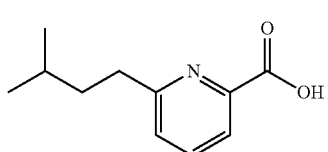 | AA2-119 |
| 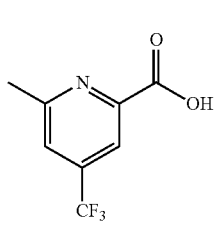 | AA2-120 |
| | |
|---|---|
| 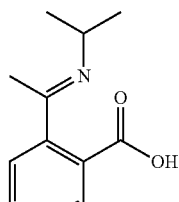 | AA2-121 |
| 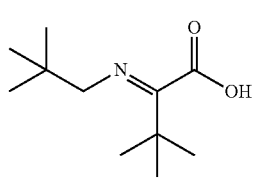 | AA2-122 |
| 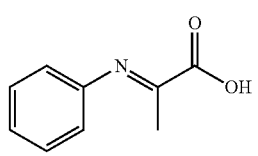 | AA2-123 |
| 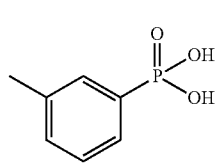 | AA2-124 |
| 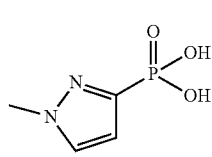 | AA2-125 |
| 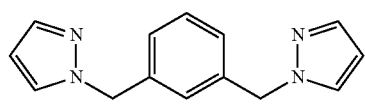 | AA2-126 |
| 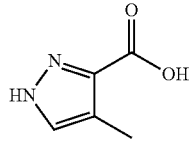 | AA2-127 |
| 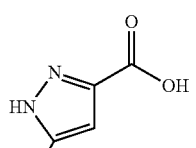 | AA2-128 |
| 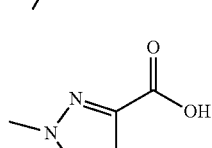 | AA2-129 |
| 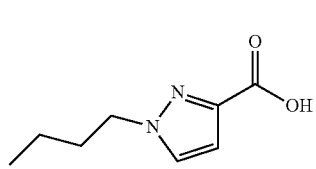 | AA2-130 |

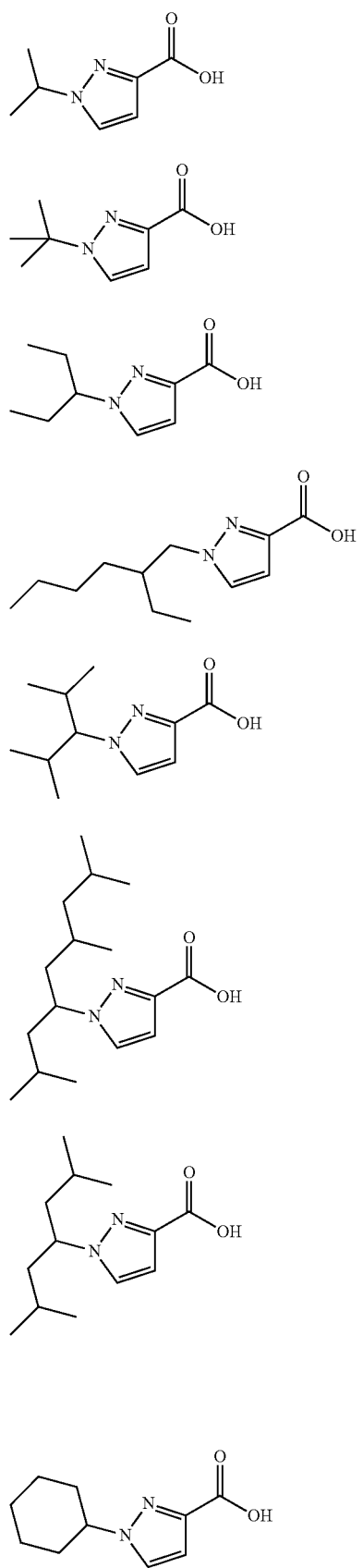
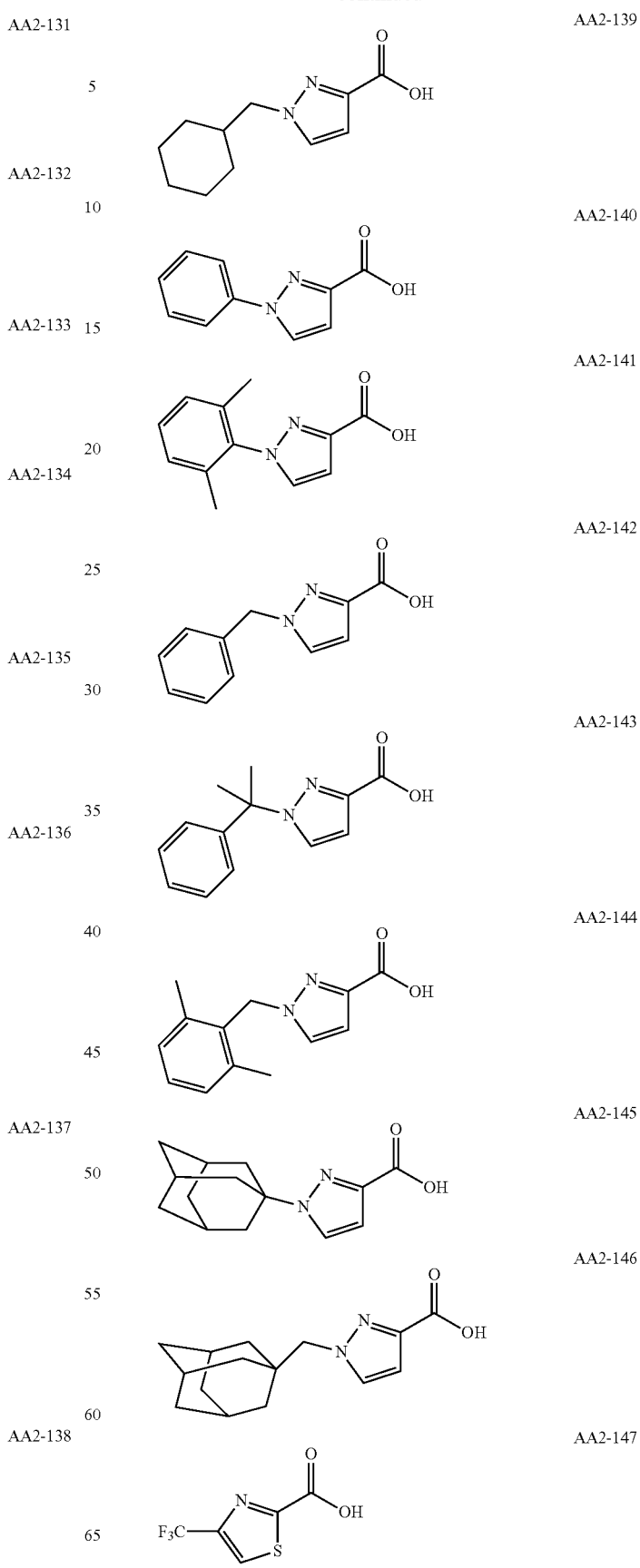

AA2-148 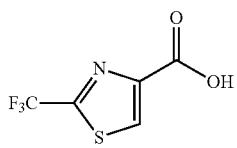
AA2-149 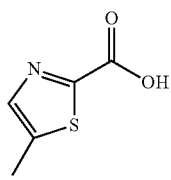
AA2-150 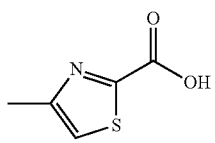
AA2-151 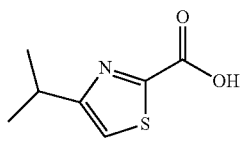
AA2-152 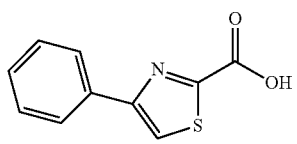
AA2-153 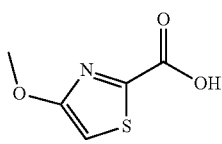
AA2-154 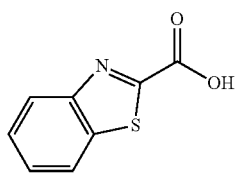
AA2-155 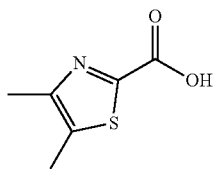
AA2-156 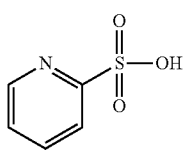
AA2-157 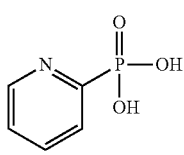
AA2-158 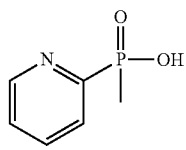
AA2-159 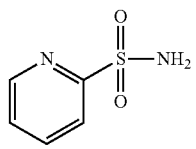
AA2-160 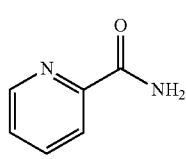
AA2-161 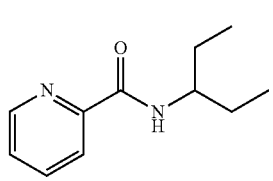
AA2-162 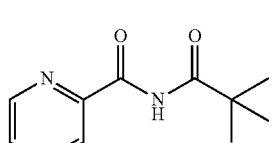
AA2-163 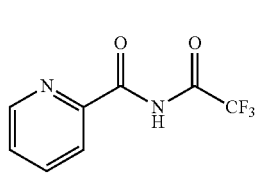
AA2-164 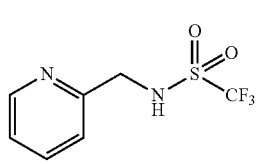
AA2-165 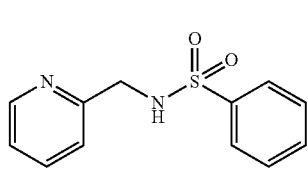
AA2-166 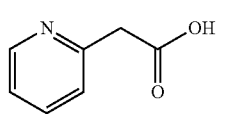
AA2-167 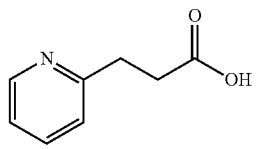

AA2-168 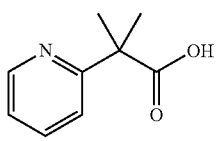
AA2-169 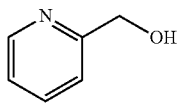
AA2-170 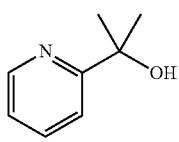
AA2-171 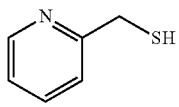
AA2-172 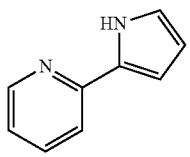
AA2-173 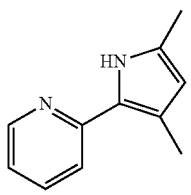
AA2-174 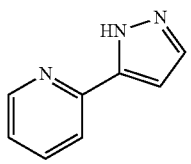
AA2-175 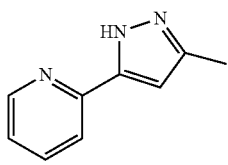
AA2-176 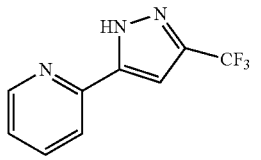
AA2-177 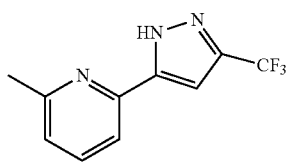
AA2-178 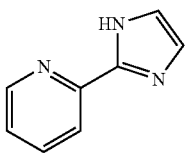
AA2-179 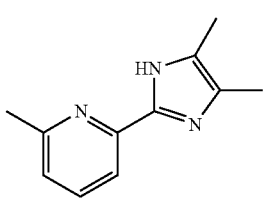
AA2-180 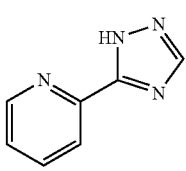
AA2-181 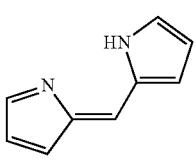
AA2-182 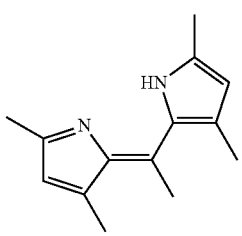
AA2-183 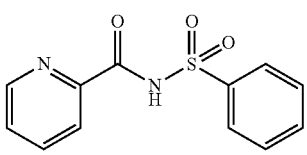
AA2-184 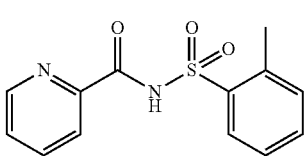
AA2-185 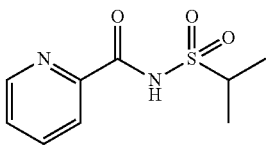
AA2-186 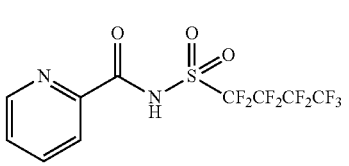

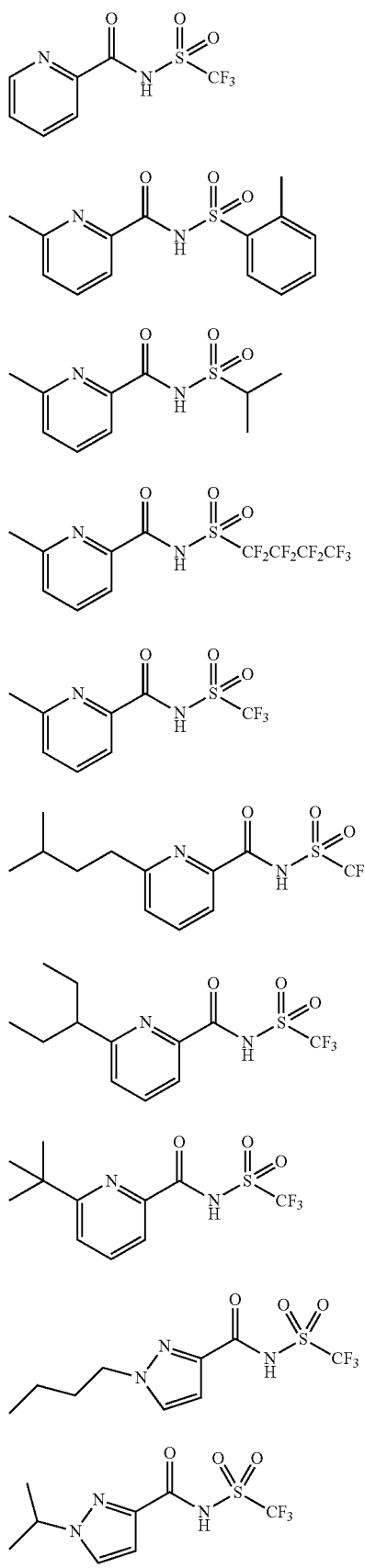
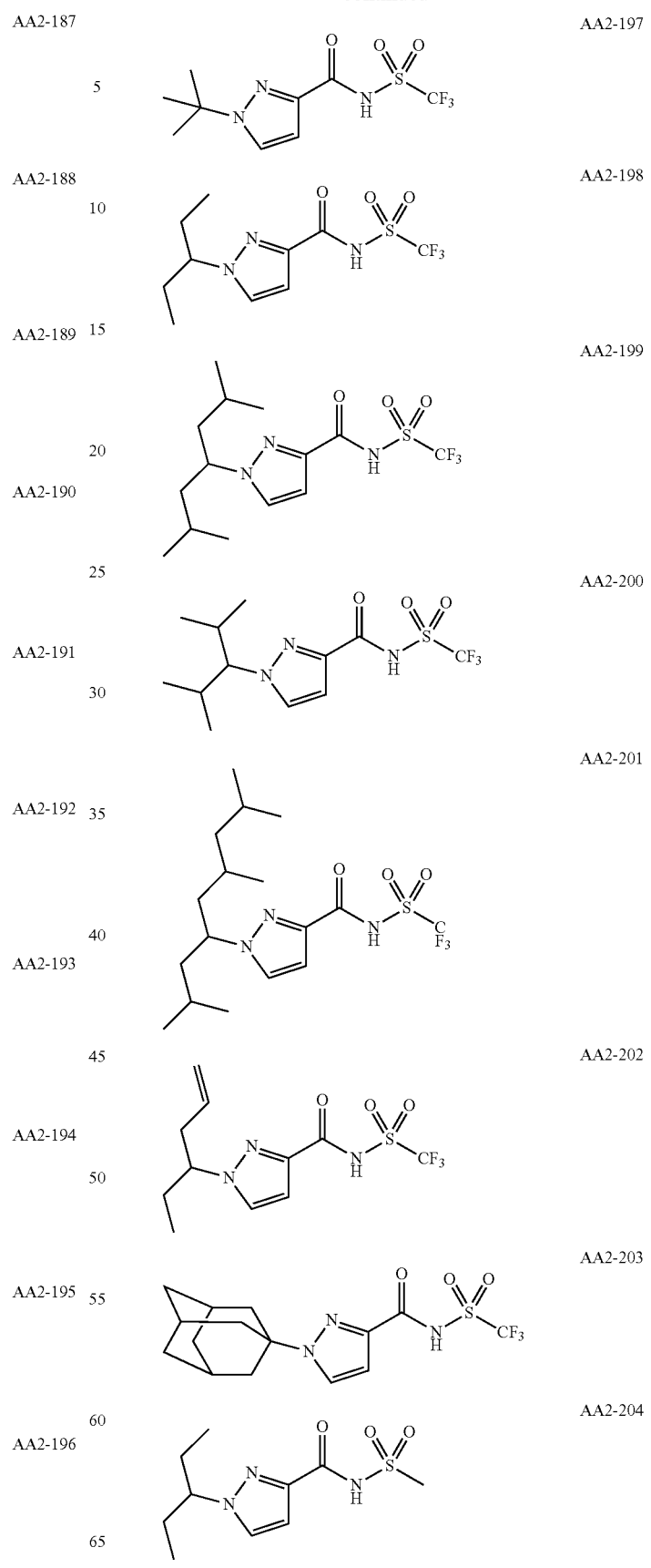

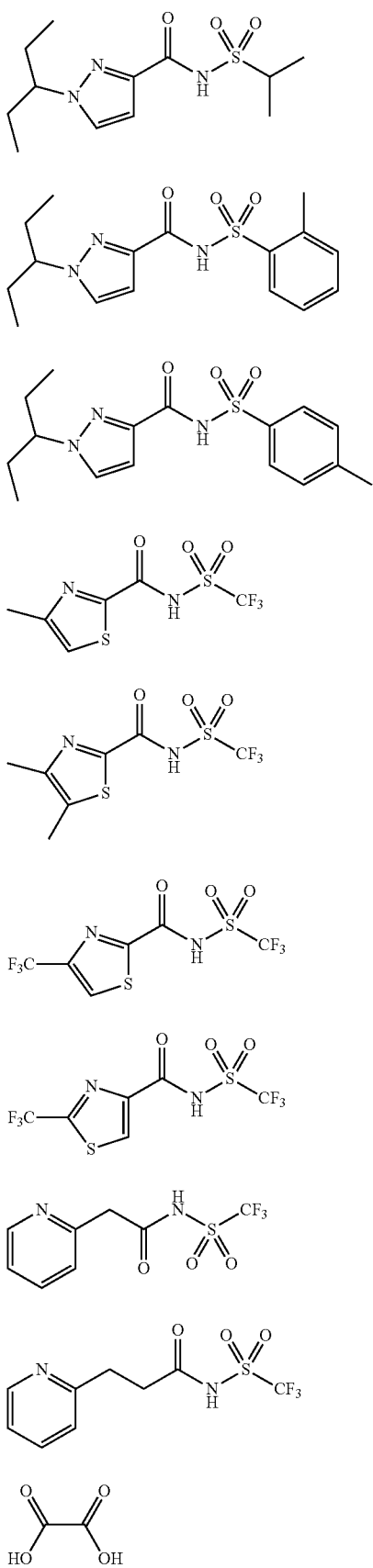
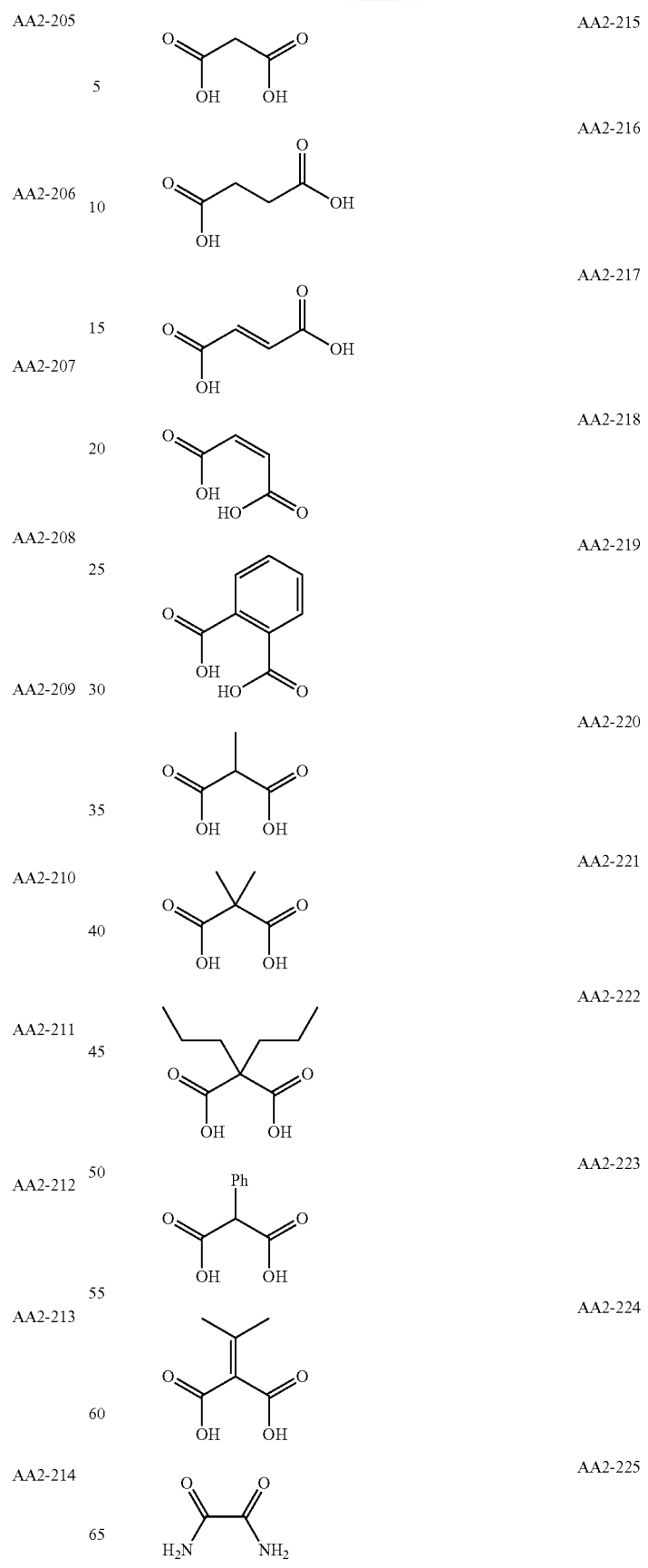

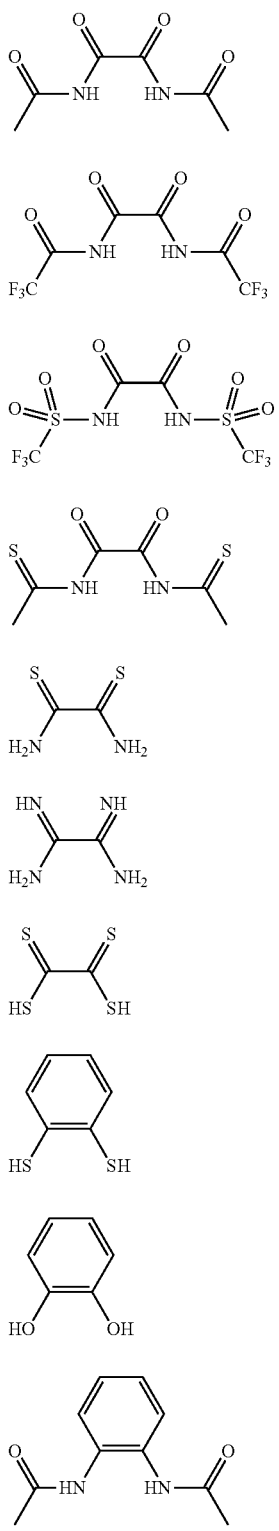

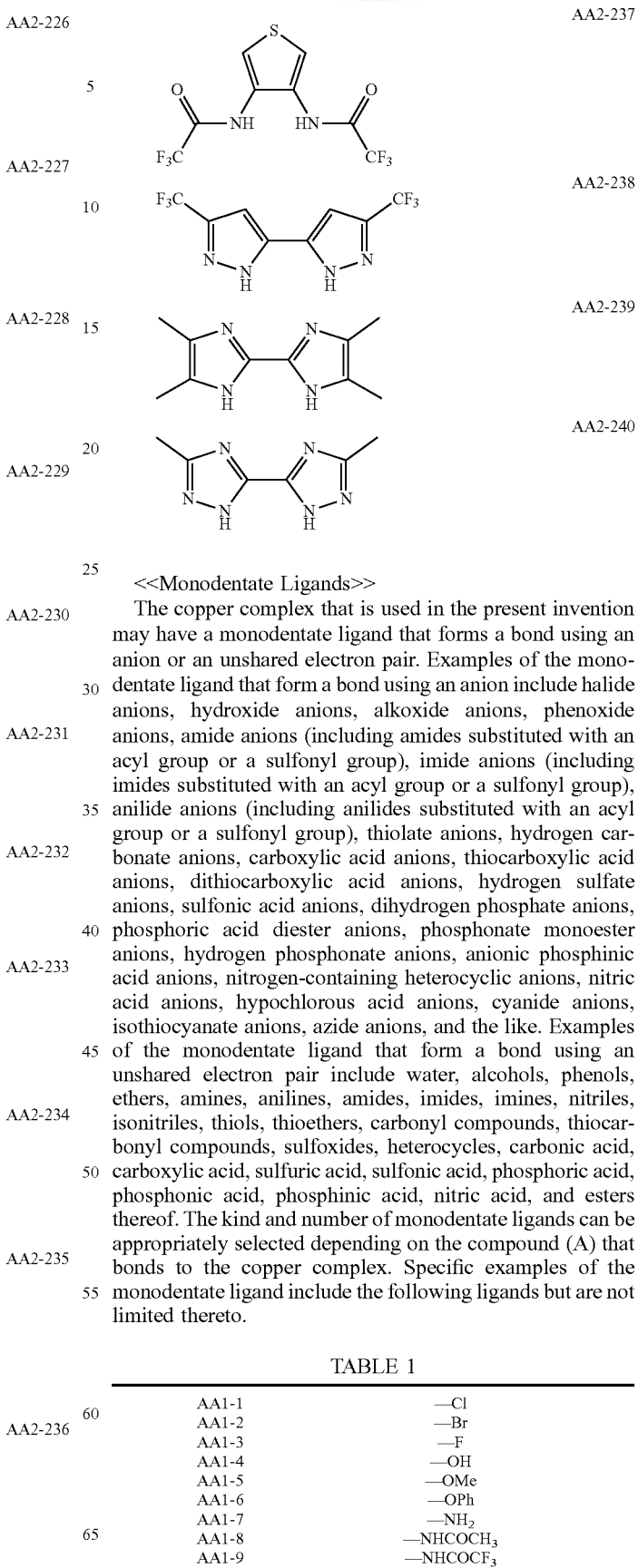

<<Monodentate Ligands>>

The copper complex that is used in the present invention may have a monodentate ligand that forms a bond using an anion or an unshared electron pair. Examples of the monodentate ligand that form a bond using an anion include halide anions, hydroxide anions, alkoxide anions, phenoxide anions, amide anions (including amides substituted with an acyl group or a sulfonyl group), imide anions (including imides substituted with an acyl group or a sulfonyl group), anilide anions (including anilides substituted with an acyl group or a sulfonyl group), thiolate anions, hydrogen carbonate anions, carboxylic acid anions, thiocarboxylic acid anions, dithiocarboxylic acid anions, hydrogen sulfate anions, sulfonic acid anions, dihydrogen phosphate anions, phosphoric acid diester anions, phosphonate monoester anions, hydrogen phosphonate anions, anionic phosphinic acid anions, nitrogen-containing heterocyclic anions, nitric acid anions, hypochlorous acid anions, cyanide anions, isothiocyanate anions, azide anions, and the like. Examples of the monodentate ligand that form a bond using an unshared electron pair include water, alcohols, phenols, ethers, amines, anilines, amides, imides, imines, nitriles, isonitriles, thiols, thioethers, carbonyl compounds, thiocarbonyl compounds, sulfoxides, heterocycles, carbonic acid, carboxylic acid, sulfuric acid, sulfonic acid, phosphoric acid, phosphonic acid, phosphinic acid, nitric acid, and esters thereof. The kind and number of monodentate ligands can be appropriately selected depending on the compound (A) that bonds to the copper complex. Specific examples of the monodentate ligand include the following ligands but are not limited thereto.

TABLE 1

| | |
|---|---|
| AA1-1 | —Cl |
| AA1-2 | —Br |
| AA1-3 | —F |
| AA1-4 | —OH |
| AA1-5 | —OMe |
| AA1-6 | —OPh |
| AA1-7 | —NH$_2$ |
| AA1-8 | —NHCOCH$_3$ |
| AA1-9 | —NHCOCF$_3$ |

TABLE 1-continued

| | |
|---|---|
| AA1-10 | —NHSO$_2$CH$_3$ |
| AA1-11 | —NHSO$_2$CF$_3$ |
| AA1-12 | —N(COCH$_3$)$_2$ |
| AA1-13 | —N(SO$_2$CF$_3$)$_2$ |
| AA1-14 | —SC(=S)CH$_3$ |
| AA1-15 | —OP(=O)(OMe)Ph |
| AA1-16 | —OS(=O)$_2$CF$_3$ |
| AA1-17 | —NMe$_2$ |
| AA1-18 | —N(SiMe$_3$)$_2$ |
| AA1-19 | —NHPh |
| AA1-20 | —SPh |
| AA1-21 | —OS(=O)(OH)$_2$ |
| AA1-22 | —OS(=O)$_2$CH$_3$ |
| AA1-23 | —OCOCH$_3$ |
| AA1-24 | —OCOPh |
| AA1-25 | —OP(=O)(OH)$_2$ |
| AA1-26 | —OP(=O)(OPh)$_2$ |
| AA1-27 | —OP(=O)Me$_2$ |
| AA1-28 | —ONO$_2$ |
| AA1-29 | —NCO |
| AA1-30 | —OCN |
| AA1-31 | —NCS |
| AA1-32 | —SCN |
| AA1-33 | —CN |
| AA1-34 | —N$_3$ |
| AA1-35 | (succinimide N-yl) |
| AA1-36 | (saccharin N-yl) |
| AA1-37 | (pyrrol-1-yl) |
| AA1-38 | (pyrazol-1-yl) |
| AA1-39 | (1,2,4-triazol-1-yl) |
| AA1-40 | (3,5-dimethyl-1,2,4-triazol-1-yl) |
| AA1-41 | —OH$_2$ |
| AA1-42 | —OHMe |
| AA1-43 | —OHPh |
| AA1-44 | —NH$_3$ |
| AA1-45 | —NEt$_3$ |
| AA1-46 | —NH$_2$Ph |
| AA1-47 | —NCMe |
| AA1-48 | —O=C(CH$_3$)$_2$ |
| AA1-49 | —O=S(CH$_3$)$_2$ |
| AA1-50 | —SHPh |
| AA1-51 | (tetrahydrofuran-O-yl) |
| AA1-52 | (N,N-dimethylformamide) |
| AA1-53 | (N-phenyl ketimine) |
| AA1-54 | (cyclohexanone-O) |
| AA1-55 | (pyridin-1-yl) |
| AA1-56 | (4-dimethylaminopyridin-1-yl) |
| AA1-57 | (1-methylimidazol-3-yl) |

The copper complex that is used in the present invention may be a cationic complex or an anionic complex depending on the number of coordination sites that are coordinated with anions in addition a neutral complex having no charges. In this case, the copper complex has counter ions as necessary so as to neutralize charges in the copper complex.

In a case in which the counter ions are anionic counter ions, the anions may be, for example, inorganic anions or organic anions. Specific examples thereof include hydroxide ions, halogen anions (for example, fluoride ions, chloride ions, bromide ions, iodide ions, and the like), substituted or unsubstituted alkyl carboxylate ions (acetate ions, trifluoroacetate, and the like), substituted or unsubstituted aryl carboxylate ions (benzoate ions and the like), substituted or unsubstituted alkylsulfonic acid ions (methanesulfate, trifluoromethane sulfate ions, and the like), substituted or unsubstituted arylsulfate ions (for example, p-toluene sulfate ion, p-chlorobenzene sulfate acid ions and the like), aryl disulfate ions (for example, 1,3-benzene disulfate ion, 1,5-naphthalene disulfate ions, 2,6-naphthalene disulfate ions, and the like), alkyl sulfate ions (for example, methyl sulfate ions), sulfuric acid ions, thiocyanic acid ions, nitric acid ions, perchloric acid ions, tetrafluoroborate ions, tetraaryl borate ions, hexafluorophosphate ions, picric acid ions, amide ions (including amides substituted with an acyl group or a sulfonyl group), and methide ions (including methides substituted with an acyl group or a sulfonyl group), and halogen anions, substituted or unsubstituted alkyl carboxylate ions, sulfuric acid ions, nitric acid ions, tetrafluoroborate ions, tetraaryl borate ions, hexafluorophosphate ions, amide ions (including amides substituted with an acyl group or a sulfonyl group), and methide ions (including methides substituted with an acyl group or a sulfonyl group) are preferred.

In a case in which the counter ions are cationic counter ions, examples thereof include inorganic or organic ammonium ions (for example, tetraalkyl ammonium ions such as tetrabutyl ammonium ions, triethylbenzylammonium ions, piridinium ions, and the like), phosphonium ions (for example, tetraalkyl phosphonium ions such as tetrabutyl phosphonium ions, alkyl triphenyl phosphonium ions, triethyl phenyl phosphonium ions, and the like), alkali metal ions and protons.

In addition, the counter ions may be metal complex ions, and particularly, the counter ions may be copper complexes, that is, salts of a cationic copper complex and an anionic copper complex.

<<Copper Component>>

The copper component that is used in the present invention may be a copper complex or a copper compound other than the copper complex. For example, copper or a compound including copper can be used. As the compound including copper, it is possible to use, for example, copper oxide or a copper salt. The copper salt is preferably monovalent or divalent copper and more preferably divalent copper. The copper salt is more preferably copper acetate, copper chloride, copper formate, copper hydroxide, copper stearate, copper benzoate, copper ethyl acetoacetate, copper pyrophosphate, copper naphthenate, copper citrate, copper nitrate, copper sulfate, copper carbonate, copper chlorate, copper (meth)acrylate, copper perchlorate, copper phosphinate, copper diphenyl phosphinate, or copper methanesulfonate, still more preferably copper acetate, copper chloride, copper phosphinate, copper diphenyl phosphinate, or copper methanesulfonate, and particularly preferably copper acetate, copper phosphinate, copper diphenyl phosphinate, or copper methanesulfonate.

Regarding the amount of the copper component that is reacted with the compound (A), the molar ratio (between the compound (A) and the copper component) is preferably set in a range of 1:0.5 to 1:8, more preferably set in a range of 1:0.5 to 1:4, and still more preferably set in a range of 1:0.6 to 1:1.

In addition, when the copper component and the compound (A) are reacted with each other, the reaction conditions are preferably, for example, a temperature in a range of 20° C. to 50° C. and a duration of 0.5 hours or longer.

Specific examples of the copper complex include examples shown in the following tables, but are not limited thereto.

The compounds and the monodentate ligands in the tables represent the above-described compounds and the above-described monodentate ligands. In addition, in the following tables, Ph represents a phenyl group.

Meanwhile, the copper complex that is used in the present invention may be further coordinated with components other than the copper complex of the composition of the present invention (a solvent, a variety of additives, and the like), and some of the ligands for the copper complex may be present in a state of being substituted with components other than the copper complex. What has been described above is an ordinary property of a copper (II) complex having a substitutable $d^9$ electron disposition.

TABLE 2

| Copper complex | Compound (1) | Ligand Monodentate ligand (2) | Monodentate ligand (3) | Molar ratio among (1):(2):(3): Cu(II) | Counter ions |
|---|---|---|---|---|---|
| Cu1-1a | AA2-1 | AA1-1 | — | 1:2:0:1 | — |
| Cu1-2a | AA2-2 | AA1-1 | — | 1:2:0:1 | — |
| Cu1-3a | AA2-6 | AA1-1 | — | 1:2:0:1 | — |
| Cu1-4a | AA2-10 | AA1-1 | — | 1:2:0:1 | — |
| Cu1-5a | AA2-11 | AA1-1 | — | 1:2:0:1 | — |
| Cu1-6a | AA2-15 | AA1-1 | — | 1:2:0:1 | — |
| Cu1-7a | AA2-19 | AA1-1 | — | 1:2:0:1 | — |
| Cu1-8a | AA2-20 | AA1-1 | — | 1:2:0:1 | — |
| Cu1-9a | AA2-22 | AA1-1 | — | 1:2:0:1 | — |
| Cu1-10a | AA2-23 | AA1-1 | — | 1:2:0:1 | — |
| Cu1-11a | AA2-26 | AA1-1 | — | 1:2:0:1 | — |
| Cu1-12a | AA2-28 | AA1-1 | — | 1:2:0:1 | — |
| Cu1-13a | AA2-32 | AA1-1 | — | 1:2:0:1 | — |
| Cu1-14a | AA2-36 | AA1-1 | — | 1:2:0:1 | — |
| Cu1-15a | AA2-40 | AA1-1 | — | 1:2:0:1 | — |
| Cu1-16a | AA2-1 | AA1-3 | — | 1:2:0:1 | — |
| Cu1-17a | AA2-1 | AA1-23 | — | 1:2:0:1 | — |
| Cu1-18a | AA2-1 | AA1-16 | — | 1:2:0:1 | — |
| Cu1-19a | AA2-1 | AA1-21 | — | 1:2:0:1 | — |
| Cu1-20a | AA2-1 | AA1-28 | — | 1:2:0:1 | — |
| Cu1-21a | AA2-1 | AA1-2 | — | 1:2:0:1 | — |
| Cu1-22a | AA2-1 | AA1-9 | — | 1:2:0:1 | — |
| Cu1-23a | AA2-1 | AA1-10 | — | 1:2:0:1 | — |
| Cu1-24a | AA2-1 | AA1-22 | — | 1:2:0:1 | — |
| Cu1-25a | AA2-1 | AA1-24 | — | 1:2:0:1 | — |
| Cu1-26a | AA2-1 | AA1-26 | — | 1:2:0:1 | — |
| Cu1-27a | AA2-1 | AA1-31 | — | 1:2:0:1 | — |
| Cu1-28a | AA2-1 | AA1-35 | — | 1:2:0:1 | — |
| Cu1-29a | AA2-1 | AA1-36 | — | 1:2:0:1 | — |
| Cu1-30a | AA2-1 | AA1-38 | — | 1:2:0:1 | — |
| Cu1-31a | AA2-1 | AA1-1 | AA1-41 | 1:2:1:1 | — |
| Cu1-32a | AA2-1 | AA1-1 | AA1-44 | 1:2:1:1 | — |
| Cu1-33a | AA2-1 | AA1-1 | AA1-47 | 1:2:1:1 | — |
| Cu1-34a | AA2-1 | AA1-1 | AA1-51 | 1:2:1:1 | — |
| Cu1-35a | AA2-1 | AA1-1 | AA1-55 | 1:2:1:1 | — |
| Cu1-36a | AA2-1 | AA1-1 | — | 2:1:0:1 | Cl |

TABLE 3

| Copper complex | Compound (1) | Ligand Compound (2) | Monodentate ligand (3) | Molar ratio among (1):(2):(3): Cu(II) | Counter ions |
|---|---|---|---|---|---|
| Cu2-1a | AA2-1 | AA2-10 | AA1-1 | 1:1:2:1 | — |
| Cu2-2a | AA2-1 | AA2-23 | AA1-1 | 1:1:2:1 | — |
| Cu2-3a | AA2-1 | AA2-32 | AA1-1 | 1:1:2:1 | — |
| Cu2-4a | AA2-1 | AA2-44 | AA1-1 | 1:1:1:1 | — |
| Cu2-5a | AA2-1 | AA2-76 | AA1-1 | 1:1:1:1 | — |
| Cu2-6a | AA2-1 | AA2-131 | AA1-1 | 1:1:1:1 | — |
| Cu2-7a | AA2-1 | AA2-133 | AA1-1 | 1:1:1:1 | — |
| Cu2-8a | AA2-1 | AA2-148 | AA1-1 | 1:1:1:1 | — |
| Cu2-9a | AA2-1 | AA2-193 | AA1-1 | 1:1:1:1 | — |
| Cu2-10a | AA2-1 | AA2-196 | AA1-1 | 1:1:1:1 | — |
| Cu2-11a | AA2-1 | AA2-214 | — | 1:1:0:1 | — |
| Cu2-12a | AA2-1 | AA2-230 | — | 1:1:0:1 | — |
| Cu2-23a | AA2-10 | — | AA1-1 | 2:0:2:0 | — |
| Cu2-24a | AA2-1 | AA2-44 | AA1-3 | 1:1:1:1 | — |
| Cu2-25a | AA2-1 | AA2-44 | AA1-16 | 1:1:1:1 | — |
| Cu2-26a | AA2-1 | AA2-44 | AA1-22 | 1:1:1:1 | — |
| Cu2-27a | AA2-1 | AA2-44 | AA1-23 | 1:1:1:1 | — |
| Cu2-28a | AA2-1 | AA2-44 | AA1-27 | 1:1:1:1 | — |

TABLE 4

| Copper complex | Ligand Compound (1) | Monodentate ligand (2) | Molar ratio among (1):(2):Cu(II) | Counter ions |
|---|---|---|---|---|
| Cu3-1a | A3-1 | AA1-1 | 1:2:1 | — |
| Cu3-2a | A3-2 | AA1-1 | 1:2:1 | — |
| Cu3-3a | A3-6 | AA1-1 | 1:2:1 | — |
| Cu3-4a | A3-16 | AA1-1 | 1:2:1 | — |
| Cu3-5a | A3-20 | AA1-1 | 1:2:1 | — |
| Cu3-6a | A3-23 | AA1-1 | 1:2:1 | — |
| Cu3-7a | A3-24 | AA1-1 | 1:2:1 | — |
| Cu3-8a | A3-25 | AA1-1 | 1:1:1 | CuCl$_3$ |
| Cu3-9a | A3-28 | AA1-1 | 1:2:1 | — |
| Cu3-10a | A3-43 | AA1-1 | 1:2:1 | — |
| Cu3-11a | A3-44 | AA1-1 | 1:2:1 | — |
| Cu3-12a | A3-45 | AA1-1 | 1:2:1 | — |
| Cu3-13a | A3-46 | AA1-1 | 1:2:1 | — |
| Cu3-14a | A3-50 | AA1-1 | 1:2:1 | — |
| Cu3-15a | A3-52 | AA1-1 | 1:2:1 | — |
| Cu3-16a | A3-54 | AA1-1 | 1:2:1 | — |
| Cu3-17a | A3-56 | AA1-1 | 1:2:1 | — |
| Cu3-18a | A3-58 | AA1-1 | 1:2:1 | — |
| Cu3-19a | A3-59 | AA1-1 | 1:2:1 | — |
| Cu3-20a | A3-60 | AA1-1 | 1:2:1 | — |
| Cu3-21a | A3-69 | AA1-1 | 1:2:1 | — |
| Cu3-22a | A3-73 | AA1-1 | 1:2:1 | — |
| Cu3-23a | A3-96 | AA1-1 | 1:2:1 | — |
| Cu3-24a | A3-97 | AA1-1 | 1:2:1 | — |
| Cu3-25a | A3-98 | AA1-1 | 1:2:1 | — |
| Cu3-26a | A3-99 | AA1-1 | 1:2:1 | — |
| Cu3-27a | A3-100 | AA1-1 | 1:2:1 | — |
| Cu3-28a | A3-103 | AA1-1 | 1:2:1 | — |
| Cu3-29a | A3-105 | AA1-1 | 1:2:1 | — |
| Cu3-30a | A3-106 | AA1-1 | 1:2:1 | — |
| Cu3-31a | A3-113 | AA1-1 | 1:2:1 | — |
| Cu3-32a | A3-125 | AA1-1 | 1:2:1 | — |
| Cu3-33a | A3-127 | AA1-1 | 1:2:1 | — |
| Cu3-34a | A3-131 | AA1-1 | 1:2:1 | — |
| Cu3-35a | A3-135 | AA1-1 | 1:2:1 | — |
| Cu3-36a | A3-140 | AA1-1 | 1:2:1 | — |
| Cu3-37a | A1-141 | AA1-1 | 1:1:1 | — |
| Cu3-38a | A3-2 | AA1-23 | 1:2:1 | — |
| Cu3-39a | A3-24 | AA1-23 | 1:2:1 | — |
| Cu3-40a | A3-43 | AA1-23 | 1:2:1 | — |
| Cu3-41a | A3-24 | AA1-2 | 1:2:1 | — |
| Cu3-42a | A3-43 | AA1-2 | 1:2:1 | — |
| Cu3-43a | A3-24 | AA1-31 | 1:2:1 | — |
| Cu3-44a | A3-43 | AA1-31 | 1:2:1 | — |
| Cu3-45a | A3-24 | AA1-34 | 1:2:1 | — |
| Cu3-46a | A3-43 | AA1-34 | 1:2:1 | — |
| Cu3-47a | A3-24 | AA1-35 | 1:2:1 | — |
| Cu3-48a | A3-43 | AA1-35 | 1:2:1 | — |
| Cu3-49a | A3-24 | AA1-36 | 1:2:1 | — |
| Cu3-50a | A3-43 | AA1-36 | 1:2:1 | — |
| Cu3-51a | A3-24 | AA1-39 | 1:2:1 | — |
| Cu3-52a | A3-43 | AA1-39 | 1:2:1 | — |
| Cu3-53a | A3-59 | AA1-51 | 1:2:1 | — |
| Cu3-54a | A3-59 | AA1-55 | 1:2:1 | — |
| Cu3-55a | A3-2 | AA1-22 | 1:2:1 | — |
| Cu3-56a | A3-2 | AA1-26 | 1:2:1 | — |
| Cu3-57a | A3-24 | AA1-16 | 1:2:1 | — |
| Cu3-58a | A3-43 | AA1-16 | 1:2:1 | — |
| Cu3-59a | A3-135 | AA1-16 | 1:2:1 | — |
| Cu3-60a | A3-24 | AA1-22 | 1:2:1 | — |
| Cu3-61a | A3-43 | AA1-22 | 1:2:1 | — |
| Cu3-62a | A3-135 | AA1-22 | 1:2:1 | — |
| Cu3-63a | A3-135 | AA1-23 | 1:2:1 | — |
| Cu3-64a | A3-24 | AA1-24 | 1:2:1 | — |
| Cu3-65a | A3-43 | AA1-24 | 1:2:1 | — |
| Cu3-66a | A3-135 | AA1-24 | 1:2:1 | — |
| Cu3-67a | A3-24 | AA1-26 | 1:2:1 | — |
| Cu3-68a | A3-43 | AA1-26 | 1:2:1 | — |
| Cu3-69a | A3-135 | AA1-26 | 1:2:1 | — |

TABLE 5

| Copper complex | Ligand Compound (1) | Compound (2) | Molar ratio among (1):(2):Cu(II) | Counter ions |
|---|---|---|---|---|
| Cu4-1a | A3-1 | AA2-214 | 1:1:1 | — |
| Cu4-2a | A3-2 | AA2-214 | 1:1:1 | — |
| Cu4-3a | A3-6 | AA2-214 | 1:1:1 | — |
| Cu4-4a | A3-16 | AA2-214 | 1:1:1 | — |
| Cu4-5a | A3-20 | AA2-214 | 1:1:1 | — |
| Cu4-6a | A3-23 | AA2-214 | 1:1:1 | — |
| Cu4-7a | A3-24 | AA2-214 | 1:1:1 | — |
| Cu4-8a | A3-25 | AA2-214 | 1:1:1 | — |
| Cu4-9a | A3-28 | AA2-214 | 1:1:1 | — |
| Cu4-10a | A3-43 | AA2-214 | 1:1:1 | — |
| Cu4-11a | A3-44 | AA2-214 | 1:1:1 | — |
| Cu4-12a | A3-45 | AA2-214 | 1:1:1 | — |
| Cu4-13a | A3-46 | AA2-214 | 1:1:1 | — |
| Cu4-14a | A3-50 | AA2-214 | 1:1:1 | — |
| Cu4-15a | A3-52 | AA2-214 | 1:1:1 | — |
| Cu4-16a | A3-54 | AA2-214 | 1:1:1 | — |
| Cu4-17a | A3-56 | AA2-214 | 1:1:1 | — |
| Cu4-18a | A3-58 | AA2-214 | 1:1:1 | — |
| Cu4-19a | A3-25 | AA2-215 | 1:1:1 | — |
| Cu4-20a | A3-43 | AA2-215 | 1:1:1 | — |
| Cu4-21a | A3-135 | AA2-215 | 1:1:1 | — |
| Cu4-22a | A3-25 | AA2-225 | 1:1:1 | — |
| Cu4-23a | A3-43 | AA2-225 | 1:1:1 | — |
| Cu4-24a | A3-135 | AA2-225 | 1:1:1 | — |
| Cu4-25a | A3-43 | AA2-230 | 1:1:1 | — |
| Cu4-26a | A3-135 | AA2-230 | 1:1:1 | — |
| Cu4-27a | A3-43 | AA2-237 | 1:1:1 | — |
| Cu4-28a | A3-135 | AA2-239 | 1:1:1 | — |
| Cu4-29a | A3-59 | AA2-2 | 1:1:1 | — |
| Cu4-30a | A3-69 | AA2-2 | 1:1:1 | — |
| Cu4-31a | A3-96 | AA2-2 | 1:1:1 | — |
| Cu4-32a | A3-59 | AA2-10 | 1:1:1 | — |
| Cu4-33a | A3-69 | AA2-10 | 1:1:1 | — |
| Cu4-34a | A3-96 | AA2-10 | 1:1:1 | — |
| Cu4-35a | A3-98 | AA2-10 | 1:1:1 | — |
| Cu4-36a | A3-59 | AA2-15 | 1:1:1 | — |
| Cu4-37a | A3-69 | AA2-15 | 1:1:1 | — |
| Cu4-38a | A3-96 | AA2-15 | 1:1:1 | — |
| Cu4-39a | A3-59 | AA2-22 | 1:1:1 | — |
| Cu4-40a | A3-69 | AA2-22 | 1:1:1 | — |
| Cu4-41a | A3-96 | AA2-22 | 1:1:1 | — |
| Cu4-42a | A3-59 | AA2-23 | 1:1:1 | — |
| Cu4-43a | A3-69 | AA2-23 | 1:1:1 | — |
| Cu4-44a | A3-96 | AA2-23 | 1:1:1 | — |
| Cu4-45a | A3-59 | AA2-32 | 1:1:1 | — |
| Cu4-46a | A3-60 | AA2-32 | 1:1:1 | — |
| Cu4-47a | A3-69 | AA2-32 | 1:1:1 | — |
| Cu4-48a | A3-73 | AA2-32 | 1:1:1 | — |
| Cu4-49a | A3-96 | AA2-32 | 1:1:1 | — |
| Cu4-50a | A3-97 | AA2-32 | 1:1:1 | — |
| Cu4-51a | A3-98 | AA2-32 | 1:1:1 | — |
| Cu4-52a | A3-103 | AA2-32 | 1:1:1 | — |
| Cu4-53a | A3-105 | AA2-32 | 1:1:1 | — |
| Cu4-54a | A3-106 | AA2-32 | 1:1:1 | — |
| Cu4-55a | A3-59 | AA2-36 | 1:1:1 | — |
| Cu4-56a | A3-69 | AA2-36 | 1:1:1 | — |
| Cu4-57a | A3-96 | AA2-36 | 1:1:1 | — |
| Cu4-58a | A3-99 | AA2-67 | 1:1:1 | — |
| Cu4-59a | A3-99 | AA2-76 | 1:1:1 | — |
| Cu4-60a | A3-100 | AA2-67 | 1:1:1 | — |
| Cu4-61a | A3-100 | AA2-76 | 1:1:1 | — |
| Cu4-62a | A3-59 | AA2-26 | 1:1:1 | — |
| Cu4-63a | A3-59 | AA2-28 | 1:1:1 | — |
| Cu4-64a | A3-74 | AA2-22 | 1:1:1 | — |
| Cu4-65a | A3-75 | AA2-22 | 1:1:1 | — |
| Cu4-66a | A3-81 | AA2-22 | 1:1:1 | — |

TABLE 6

| Copper complex | Ligand Compound (1) | Monodentate ligand (2) | Molar ratio among (1):(2):Cu(II) | Counter ions |
|---|---|---|---|---|
| Cu5-1a | A4-1 | AA1-1 | 1:1:1 | Cl |
| Cu5-2a | A4-2 | AA1-1 | 1:1:1 | Cl |
| Cu5-3a | A4-6 | AA1-1 | 1:1:1 | Cl |
| Cu5-4a | A4-7 | AA1-1 | 1:1:1 | Cl |
| Cu5-5a | A4-8 | AA1-1 | 1:1:1 | Cl |
| Cu5-6a | A4-9 | AA1-1 | 1:1:1 | Cl |
| Cu5-7a | A4-10 | AA1-1 | 1:1:1 | Cl |
| Cu5-8a | A4-13 | AA1-1 | 1:1:1 | Cl |
| Cu5-9a | A4-29 | AA1-1 | 1:1:1 | Cl |
| Cu5-10a | A4-34 | AA1-1 | 1:1:1 | Cl |
| Cu5-11a | A4-36 | AA1-1 | 1:1:1 | Cl |
| Cu5-12a | A4-37 | AA1-1 | 1:1:1 | Cl |
| Cu5-13a | A4-38 | AA1-1 | 1:1:1 | Cl |
| Cu5-14a | A4-39 | AA1-1 | 1:1:1 | Cl |
| Cu5-15a | A4-41 | AA1-1 | 1:1:1 | Cl |
| Cu5-16a | A4-47 | AA1-1 | 1:1:1 | Cl |
| Cu5-17a | A4-52 | AA1-1 | 1:1:1 | Cl |
| Cu5-18a | A4-61 | AA1-1 | 1:1:1 | Cl |
| Cu5-19a | A4-62 | AA1-1 | 1:1:1 | Cl |
| Cu5-20a | A4-63 | AA1-1 | 1:1:1 | Cl |
| Cu5-21a | A4-64 | AA1-1 | 1:1:1 | Cl |
| Cu5-22a | A4-65 | AA1-1 | 1:1:1 | Cl |
| Cu5-23a | A4-70 | AA1-1 | 1:1:1 | Cl |
| Cu5-24a | A4-74 | AA1-1 | 1:1:1 | Cl |
| Cu5-25a | A4-77 | AA1-1 | 1:1:1 | Cl |
| Cu5-26a | A4-80 | AA1-1 | 1:1:1 | Cl |
| Cu5-27a | A4-81 | AA1-1 | 1:1:1 | Cl |
| Cu5-28a | A4-89 | AA1-1 | 1:1:1 | Cl |
| Cu5-29a | A4-91 | AA1-1 | 1:1:1 | Cl |
| Cu5-30a | A4-92 | AA1-1 | 1:1:1 | Cl |
| Cu5-31a | A4-93 | AA1-1 | 1:1:1 | Cl |
| Cu5-32a | A4-94 | AA1-1 | 1:1:1 | Cl |
| Cu5-33a | A4-95 | AA1-1 | 1:1:1 | Cl |
| Cu5-34a | A4-97 | AA1-1 | 1:1:1 | Cl |
| Cu5-35a | A4-100 | AA1-1 | 1:1:1 | Cl |
| Cu5-36a | A4-103 | AA1-1 | 1:1:1 | Cl |
| Cu5-37a | A4-121 | AA1-1 | 1:1:1 | — |
| Cu5-38a | A4-125 | AA1-1 | 1:1:1 | — |
| Cu5-39a | A4-137 | AA1-1 | 1:1:1 | — |
| Cu5-40a | A4-140 | AA1-1 | 1:1:1 | — |
| Cu5-41a | A4-143 | AA1-1 | 1:1:1 | — |
| Cu5-42a | A4-152 | AA1-1 | 1:1:1 | Cl |
| Cu5-43a | A4-168 | AA1-1 | 1:1:1 | Cl |
| Cu5-44a | A4-173 | AA1-1 | 1:1:1 | Cl |
| Cu5-45a | A4-1 | AA1-2 | 1:1:1 | Br |
| Cu5-46a | A4-1 | AA1-41 | 1:1:1 | $SO_4$ |
| Cu5-47a | A4-1 | AA1-23 | 1:1:1 | $OCOCH_3$ |
| Cu5-48a | A4-63 | AA1-23 | 1:1:1 | $OCOCH_3$ |
| Cu5-49a | A4-1 | AA1-28 | 1:1:1 | $NO_3$ |
| Cu5-50a | A4-61 | AA1-41 | 1:1:1 | $SO_4$ |
| Cu5-51a | A4-62 | AA1-41 | 1:1:1 | $SO_4$ |
| Cu5-52a | A4-63 | AA1-41 | 1:1:1 | $SO_4$ |
| Cu5-53a | A4-1 | AA1-35 | 1:1:1 | $(SO_4)_{0.5}$ |
| Cu5-54a | A4-61 | AA1-35 | 1:1:1 | $(SO_4)_{0.5}$ |
| Cu5-55a | A4-62 | AA1-35 | 1:1:1 | $(SO_4)_{0.5}$ |
| Cu5-56a | A4-63 | AA1-35 | 1:1:1 | $(SO_4)_{0.5}$ |
| Cu5-57a | A4-1 | AA1-36 | 1:1:1 | $(SO_4)_{0.5}$ |
| Cu5-58a | A4-61 | AA1-36 | 1:1:1 | $(SO_4)_{0.5}$ |
| Cu5-59a | A4-62 | AA1-36 | 1:1:1 | $(SO_4)_{0.5}$ |
| Cu5-60a | A4-63 | AA1-36 | 1:1:1 | $(SO_4)_{0.5}$ |
| Cu5-61a | A4-1 | AA1-9 | 1:1:1 | $(SO_4)_{0.5}$ |
| Cu5-62a | A4-61 | AA1-11 | 1:1:1 | $(SO_4)_{0.5}$ |
| Cu5-63a | A4-62 | AA1-22 | 1:1:1 | $(SO_4)_{0.5}$ |
| Cu5-64a | A4-63 | AA1-26 | 1:1:1 | $(SO_4)_{0.5}$ |
| Cu5-65a | A4-1 | AA1-28 | 1:1:1 | $(SO_4)_{0.5}$ |
| Cu5-66a | A4-1 | AA1-32 | 1:1:1 | $(SO_4)_{0.5}$ |
| Cu5-67a | A4-1 | AA1-33 | 1:1:1 | $(SO_4)_{0.5}$ |
| Cu5-68a | A4-1 | AA1-34 | 1:1:1 | $(SO_4)_{0.5}$ |
| Cu5-69a | A4-1 | AA1-39 | 1:1:1 | $(SO_4)_{0.5}$ |
| Cu5-70a | A4-177 | — | 1:0:1 | — |
| Cu5-71a | A4-180 | AA1-1 | 1:1:1 | — |
| Cu5-72a | A4-1 | AA1-1 | 1:1:1 | $BF_4$ |
| Cu5-73a | A4-61 | AA1-1 | 1:1:1 | $BF_4$ |
| Cu5-74a | A4-62 | AA1-1 | 1:1:1 | $BF_4$ |
| Cu5-75a | A4-63 | AA1-1 | 1:1:1 | $BF_4$ |
| Cu5-76a | A4-1 | AA1-1 | 1:1:1 | $BPh_4$ |
| Cu5-77a | A4-61 | AA1-1 | 1:1:1 | $BPh_4$ |
| Cu5-78a | A4-62 | AA1-1 | 1:1:1 | $BPh_4$ |
| Cu5-79a | A4-63 | AA1-1 | 1:1:1 | $BPh_4$ |
| Cu5-80a | A4-1 | AA1-1 | 1:1:1 | $B(C_6F_5)_4$ |
| Cu5-81a | A4-61 | AA1-1 | 1:1:1 | $B(C_6F_5)_4$ |
| Cu5-82a | A4-62 | AA1-1 | 1:1:1 | $B(C_6F_5)_4$ |
| Cu5-83a | A4-63 | AA1-1 | 1:1:1 | $B(C_6F_5)_4$ |
| Cu5-84a | A4-1 | AA1-1 | 1:1:1 | $PF_6$ |
| Cu5-85a | A4-61 | AA1-1 | 1:1:1 | $PF_6$ |
| Cu5-86a | A4-62 | AA1-1 | 1:1:1 | $PF_6$ |
| Cu5-87a | A4-63 | AA1-1 | 1:1:1 | $PF_6$ |
| Cu5-88a | A4-1 | AA1-1 | 1:1:1 | $B(CN)_4$ |
| Cu5-89a | A4-61 | AA1-1 | 1:1:1 | $B(CN)_4$ |
| Cu5-90a | A4-62 | AA1-1 | 1:1:1 | $B(CN)_4$ |
| Cu5-91a | A4-63 | AA1-1 | 1:1:1 | $B(CN)_4$ |
| Cu5-92a | A4-1 | AA1-1 | 1:1:1 | $N(SO_2CF_3)_2$ |
| Cu5-93a | A4-61 | AA1-1 | 1:1:1 | $N(SO_2CF_3)_2$ |
| Cu5-94a | A4-62 | AA1-1 | 1:1:1 | $N(SO_2CF_3)_2$ |
| Cu5-95a | A4-63 | AA1-1 | 1:1:1 | $N(SO_2CF_3)_2$ |
| Cu5-96a | A4-61 | AA1-2 | 1:1:1 | Br |
| Cu5-97a | A4-188 | AA1-1 | 1:1:1 | $B(C_6F_5)_4$ |
| Cu5-98a | A4-63 | AA1-1 | 1:1:1 | $C(SO_2CF_3)_3$ |
| Cu5-99a | A4-63 | AA1-23 | 1:1:1 | $B(C_6F_5)_4$ |
| Cu5-100a | A4-63 | AA1-2 | 1:1:1 | $B(C_6F_5)_4$ |
| Cu5-101a | A4-1 | AA1-11 | 1:1:1 | $B(C_6F_5)_4$ |
| Cu5-102a | A4-1 | AA1-23 | 1:1:1 | $B(C_6F_5)_4$ |
| Cu5-103a | A4-1 | AA1-24 | 1:1:1 | $B(C_6F_5)_4$ |
| Cu5-104a | A4-63 | AA1-41 | 1:1:1 | $[N(SO_2CF_3)_2]_2$ |
| Cu5-105a | A4-65 | AA1-1 | 1:1:1 | $BF_4$ |
| Cu5-106a | A4-90 | AA1-1 | 1:1:1 | Cl |
| Cu5-107a | A4-189 | AA1-1 | 1:1:1 | Cl |
| Cu5-108a | A4-190 | AA1-1 | 1:1:1 | Cl |
| Cu5-109a | A4-191 | AA1-1 | 1:1:1 | Cl |
| Cu5-110a | A4-192 | AA1-1 | 1:1:1 | Cl |
| Cu5-111a | A4-193 | AA1-1 | 1:1:1 | Cl |
| Cu5-112a | A4-194 | AA1-1 | 1:1:1 | Cl |
| Cu5-113a | A4-195 | AA1-1 | 1:1:1 | Cl |
| Cu5-114a | A4-196 | AA1-1 | 1:1:1 | Cl |
| Cu5-115a | A4-63 | AA1-1 | 1:1:1 | $[Cu(dpa)_2]_{0.5}$ |
| Cu5-116a | A4-63 | AA1-41 | 1:1:1 | $Cu(dpa)_2$ |
| Cu5-117a | A4-29 | AA1-1 | 1:1:1 | $BF_4$ |
| Cu5-118a | A4-65 | AA1-1 | 1:1:1 | $B(C_6F_5)_4$ |
| Cu5-119a | A4-65 | AA1-41 | 1:1:1 | $SO_4$ |

$Cu(dpa)_2 =$ 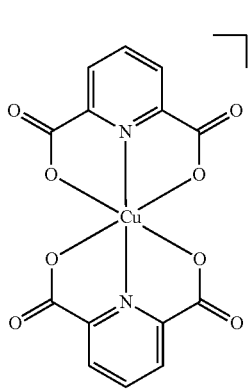

TABLE 7

| Copper complex | Ligand Compound (1) | Molar ratio between (1):Cu(II) | Counter ions |
|---|---|---|---|
| Cu6-1a | A5-2 | 1:1 | (Cl)$_2$ |
| Cu6-2a | A5-6 | 1:1 | (Cl)$_2$ |
| Cu6-3a | A5-7 | 1:1 | (Cl)$_2$ |
| Cu6-4a | A5-8 | 1:1 | Cl |
| Cu6-5a | A5-9 | 1:1 | (Cl)$_2$ |
| Cu6-6a | A5-13 | 1:1 | (Cl)$_2$ |
| Cu6-7a | A5-15 | 1:1 | — |
| Cu6-8a | A5-19 | 1:1 | (Cl)$_2$ |
| Cu6-9a | A5-20 | 1:1 | (Cl)$_2$ |
| Cu6-10a | A5-21 | 1:1 | (Cl)$_2$ |
| Cu6-11a | A5-2 | 1:1 | (OH)$_2$ |
| Cu6-12a | A5-2 | 1:1 | (OCOCH$_3$)$_2$ |
| Cu6-13a | A5-2 | 1:1 | SO$_4$ |
| Cu6-14a | A5-2 | 1:1 | (NO$_3$)$_2$ |
| Cu6-15a | A5-2 | 1:1 | (ClO$_4$)$_2$ |
| Cu6-16a | A5-2 | 1:1 | (Br)$_2$ |
| Cu6-17a | A5-2 | 1:1 | (BF$_4$)$_2$ |
| Cu6-18a | A5-7 | 1:1 | (BF$_4$)$_2$ |
| Cu6-19a | A5-8 | 1:1 | BF$_4$ |
| Cu6-20a | A5-13 | 1:1 | (BF$_4$)$_2$ |
| Cu6-21a | A5-2 | 1:1 | (BPh$_4$)$_2$ |
| Cu6-22a | A5-7 | 1:1 | (BPh$_4$)$_2$ |
| Cu6-23a | A5-8 | 1:1 | BPh$_4$ |
| Cu6-24a | A5-13 | 1:1 | (BPh$_4$)$_2$ |
| Cu6-25a | A5-2 | 1:1 | [B(C$_6$F$_5$)$_4$]$_2$ |
| Cu6-26a | A5-7 | 1:1 | [B(C$_6$F$_5$)$_4$]$_2$ |
| Cu6-27a | A5-8 | 1:1 | B(C$_6$F$_5$)$_4$ |
| Cu6-28a | A5-13 | 1:1 | [B(C$_6$F$_5$)$_4$]$_2$ |
| Cu6-29a | A5-2 | 1:1 | (PF$_6$)$_2$ |
| Cu6-30a | A5-7 | 1:1 | (PF$_6$)$_2$ |
| Cu6-31a | A5-8 | 1:1 | PF$_6$ |
| Cu6-32a | A5-13 | 1:1 | (PF$_6$)$_2$ |
| Cu6-33a | A5-2 | 1:1 | [B(CN)$_4$]$_2$ |
| Cu6-34a | A5-7 | 1:1 | [B(CN)$_4$]$_2$ |
| Cu6-35a | A5-8 | 1:1 | B(CN)$_4$ |
| Cu6-36a | A5-13 | 1:1 | [B(CN)$_4$]$_2$ |
| Cu6-37a | A5-22 | 1:1 | (Cl)$_2$ |
| Cu6-38a | A5-23 | 1:1 | (Cl)$_2$ |
| Cu6-39a | A5-24 | 1:1 | (Cl)$_2$ |
| Cu6-40a | A5-25 | 1:1 | (Cl)$_2$ |
| Cu6-41a | A5-26 | 1:1 | (Cl)$_2$ |
| Cu6-42a | A5-27 | 1:1 | (Cl)$_2$ |
| Cu6-43a | A5-28 | 1:1 | (Cl)$_2$ |
| Cu6-44a | A5-29 | 1:1 | (Cl)$_2$ |
| Cu6-45a | A5-30 | 1:1 | (Cl)$_2$ |
| Cu6-46a | A5-31 | 1:1 | (Cl)$_2$ |

The content of the copper complex (also the content of the copper complex formed by reacting the compound (A) and the copper component) in the composition of the present invention is preferably in a range of 1% by mass to 60% by mass, more preferably in a range of 5% by mass to 40% by mass, and still more preferably in a range of 5% by mass to 20% by mass of the composition (also including a solvent) of the present invention.

The content of the copper complex in the composition of the present invention is preferably 15% by mass or more, more preferably 20% by mass or more, and still more 25% by mass or more of the total solid content of the composition of the present invention. In addition, the content of the copper complex in the composition of the present invention is preferably in a range of 15% by mass to 60% by mass, more preferably in a range of 20% by mass to 50% by mass, and still more preferably in a range of 25% by mass to 45% by mass.

The content of copper complexes other than the above-described copper complex (near infrared radiation-absorbing substances) in the composition of the present invention is preferably in a range of 0% by mass to 20% by mass, more preferably in a range of 0% by mass to 10% by mass, and still more preferably in a range of 0% by mass to 5% by mass of the composition of the present invention.

In the near infrared radiation-absorbing substances in the composition of the present invention, the proportion of the compound formed by reacting the compound (A) and the copper component is preferably 80% by mass or more, more preferably 90% by mass or more, and still more 95% by mass or more.

The content of copper in the composition of the present invention is preferably 0.1% by mass or more, more preferably 1% by mass or more, and still more preferably 5% by mass or more of the total solid content of the composition. The upper limit thereof is preferably 30% by mass or less, more preferably 20% by mass or less, and still more preferably 15% by mass or less.

The total solid content of the near infrared radiation-absorbing composition of the present invention is preferably 1% by mass or more and more preferably 10% by mass of the composition. In addition, the total solid content of the near infrared radiation-absorbing composition of the present invention is preferably in a range of 1% by mass to 50% by mass, more preferably in a range of 1% by mass to 40% by mass, and still more preferably in a range of 10% by mass to 35% by mass of the composition.

In the composition of the present invention, the above-described copper complex that is used in the present invention may be singly used or two or more copper complexes may be jointly used. In a case in which two or more copper complexes that are used in the present invention are used, the total amount thereof is preferably in the above-described range.

The near infrared radiation-absorbing composition of the present invention needs to include the above-described copper complex, and, if necessary, other near infrared radiation-absorbing compounds, a solvent, a curable compound, a binder polymer, a surfactant, a polymerization initiator, and other components may be formulated thereinto.

<<Other Near Infrared Radiation-Absorbing Compounds>>

As other near infrared radiation-absorbing compounds that can be used in the present invention, it is possible to use copper compounds obtained by reacting a low-molecular-weight (for example, a molecular weight of 1,000 or less) compound including a coordination site and a copper component or copper compounds obtained by reacting a polymer including a coordination site and a copper component. Examples of the coordination site include coordination sites that are coordinated with anions such as acid groups or salts of acid groups and coordinating atoms that form bonds using unshared electron pairs.

In a case in which the composition of the present invention includes other near infrared radiation-absorbing compounds, the content of the other near infrared radiation-absorbing compounds is preferably 0.01% by mass or more, more preferably 1% by mass or more, and still more preferably 5% by mass or more of the total solid content of the composition of the present invention. The upper limit value is preferably 60% by mass or less, more preferably 40% by mass or less, and still more preferably 20% by mass or less. Meanwhile, the present invention can also be a composition not including other near infrared radiation-absorbing compounds.

(Low-Molecular-Weight Type)

As the compound obtained by reacting a compound including a coordination site and a copper component which can be used in the present invention, it is possible to use a copper complex represented by Formula (A) below.

$$Cu(L)_{n1} \cdot (X)_{n2} \qquad \text{Formula (A)}$$

In Formula (A), L represents a ligand coordinating copper, X is not present or represents a halogen atom, $H_2O$, $NO_3$, $ClO_4$, $SO_4$, CN, SCN, $BF_4$, $PF_6$, $BPh_4$ (Ph represents a phenyl group), or an alcohol. Each of n1 and n2 independently represents an integer from 1 to 4.

The ligand L has a substituent including C, N, O, and S as an atom capable of coordinating copper and more preferably has a group having a lone electron pair such as N, O, or S. The number of kinds of the group capable of coordinating copper in the molecule is not limited to one and may be two or more, and the group may or may not be dissociated. A preferred ligand L is identical to the above-described ligand L. In a case in which the group is not dissociated, X is not present.

The copper complex is a copper compound in which copper as a central metal is coordinated with a ligand, and copper is generally divalent copper. For example, the copper complex can be obtained by mixing, and reacting, a compound or a salt thereof which serves as a ligand with a copper component.

The compound or a salt thereof which serves as a ligand is not particularly limited, and preferred examples thereof include organic acid compounds (for example, sulfonic acid compounds, carboxylic acid compounds, and phosphoric acid compounds), salts thereof, and the like.

Examples of the compound or a salt thereof which serves as a ligand include compounds and salts represented by General Formula (i) below.

$$R^1(X^1)_n \qquad \text{General Formula (i)}$$

(In General Formula (i), $R^1$ represents an n-valent organic group, $X^1$ represents an acid group, and n represents an integer of 1 to 6.)

In General Formula (i), the n-valent organic group is preferably a hydrocarbon group or an oxyalkylene group and more preferably an aliphatic hydrocarbon group or an aromatic hydrocarbon group. The hydrocarbon group may have a substituent, and examples of the substituent include halogen atoms (preferably fluorine atom), a (meth)acryloyl group, and groups having an unsaturated double bond.

In a case in which the hydrocarbon group is monovalent, an alkyl group or an aryl group is preferred, and an aryl group is more preferred. In a case in which the hydrocarbon group is divalent, an alkylene group, an arylene group, or an oxyalkylene group is preferred, and an arylene group is more preferred. In addition, in a case in which the hydrocarbon group is trivalent, a group corresponding to the above-described hydrocarbon group is preferred.

The number of carbon atoms in the alkyl group and the alkylene group is preferably in a range of 1 to 20 and more preferably in a range of 1 to 10.

The number of carbon atoms in the aryl group and the arylene group is preferably in a range of 6 to 18 and more preferably in a range of 6 to 12.

In General Formula (i), examples of $X^1$ include acid groups including a phosphorous atom (a phosphoric acid diester group, a phosphonic acid monoester group, a phosphinic acid group, and the like), a sulfo group, a carboxyl group, a hydroxyl group, and the like. The number of the kinds of $X^1$ may be one or more and is preferably two or more.

The molecular weight of the compound or a salt thereof which serves as a ligand (the compound including an acid group or a salt thereof) is preferably 1,000 or less, more preferably in a range of 70 to 1,000, and further more preferably in a range of 70 to 500.

As an example of a copper compound obtained by reacting a low-molecular-weight compound including an acid group or a salt thereof and a copper component, it is also possible to use a copper compound formed by reacting a compound having two monoanionic coordination sites or a compound having a salt thereof with a copper component. Here, the monoanionic coordination site represents a site at which, regarding the bonding to a copper atom, a compound bonds to the copper atom through a functional group having one negative charge. Examples of a structure having the above-described monoanionic coordination site include structures described in the section of $X^1$ in General Formula (i).

The structure having the monoanionic coordination site forms a copper complex by, for example, bonding to a copper atom as illustrated below. For example, a carboxyl group-copper complex, a phosphate diester group-copper complex, a phosphate monoester group-copper complex, a phosphinate group-copper complex, a sulfo group-copper complex, and a hydroxyl group-copper complex are formed. In addition, the structure having the monoanionic coordination site may also be at least one structure selected from Group (A) above.

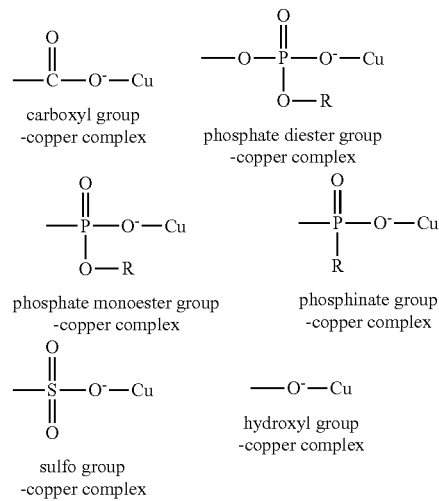

Examples of the compound having two monoanionic coordination sites include compounds represented by General Formula (10) below.

$$X^1\text{-}L^1\text{-}X^2 \qquad \text{General Formula (10)}$$

(In General Formula (10), each of $X^1$ and $X^2$ independently represents the monoanionic coordination site, and $L^1$ represents an alkylene group, an alkenylene group, an arylene group, a heterocyclic group, —O—, —S—, —$NR^{N1}$—, —CO—, —CS—, —$SO_2$—, or a divalent linking group made of a combination thereof. Here, $R^{N1}$ represents a hydrogen atom, an alkyl group, an aryl group, or an aralkyl group.)

In General Formula (10), $L^1$ represents an alkylene group, an alkenylene group, an arylene group, a heterocyclic group, —O—, —S—, —$NR^{N1}$—, —CO—, —CS—, —$SO_2$—, or a divalent linking group made of a combination thereof. Here, $NR^{N1}$ represents a hydrogen atom, an alkyl group, an aryl group, or an aralkyl group.

Examples of the alkylene group include substituted or unsubstituted linear or branched alkylene groups having 1 to 20 carbon atoms, substituted or unsubstituted cyclic alkylene groups having 3 to 20 carbon atoms, and the like.

The alkenylene group is preferably a substituted or unsubstituted alkenylene group having 2 to 10 carbon atoms and more preferably a substituted or unsubstituted alkenylene group having 2 to 8 carbon atoms.

The arylene group is preferably a substituted or unsubstituted arylene group having 6 to 18 carbon atoms and more preferably a substituted or unsubstituted arylene group having 6 to 14 carbon atoms. In addition, the aryl group is a monocycle or a fused ring, preferably a monocycle or a fused ring having 2 to 8 fusions, and more preferably a monocycle or a fused ring having 2 to 4 fusions. Specific examples thereof include a phenylene group, a naphthylene group, and the like.

Examples of the heterocyclic group include groups having a hetero atom in an alicyclic group and aromatic heterocyclic groups. The heterocyclic group is preferably a 5-membered ring or a 6-membered ring. In addition, the heterocyclic group is a monocycle or a fused ring, preferably a monocycle or a fused ring having 2 to 8 fusions, and more preferably a monocycle or a fused ring having 2 to 4 fusions. Specific examples thereof include monocycles including at least one of nitrogen, oxygen, and sulfur atoms, heteroarylene groups derived from a polycyclic aromatic ring, and the like. Examples of the heterocycle include an oxolane ring, an oxane ring, a thiolane ring, an oxyzole ring, a thiophene ring, a thianthrene ring, a furan ring, a pyran ring, an isobenzofuran ring, a chromene ring, a xanthene ring, a phenoxazine ring, a pyrrole ring, a pyrazole ring, an isothiazole ring, an isoxazole ring, a pyrazine ring, a pyrimidine ring, a pyridazine ring, an indolizine ring, an isoindolizine ring, an indole ring, an indazole ring, a purine ring, a quinolizine ring, an isoquinoline ring, a phthalazine ring, a naphthyridine ring, a quinazoline ring, a cinnoline ring, a pteridine ring, a carbazole ring, a carboline ring, a phenanthrene ring, an acridine ring, a perimidine ring, a phenanthroline ring, a phthalazine ring, a phenarsazine ring, a furazan ring, and the like.

In $-NR^{N1}-$, $R^{N1}$ represents a hydrogen atom, an alkyl group, an aryl group, or an aralkyl group.

The alkyl group in $R^{N1}$ may have any one of a liner shape, a branched shape, and a cyclic shape. The linear or branched alkyl group is preferably a substituted or unsubstituted alkyl group having 1 to 20 carbon atoms and more preferably a substituted or unsubstituted alkyl group having 1 to 12 carbon atoms. The cyclic alkyl group may be any one of a monocycle and a polycycle. The cyclic alkyl group is preferably a substituted or unsubstituted cycloalkyl group having 3 to 20 carbon atoms and more preferably a substituted or unsubstituted cycloalkyl group having 4 to 14 carbon atoms.

The aryl group in $R^{N1}$ is preferably a substituted or unsubstituted aryl group having 6 to 18 carbon atoms, more preferably a substituted or unsubstituted aryl group having 6 to 14 carbon atoms, and still more preferably an unsubstituted aryl group having 6 to 14 carbon atoms. Specific examples thereof include a phenyl group, a naphthyl group, and the like.

The aralkyl group in $R^{N1}$ is preferably a substituted or unsubstituted aralkyl group having 7 to 20 carbon atoms and more preferably a substituted or unsubstituted aralkyl group having 7 to 15 carbon atoms.

Examples of a substituent that the above-described groups may have include polymerizable groups (preferably, polymerizable groups having a carbon-carbon double bond), halogen atoms (a fluorine atom, a chlorine atom, a bromine atom, and an iodine atom), an alkyl group, a carboxylic acid ester group, a halogenated alkyl group, an alkoxy group, a methacryloyloxy group, an acryloyloxy group, an ether group, a sulfonyl group, a sulfide group, an amide group, an acyl group, a hydroxy group, a carboxyl group, an aralkyl group, $-Si-(OR^{N22})_3$, and the like.

In addition, the substituent that the above-described groups may have may be a substituent made of a combination of at least one of the above-described substituents and at least one of $-O-$, $-CO-$, $-COO-$, and $-COOR'$. Here, R' is preferably a linear alkyl group having 1 to 10 carbon atoms, a branched alkyl group having 3 to 10 carbon atoms, or a cyclic alkyl group having 3 to 10 carbon atoms.

Examples of the polymerizable group include polymerizable groups having a carbon-carbon double bond (preferably, a vinyl group and a (meth)acryloyloxy group), a (meth)acryloyl group, an epoxy group, an aziridinyl group, and the like.

The alkyl group may have any one of a chain shape, a branched shape, and a cyclic shape. The linear or branched alkyl group is preferably an alkyl group having 1 to 10 carbon atoms, more preferably an alkyl group having 1 to 8 carbon atoms, and more preferably an alkyl group having 1 to 4 carbon atoms. The cyclic alkyl group may be any one of a monocycle and a polycycle. The cyclic alkyl group is preferably a cycloalkyl group having 3 to 20 carbon atoms and more preferably a cycloalkyl group having 4 to 10 carbon atoms.

The halogenated alkyl group is preferably an alkyl group substituted with a fluorine atom. Particularly, the halogenated alkyl group is preferably an alkyl group having two or more fluorine atoms and 1 to 10 carbon atoms and may have any one of a linear shape, a branched shape, and a cyclic shape, but preferably has a linear shape or a branched shape. The number of carbon atoms in the alkyl group substituted with a fluorine atom is more preferably in a range of 1 to 10, still more preferably in a range of 1 to 5, and still more preferably in a range of 1 to 3. In the alkyl group substituted with a fluorine atom, the terminal structure is preferably ($-CF_3$). In the alkyl group substituted with a fluorine atom, the substitution percentage by a fluorine atom is preferably in a range of 50% to 100% and more preferably in a range of 80% to 100%. Here, the substitution percentage by a fluorine atom refers to a percentage (%) of hydrogen atoms substituted with fluorine atoms in the alkyl group substituted with fluorine atoms.

Particularly, the halogenated alkyl group is more preferably a perfluoroalkyl group and still more preferably perfluoroalkyl group having 1 to 10 carbon atoms.

In $-Si-(OR^{N22})_3$, $R^{N22}$ is an alkyl group or a phenyl group having 1 to 3 carbon atoms, and n is an integer of 1 to 3.

Specifically, in a case in which $L^1$ is a group made of a combination of an arylene group and $-O-$ in General Formula (10), the substituent that the arylene group may have is preferably an alkyl group.

Among specific examples of a structure represented by $L^1$ in General Formula (10), the following structure is preferred.

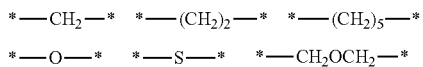

-continued

*—(CH₂)₂—O—(CH₂)₂—*  *—CH₂SCH₂—*

*—(CH₂)₂—S—(CH₂)₂—*  *—CH₂—NH—CH₂—*

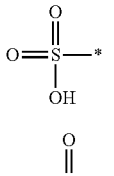

(and additional linker structures including N-substituted methylene groups with cyclohexyl, phenyl, benzyl, tert-butyl substituents; diphenyl ether linkers with ethyleneoxy bridges; polyether chains; and N-(2,4,6-triisopropylphenyl) and N-(4-methylphenyl) substituted bis(methylene)amine groups)

In General Formula (10), $X^1$ and $X^2$ represent the above-described monoanionic coordination sites, and more specific examples thereof include a carboxyl group, a phosphoric acid diester group, a phosphonic acid monoester group, a phosphinic acid group, a sulfo group, a hydroxyl group, and the like.

In General Formula (10), $X^1$ and $X^2$ may have mutually identical monoanionic coordination sites or may have mutually different monoanionic coordination sites.

In General Formula (10), $X^1$ and $X^2$ are structures represented by General Formula (12), (13), or (13A).

General Formula (12)

$$R^1-A^1-\overset{\overset{O}{\|}}{\underset{OH}{P}}-A^2-*$$

General Formula (13)

$$O=\overset{\overset{O}{\|}}{\underset{OH}{S}}-*$$

General Formula (13A)

$$OH-\overset{\overset{O}{\|}}{C}-*$$

(In General Formula (12), $R^1$ represents an alkyl group, an alkenyl group, an aryl group, or an aralkyl group. Each of $A^1$ and $A^2$ independently represents an oxygen atom, a sulfur atom, or a single bond. In General Formulae (12), (13), and (13A), "*" represents a linking portion to $L^1$.)

In General Formula (12), R1 represents an alkyl group, an alkenyl group, an aryl group, or an aralkyl group.

The alkyl group may have any one of a chain shape, a branched shape, and a cyclic shape. The linear or branched alkyl group is preferably a substituted or unsubstituted alkyl group having 1 to 20 carbon atoms, more preferably a substituted or unsubstituted alkyl group having 1 to 15 carbon atoms, and more preferably a substituted or unsubstituted alkyl group having 1 to 6 carbon atoms. The cyclic alkyl group may be any one of a monocycle and a polycycle. The cyclic alkyl group is preferably a substituted or unsubstituted cycloalkyl group having 3 to 20 carbon atoms, more preferably a substituted or unsubstituted cycloalkyl group having 4 to 10 carbon atoms, and particularly preferably a substituted or unsubstituted cycloalkyl group having 4 to 8 carbon atoms.

The alkenyl group is preferably a substituted or unsubstituted alkenyl group having 2 to 10 carbon atoms and more preferably a substituted or unsubstituted alkenyl group having 2 to 8 carbon atoms.

The aryl group is preferably a substituted or unsubstituted aryl group having 6 to 18 carbon atoms and more preferably a substituted or unsubstituted aryl group having 6 to 14 carbon atoms. Specific examples thereof include a phenyl group, a naphthyl group, and the like.

The aralkyl group is preferably a substituted or unsubstituted aralkyl group having 7 to 20 carbon atoms and more preferably a substituted or unsubstituted aralkyl group having 7 to 16 carbon atoms.

A substituent that $R^1$ in General Formula (12) may have is identical to the substituent that $L^1$ in General Formula (10) may have, and an alkyl group, an aryl group, an ether group, $-Si-(OR^{22})_3$, and the like are preferred.

In General Formula (12), each of $A^1$ and $A^2$ independently represents an oxygen atom, a sulfur atom, or a single bond. Particularly, $A^1$ and $A^2$ are preferably single bonds from the viewpoint of further improving the heat resistance of the composition of the present invention.

Among specific examples of a structure represented by $R^1$ in General Formula (12), the following structure is preferred.

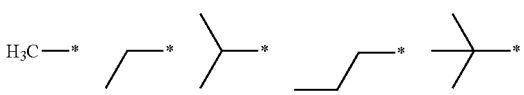

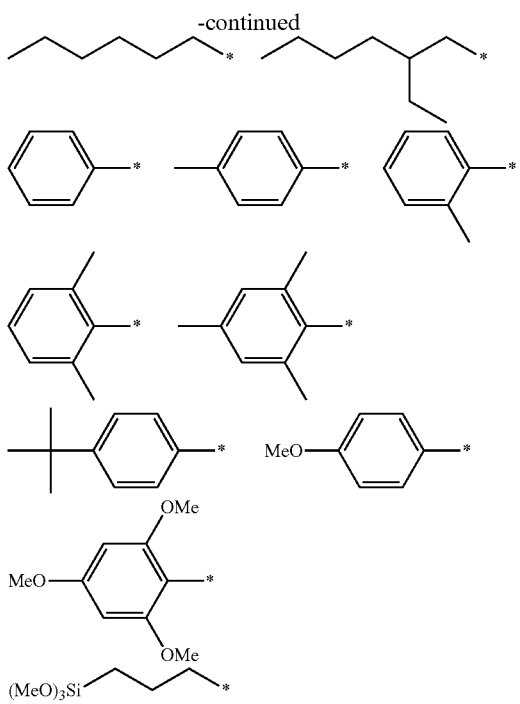

(High-Molecular-Weight Type)

Examples of the copper compound obtained by reacting a polymer including a coordination site and a copper component include polymer-type copper compounds including a polymer having a coordination site that is coordinated with an anion such as an acid group or a salt of the acid group and one or more selected from coordinating atoms that form bonds using unshared electron pairs and copper ions. The copper compound is preferably a polymer-type copper compound including a polymer having an acid group ion portion which is an acid group or a salt of the acid group and copper ions and more preferably a polymer-type copper compound in which an acid group ion portion in a polymer serves as a ligand. Generally, the polymer-type copper compound has a coordination site such as an acid group ion portion in a side chain of a polymer, the coordination site such as an acid group ion site bonds to copper (for example, a coordination bond), and a crosslinking structure is formed between side chains from copper as a starting point. Examples of the polymer-type copper complex include copper complexes of polymers having a carbon-carbon bond in the main chain, copper complexes which have a carbon-carbon bond in the main chain and include a fluorine atom, copper complexes of polymers having an aromatic hydrocarbon group and/or an aromatic heterocyclic group in the main chain (hereinafter, referred to as the aromatic group-containing polymer), and the like.

The copper component is preferably a compound including divalent copper. The content of copper in the copper component is preferably in a range of 2% by mass to 40% by mass and more preferably in a range of 5% by mass to 40% by mass. The number of the kinds of the copper components may be one or more. As the compound including copper, it is possible to use, for example, copper oxide or a copper salt. The copper salt is more preferably divalent copper. The copper salt is particularly preferably copper hydroxide, copper acetate, or copper sulfate.

The acid group is not particularly limited as long as the acid group is capable of reacting with the above-described copper component, but is preferably an acid group that forms a coordinate bond with the copper component. Specific examples thereof include acid groups having an acid dissociation constant (pKa) of 12 or lower, and a sulfonic acid group, a carboxylic acid group, a phosphoric acid group, a phosphonic acid group, a phosphinic acid group, an imidic acid group, and the like are preferred. The number of the kinds of the acid groups may be one or more.

Examples of an atom or an atomic group that constitutes the salt of the acid group that is used in the present invention include metal atoms such as sodium (particularly alkali metal atoms) and atomic groups such as tetrabutyl ammonium. Furthermore, the polymer including the acid group or a salt thereof needs to include the acid group or the salt thereof in at least one of the main chain and the side chain and preferably includes the acid group or the salt thereof at least in the side chain.

The polymer including the acid group or a salt thereof is preferably a polymer including a carboxylic acid group or a salt thereof and/or a sulfonic acid group or a salt thereof and more preferably a polymer including a sulfonic acid group or a salt thereof.

Examples of the coordination site that is coordinated with an anion include those described in the section of the above-described compound (A).

<<<Polymer Including First Acid Group or Salt Thereof>>>

A preferred example of the polymer including the acid group or a salt thereof is a structure in which the main chain has a carbon-carbon bond and preferably includes a constituent unit represented by Formula (A1-1) below.

(A1-1)

(In Formula (A1-1), $R^1$ represents a hydrogen atom or a methyl group, $L^1$ represents a single bond or a divalent linking group, and $M^1$ represents a hydrogen atom or an atom or an atomic group that constitutes a salt with a sulfonic acid group.)

In Formula (A1-1), $R^1$ is preferably a hydrogen atom.

In a case in which $L^1$ represents a divalent linking group in Formula (A1-1), the divalent linking group is not particularly limited, and examples thereof include divalent hydrocarbon groups, a heteroarylene group, —O—, —S—, —CO—, —COO—, —OCO—, —SO$_2$—, —NX— (X represents a hydrogen atom or an alkyl group and is preferably a hydrogen atom), and groups made of a combination thereof.

Examples of the divalent hydrocarbon group include linear, branched, or cyclic alkylene groups and arylene groups. The hydrocarbon group may have a substituent, but is preferably an unsubstituted group.

The number of carbon atoms in the linear alkylene group is preferably in a range of 1 to 30, more preferably in a range of 1 to 15, and still more preferably in a range of 1 to 6. In addition, the number of carbon atoms in the branched alkylene group is preferably in a range of 3 to 30, more preferably in a range of 3 to 15, and still more preferably in a range of 3 to 6.

The cyclic alkylene group may be any one of a monocycle and a polycycle. The number of carbon atoms in the cyclic alkylene group is preferably in a range of 3 to 20, more preferably in a range of 4 to 10, and still more preferably in a range of 6 to 10.

The number of carbon atoms in the arylene group is preferably in a range of 6 to 18, more preferably in a range of 6 to 14, and still more preferably in a range of 6 to 10.

The heteroarylene group is not particularly limited, but is preferably a 5-membered ring or a 6-membered ring. In addition, the heteroarylene group may be a monocycle or a fused ring and is preferably a monocycle or a fused ring having 2 to 8 fusions and more preferably a monocycle or a fused ring having 2 to 4 fusions.

In Formula (A1-1), the atom or the atomic group that constitutes a salt with a sulfonic acid group represented by $M^1$ is identical to the atom or the atomic group that constitutes a salt of the above-described acid group and is preferably a hydrogen atom or an alkali metal atom.

Regarding constituent units other than the constituent unit represented by Formula (A1-1), it is possible to refer to the description of copolymerization components disclosed in Paragraphs "0068" to "0075" of JP2010-106268A ("0112" to "0118" in the specification of the corresponding US2011/0124824A), the content of which is incorporated into the present specification.

Examples of preferred other constituent units include constituent units represented by Formula (A1-2) below.

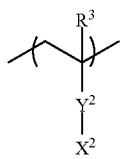

(A1-2)

In Formula (A1-2), $R^3$ represents a hydrogen atom or a methyl group and is preferably a hydrogen atom.

$Y^2$ represents a single bond or a divalent linking group, and the divalent linking group is identical to the above-descried divalent linking group in Formula (A1). Particularly, $Y^2$ is preferably —COO—, —CO—, —NH—, a linear or branched alkylene group, a group made of a combination thereof, or a single bond.

In Formula (A1-2), $X^2$ represents —$PO_3H$, —$PO_3H_2$, —OH, or COOH and is preferably —COOH.

In a case in which the polymer (A1-1) includes other constituent units (preferably the constituent unit represented by Formula (A1-2)), the molar ratio between the constituent unit represented by Formula (A1-1) and the constituent unit represented by Formula (A1-2) is preferably in a range of 95:5 to 20:80 and more preferably in a range of 90:10 to 40:60.

<<<Polymer Including Second Acid Group or Salt Thereof>>

As the copper compound that can be used in the present invention, a polymer-type copper compound obtained by reacting a polymer having an acid group or a salt thereof and having an aromatic hydrocarbon group and/or an aromatic heterocyclic group in the main chain (hereinafter, referred to as the aromatic group-containing polymer) and a copper component may be used. The aromatic group-containing polymer needs to have at least one kind of an aromatic hydrocarbon group and an aromatic heterocyclic group in the main chain and may have two or more kinds thereof. The acid group or the salt thereof and the copper component are identical to those in the above-described copper compound obtained by reacting a polymer including an acid group or a salt thereof and a copper component, and preferred ranges thereof are also identical.

The aromatic hydrocarbon group is preferably, for example, an aryl group. The number of carbon atoms in the aryl group is preferably in a range of 6 to 20, more preferably in a range of 6 to 15, and still more preferably in a range of 6 to 12. Particularly, a phenyl group, a naphthyl group, or a biphenyl group is preferred. The aromatic hydrocarbon group may be a monocycle or a polycycle and is preferably a monocycle.

As the aromatic heterocyclic group, it is possible to use, for example, an aromatic heterocyclic group having 2 to 30 carbon atoms. The aromatic heterocyclic group is preferably a 5-membered ring or a 6-membered ring. In addition, the aromatic heterocyclic group is a monocycle or a fused ring, and examples thereof include monocycles and fused rings having 2 to 8 fusions. Examples of a hetero atom in the heterocycle include nitrogen, oxygen, and sulfur atoms, and nitrogen or oxygen is preferred.

In a case in which the aromatic hydrocarbon group and/or the aromatic heterocyclic group has a substituent T, examples of the substituent T include an alkyl group, polymerizable groups (preferably, polymerizable groups having a carbon-carbon double bond), halogen atoms (a fluorine atom, a chlorine atom, a bromine atom, and an iodine atom), a carboxylic acid ester group, a halogenated alkyl group, an alkoxy group, a methacryloyloxy group, an acryloyloxy group, an ether group, a sulfonyl group, a sulfide group, an amide group, an acyl group, a hydroxy group, a carboxyl group, an aralkyl group, and the like, and an alkyl group (particularly, an alkyl group having 1 to 3 carbon atoms).

Particularly, the aromatic group-containing polymer is preferably at least one polymer selected from polyether sulfone-based polymers, polysulfone-based polymers, polyether ketone-based polymers, polyphenylene ether-based polymers, polyimide-based polymers, polybenzimidazole-based polymers, polyphenylene-based polymers, phenol resin-based polymers, polycarbonate-based polymers, polyamide-based polymers, and polyester-based polymers. Examples of the respective polymers will be described below.

Polyether sulfone-based polymers: Polymers having a main chain structure represented by (—O-Ph-$SO_2$-Ph-) (Ph represents a phenylene group, which shall apply below)

Polysulfone-based polymers: Polymers having a main chain structure represented by (—O-Ph-Ph-O-Ph-$SO_2$-Ph-)

Polyether ketone-based polymers: Polymers having a main chain structure represented by (—O-Ph-O-Ph-C(=O)-Ph-)

Polyphenylene ether-based polymers: Polymers having a main chain structure represented by (-Ph-O—, -Ph-S—)

Polyphenylene-based polymers: Polymers having a main chain structure represented by (-Ph-)

Phenol resin-based polymers: Polymers having a main chain structure represented by (-Ph(OH)—$CH_2$—)

Polycarbonate-based polymers: Polymers having a main chain structure represented by (-Ph-O—C(=O)—O—)

As the polyamide-based polymers, for example, polymers having a main chain structure represented by (-Ph-C(=O)—NH—)

As polyester-based polymers, for example, polymers having a main chain structure represented by (-Ph-C(=O)O—)

Regarding the polyether sulfone-based polymers, the polysulfone-based polymers, and the polyether ketone-based polymers, it is possible to refer to, for example, main chain structures described in Paragraph "0022" of JP2006-310068A and Paragraph "0028" of JP2008-27890A, the contents of which are incorporation into the present specification.

Regarding the polyimide-based polymers, it is possible to refer to main chain structures described in Paragraphs "0047" to "0058" of JP2002-367627A and Paragraphs "0018" and "0019" of JP2004-35891A, the contents of which are incorporation into the present specification.

A preferred example of the aromatic group-containing polymer preferably includes a constituent unit represented by Formula (A1-3) below.

(A1-3)

(In Formula (A1-3), $Ar^1$ represents an aromatic hydrocarbon group and/or an aromatic heterocyclic group, $Y^1$ represents a single bond or a divalent linking group, and $X^1$ represents an acid group or a salt thereof.)

In Formula (A1-3), in a case in which $Ar^1$ represents an aromatic hydrocarbon group, the aromatic hydrocarbon group is identical to the above-described aromatic hydrocarbon group, and a preferred range thereof is also identical. In a case in which $Ar^1$ represents an aromatic heterocyclic group, the aromatic heterocyclic group is identical to the above-described aromatic heterocyclic group, and a preferred range thereof is also identical.

$Ar^1$ may have a substituent other than —$Y^1$—$X^1$ in Formula (A1-3). In a case in which $Ar^1$ has a substituent, the substituent is identical to the above-described substituent T, and a preferred range thereof is also identical.

In Formula (A1-3), $Y^1$ is preferably a single bond. In a case in which $Y^1$ represents a divalent linking group, examples of the divalent linking group include hydrocarbon groups, aromatic heterocyclic groups, —O—, —S—, —SO$_2$—, —CO—, —C(=O)O—, —O—C(=O)—, —NX— (X represents a hydrogen atom or an alkyl group and is preferably a hydrogen atom), —C($R^{Y1}$)($R^{Y2}$)—, and groups made of a combination thereof. Here, each of $R^{Y1}$ and $R^{Y2}$ independently represents a hydrogen atom, a fluorine atom, or an alkyl group.

Examples of the hydrocarbon groups include linear, branched, or cyclic alkylene groups or arylene groups. The number of carbon atoms in the linear alkylene group is preferably in a range of 1 to 20, more preferably in a range of 1 to 10, and still more preferably in a range of 1 to 6. The number of carbon atoms in the branched alkylene group is preferably in a range of 3 to 20, more preferably in a range of 3 to 10, and still more preferably in a range of 3 to 6. The cyclic alkylene group may be any one of a monocycle and a polycycle. The number of carbon atoms in the cyclic alkylene group is preferably in a range of 3 to 20, more preferably in a range of 4 to 10, and still more preferably in a range of 6 to 10. In these linear, branched, or cyclic alkylene groups, a hydrogen atom in the alkylene group may be substituted with a fluorine atom.

The arylene groups are identical to those in a case in which the divalent linking group in Formula (A1-1) is an arylene group.

The aromatic heterocyclic group is not particularly limited, but is preferably a 5-membered ring or a 6-membered ring. In addition, the aromatic heterocyclic group may be a monocycle or a fused ring and is preferably a monocycle or a fused ring having 2 to 8 fusions and more preferably a monocycle or a fused ring having 2 to 4 fusions.

In Formula (A1-3), the acid group or the salt thereof represented by $X^1$ is identical to the above-described acid group or salt thereof, and a preferred range thereof is also identical.

The weight-average molecular weight of the polymer (A1) is preferably 1,000 or more, more preferably in a range of 1,000 to 10,000,000, still more preferably in a range of 3,000 to 1,000,000, and particularly preferably in a range of 4,000 to 400,000.

Specific examples of polymers including the constituent units represented by Formulae (A1-1), (A1-2), and (A1-3) include compounds described below and salts of the following compounds, but are not limited thereto.

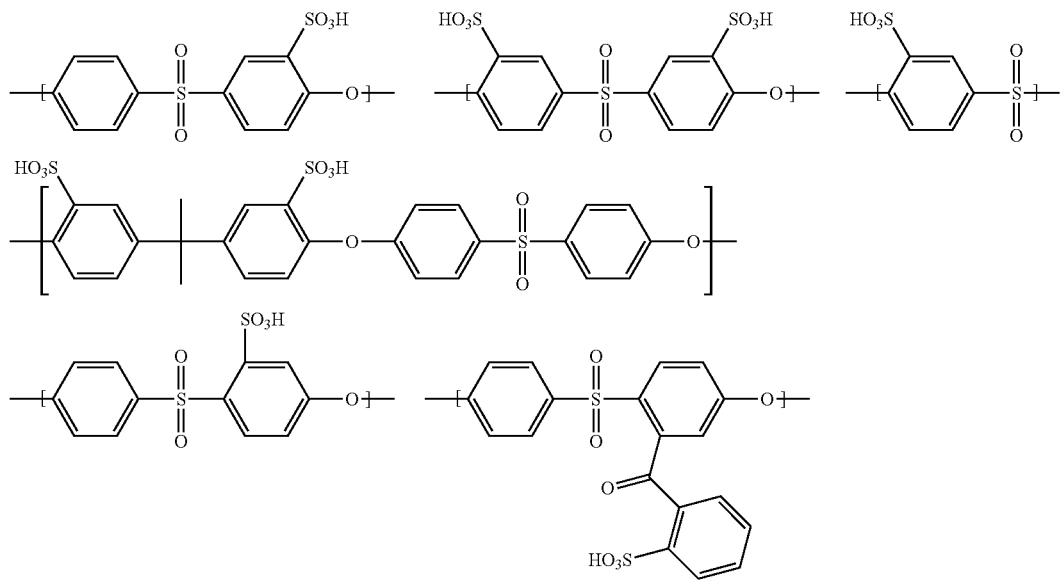

-continued
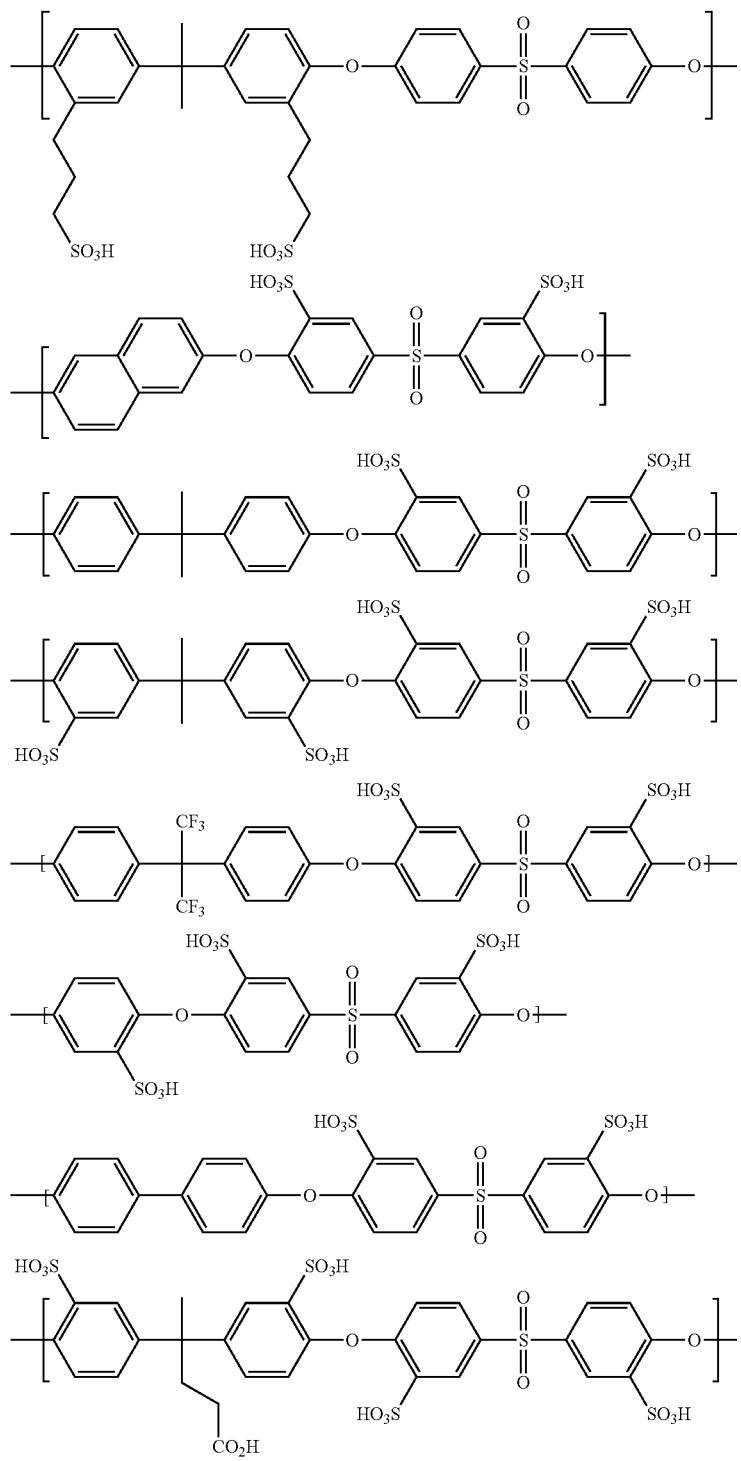
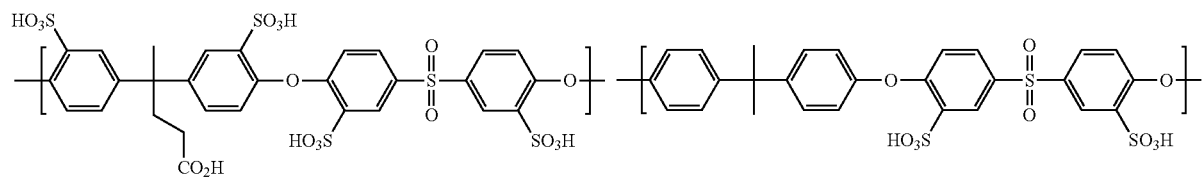

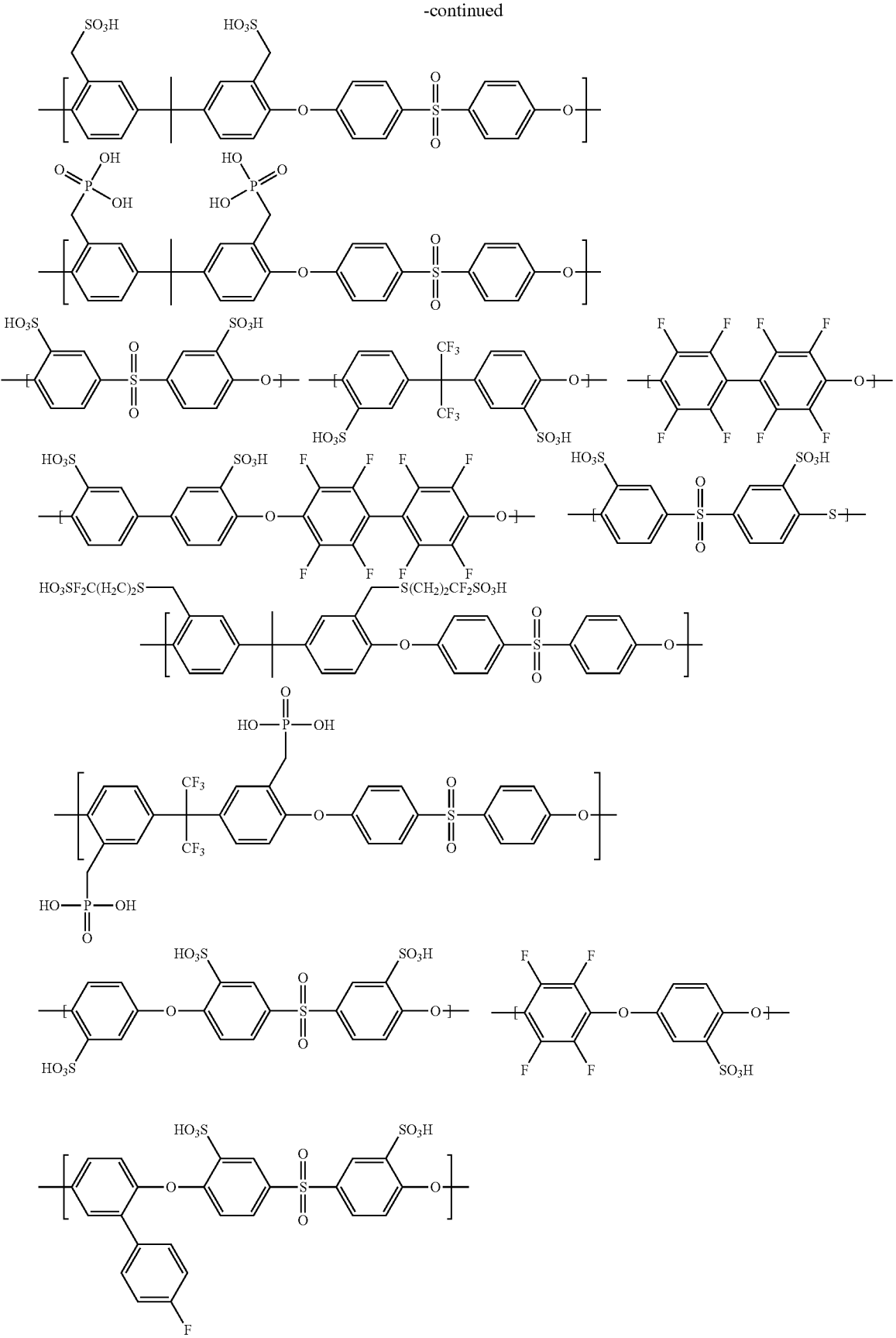
-continued (Inorganic Fine Particles)

The composition of the present invention may include inorganic fine particles in order to obtain intended near infrared radiation-absorbing properties. The number of the kinds of the inorganic fine particles may be one or more.

The inorganic fine particles are particles that mainly play a role of shielding (absorbing) infrared rays. The inorganic fine particles are preferably at least one selected from a group consisting of metal oxide particles and metal particles in terms of superior near infrared radiation-shielding properties.

Examples of the inorganic fine particles include metal oxide particles such as indium tin oxide (ITO) particles, antimony tin oxide (ATO) particles, particles of zinc oxide that may be doped with aluminum (ZnO that may be doped with Al), fluorine-doped tin dioxide (F-doped $SnO_2$) particles, and niobium-doped titanium dioxide (Nb-doped $TiO_2$) particles and metal particles such as silver (Ag) particles, gold (Au) particles, copper (Cu) particle, and nickel (Ni) particles. Meanwhile, in order to satisfy both near infrared radiation-shielding properties and photolithographic properties, the transmittance at a exposure wavelength (365 nm to 405 nm) is desirably high, and indium tin oxide (ITO) particles or antimony tin oxide (ATO) particles are preferred.

The shape of the inorganic fine particle is not particularly limited and may be a spherical shape or a non-spherical shape and may be a sheet shape, a wire shape, or a tube shape.

In addition, as the inorganic fine particles, it is possible to use a tungsten oxide-based compound, and specifically, the tungsten oxide-based compound is more preferably a tungsten oxide-based compound represented by General Formula (compositional formula) (I).

$$M_xW_yO_z \quad (I)$$

M represents metal, W represents tungsten, and O represents oxygen.

$0.001 \leq x/y \leq 1.1$ $2.2 \leq z/y \leq 3.0$

Examples of the metal as M include alkali metals, alkali earth metals, Mg, Zr, Cr, Mn, Fe, Ru, Co, Rh, Ir, Ni, Pd, Pt, Cu, Ag, Au, Zn, Cd, Al, Ga, In, Tl, Sn, Pb, Ti, Nb, V, Mo, Ta, Re, Be, Hf, Os, and Bi, and the metal is preferably an alkali metal, preferably Rb or Cs, and more preferably Cs. The number of the metals as M may be one or more.

When x/y is 0.001 or higher, it is possible to sufficiently shield infrared rays, and, when x/y is 1.1 or lower, it is possible to reliably avoid the generation of an impurity phase in the tungsten oxide-based compound.

When z/y is 2.2 or higher, it is possible to further improve the chemical stability of the material, and, when z/y is 3.0 or lower, it is possible to sufficiently shield infrared rays.

The metal oxide is preferably cesium tungsten oxide.

Specific examples of the tungsten oxide-based compound represented by General Formula (I) include $Cs_{0.33}WO_3$, $Rb_{0.33}WO_3$, $K_{0.33}WO_3$, $Ba_{0.33}WO_3$, and the like, and the tungsten oxide-based compound is preferably $Cs_{0.33}WO_3$ or $Rb_{0.33}WO_3$ and more preferably $Cs_{0.33}WO_3$.

The metal oxide preferably has a fine particle form. The average particle diameter of the metal oxide is preferably 800 nm or smaller, more preferably 400 nm or smaller, and still more preferably 200 nm or smaller. When the average particle diameter is in the above-described range, it becomes difficult for the metal oxide to shield visible rays due to light scattering, and thus it is possible to more reliably ensure translucency in the visible light range. From the viewpoint of avoiding light scattering, the average particle diameter is preferably small; however, for reasons of easy handling during manufacturing and the like, the average particle diameter of the metal oxide is generally 1 nm or larger.

The tungsten oxide-based compound can be procured from a dispersed substance of tungsten fine particles such as YMF-02 manufactured by Sumitomo Metal Mining Go., Ltd.

The content of the metal oxide is preferably in a range of 0.01% by mass to 30% by mass, more preferably in a range of 0.1% by mass to 20% by mass, and still more preferably in a range of 1% by mass to 10% by mass of the total solid content mass of the composition including the metal oxide.

In the composition of the present invention, as other near infrared radiation-absorbing compounds, it is also possible to use phthalocyanine compounds described in Paragraphs "0013" to "0029" in JP2013-195480A, the content of which is incorporated into the present specification.

<Solvent>

The composition of the present invention may include a solvent.

The solvent that is used in the present invention is not particularly limited, any solvent can be appropriately selected depending on the purposes as long as the solvent is capable of uniformly dissolving or dispersing the respective components of the composition of the present invention, and it is possible to use, for example, water and organic solvent. In the composition of the present invention, since the compound (A) is used, even in a case in which an organic solvent is used as the solvent, it is possible to reduce influences on the spectroscopic characteristics.

Preferred examples of the solvent include alcohols, ketones, esters, aromatic hydrocarons, halogenated hydrocarbons, dimethylformamide, dimethylacetamide, dimethylsulfoxide, sulfolane, and the like. The solvent may be used singly or two or more solvents may be jointly used. In this case, the solvent is particularly preferably a solution mixture made up of two or more selected from methyl 3-ethoxypropionate, ethyl 3-ethoxypropionate, ethyl cellosolve acetate, ethyl lactate, diethylene glycol dimethyl ether, butyl acetate, methyl 3-methoxy propionate, 2-heptanone, cyclohexanone, ethyl carbitol acetate, butyl carbitol acetate, ethylene glycol mono-butyl-ether acetate, propylene glycol monomethyl ether, and propylene glycol monomethyl ether acetate.

Specific examples of the alcohols, the aromatic hydrocarbons, and the halogenated hydrocarbons include those described in Paragraph "0136" and the like in JP2012-194534A and the content thereof is incorporated into the specification of the present application. In addition, specific examples of the esters, the ketones, and the ethers include those described in Paragraph "0497" in JP2012-208494A (Paragraph "0609" in the corresponding US2012/0235099A) and further include n-amyl acetate, ethyl propionate, dimethyl phthalate, ethyl benzoate, methyl sulfate, acetone, methyl isobutyl ketone, diethyl ether, ethylene glycol monobutyl ether acetate, and the like.

The content of the solvent is preferably in a range of 10% by mass to 90% by mass, more preferably in a range of 20% by mass to 80% by mass, and particularly preferably in a range of 30% by mass to 70% by mass of the composition of the present invention. The number of the kinds of the solvents may be one or more, and, in a case in which two or more kinds of solvents are used, the total amount thereof is in the above-described range.

<Curable Compound>

The composition of the present invention may further include a curable compound. The curable compound may be a polymerizable compound or a non-polymerizable compound such as a binder. In addition, the curable compound may be a thermosetting compound or a photocrosslinkable compound but is preferably a thermosetting composition due to its high reaction rate.

<Compound Having Polymerizable Group>

The composition of the present invention preferably includes a compound having a polymerizable group (hereinafter, in some cases, referred to as "polymerizable compound"). The above-described group of compounds is widely known in the corresponding industrial field and, in the present invention, these compounds can be used without any particular limitations. The compounds may have any chemical form of, for example, a monomer, an oligomer, a prepolymer, a polymer, and the like.

The polymerizable compound may be monofunctional or polyfunctional, but is preferably polyfunctional. When the composition includes a polyfunctional compound, it is possible to further improve near infrared radiation-shielding properties and heat resistance. The number of functional groups is not particularly specified, but is preferably in a range of 2 to 8 and more preferably in a range of 3 to 6.

In a case in which a curable compound is added to the composition of the present invention together with the copper complex, examples of the preferred forms of the curable compound include the following forms. The present invention is not limited to the following forms. Example of the curable compound include monofunctional (meth)acrylates, polyfunctional (meth)acrylates (preferably trifunctional to hexafunctional (meth)acrylates), polybasic acid-denatured acryl oligomers, epoxy resins, and polyfunctional epoxy resins.

<<Polymerizable Monomers and Polymerizable Oligomers>>

A first preferred embodiment of the composition of the present invention includes a monomer having a polymerizable group (polymerizable monomer) or an oligomer having a polymerizable group (polymerizable oligomer) (hereinafter, in some cases, the polymerizable monomer and the polymerizable oligomer will be collectively referred to as "the polymerizable monomer or the like") as the polymerizable compound.

Examples of the polymerizable monomer or the like include unsaturated carboxylic acids (for example, acrylic acid, methacrylic acid, itaconic acid, crotonic acid, isocrotonic acid, maleic acid, and the like), esters thereof, and amides thereof and esters of an unsaturated carboxylic acid and an aliphatic polyhydric alcohol compound and amides of an unsaturated carboxylic acid and an aliphatic polyvalent amine compound are preferred. In addition, addition reactants of an unsaturated carboxylic acid ester or amide having a nucleophilic substituent such as a hydroxyl group, an amino group, or a mercapto group and a monofunctional or polyfunctional isocyanate or epoxy, dehydration and condensation reactants of a monofunctional or polyfunctional carboxylic acid, and the like are also preferably used. In addition, addition reactants of an unsaturated carboxylic acid ester or an amide having an electrophilic substituent such as an isocyanate group or an epoxy group and a monofunctional or polyfunctional alcohol, amine, or thiol and, furthermore, substitution reactants of an unsaturated carboxylic acid ester or amide having a desorbable substituent such as a halogen group or a tosyloxy group and a monofunctional or polyfunctional alcohol, amine, or thiol are also preferred. As additional examples, it is also possible to use a group of compounds substituted with unsaturated phosphonic acid, a vinyl benzene derivative such as styrene, a vinyl ether, an allyl ether, or the like instead of the above-described unsaturated carboxylic acid.

As the specific compounds thereof, the compounds described in Paragraphs "0095" to "0108" in JP2009-288705A can be preferably used even in the present invention.

In addition, the polymerizable monomer or the like is also preferably a compound having an ethylenic unsaturated group which has at least one addition-polymerizable ethylene group and a boiling point of 100° C. or higher at normal pressure, and is preferably a monofunctional (meth)acrylate, a difunctional (meth)acrylate, or a tri- or higher-functional (meth)acrylate (for example, tri- to hexafunctional (meth)acrylate).

Examples thereof include monofunctional acrylates or methacrylates such as polyethylene glycol mono(meth)acrylate, polypropylene glycol mono(meth)acrylate, and phenoxyethyl (meth)acrylate;

substances obtained by adding ethylene oxide or propylene oxide to a polyfunctional alcohol such as polyethylene glycol di(meth)acrylate, trimethylolethane tri(meth)acrylate, neopentyl glycol di(meth)acrylate, pentaerythritol tri(meth) acrylate, pentaerythritol tetra(meth)acrylate, dipentaerythritol penta(meth)acrylate, dipentaerythritol hexa(meth)acrylate, hexanediol (meth)acrylate, trimethylolpropane tri (acryloyloxypropyl) ether, tri(acryloyloxyethyl) isocyanurate, glycerin, or trimethylolethane and then (meth) acrylating the mixture; and polyfunctional acrylates or methacrylates such as urethane (meth)acrylates described in JP1973-41708B (JP-S48-41708B), JP1975-6034B (JP-S50-6034B), and JP1976-37193A (JP-S51-37193A), polyester acrylates described in JP1973-64183A (JP-S48-64183A), JP1974-43191B (JP-S49-43191B), JP1975-30490B (JP-S52-30490B), and epoxy acrylates which are reaction products between an epoxy polymer and (meth)acrylic acid and mixture thereof.

Among these, the polymerizable compound is preferably ethyleneoxy-denatured pentaerythritol tetraacrylate (NK ester ATM-35E as a commercially available product: manufactured by Shin-Nakamura Chemical Co., Ltd.), dipentaerythritol triacrylate (KAYARAD D-330 as a commercially available product; manufactured by Nippon Kayaku Co., Ltd.), dipentaerythritol tetraacrylate (KAYARAD D-320 as a commercially available product; manufactured by Nippon Kayaku Co., Ltd.), dipentaerythritol penta(meth) acrylate (KAYARAD D-310 as a commercially available product; manufactured by Nippon Kayaku Co., Ltd.), dipentaerythritol hexa(meth)acrylate (KAYARAD DPHA as a commercially available product; manufactured by Nippon Kayaku Co., Ltd.), or a structure in which the above-described (meth)acryloyl groups are bonded to each other through ethylene glycol and propylene glycol residues. In addition, the oligomer types thereof can also be used.

Examples thereof also include polyfunctional (meth)acrylates and the like obtained by reacting a compound having a cyclic ether group and an ethylenic unsaturated group such as glycidyl (meth)acrylate with a polyfunctional carboxylic acid.

In addition, as other preferred polymerizable monomers, it is also possible to use compounds having a fluorene ring and two or more ethylenic polymerizable groups, which are described in JP2010-160418A, JP2010-129825A, JP4364216B, and the like, and curled polymers.

In addition, as the compound having an ethylenic unsaturated group which has a boiling point of 100° C. or higher at normal pressure and at least one addition-polymerizable ethylenic unsaturated group, compounds described in Paragraphs "0254" to "0257" in JP2008-292970A are also preferred.

In addition, compounds obtained by adding an ethylene oxide or a propylene oxide to the polyfunctional alcohol and then (meth)acrylating the mixture, which are described as General Formulae (1) and (2) in JP1998-62986A (JP-H10-62986A) together with specific examples thereof can also be used as the polymerizable monomers.

The polymerizable monomers that are used in the present invention are, furthermore, preferably polymerizable monomers represented by General Formulae (MO-1) to (MO-6).

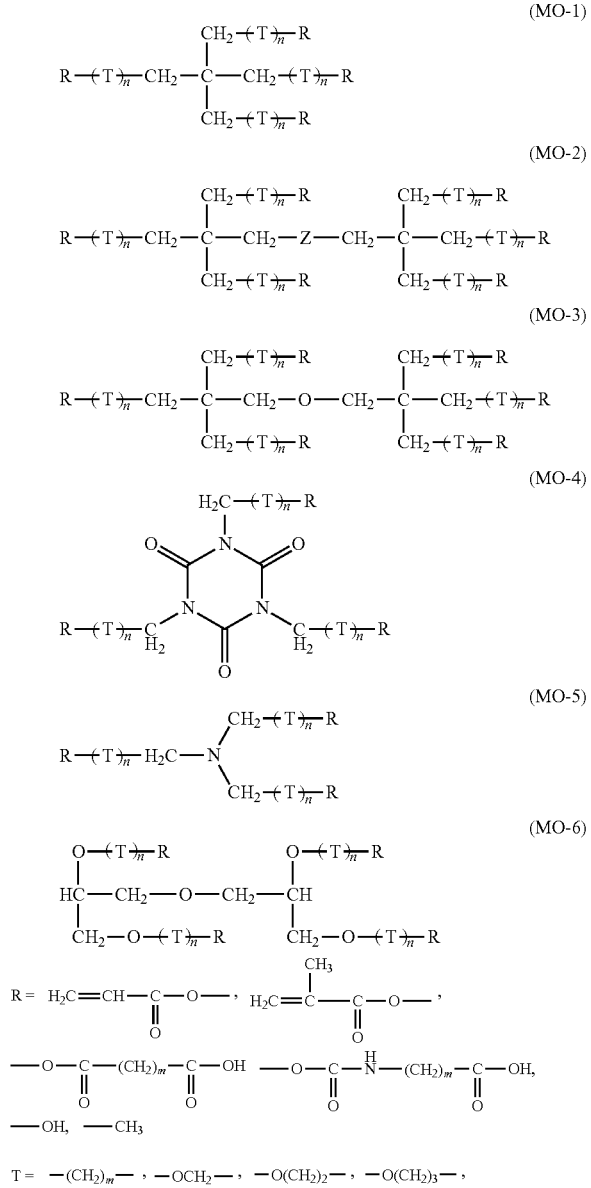

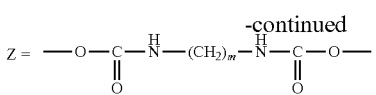

(In the formulae, each of n's represents 0 to 14, and each of m's represents 1 to 8. R's, T's and Z's which are present together in a single molecule may be identical to or different from each other. In a case in which T is an oxyalkylene group, the terminal on the carbon atom side bonds to R. At least one of R's is a polymerizable group.)

n is preferably 0 to 5 and more preferably 1 to 3.
m is preferably 1 to 5 and more preferably 1 to 3.
R is preferably one of the following four structures.

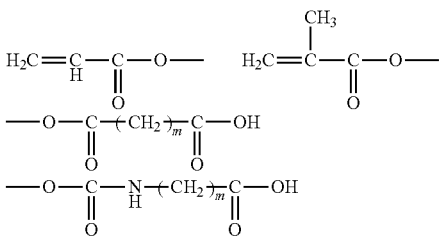

R is preferably one of the following two structures out of the above-described four structures.

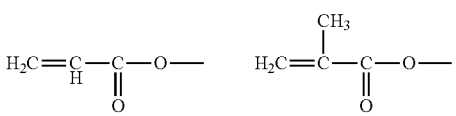

As specific examples of a radical polymerizable monomer represented by General Formulae (MO-1) to (MO-6), it is possible to preferably use compounds described in Paragraphs "0248" to "0251" of JP2007-269779A even in the present invention.

Among these, examples of the polymerizable monomer or the like include polymerizable monomers and the like described in Paragraph "0477" in JP2012-208494A (Paragraph "0585" in the specification of the corresponding US2012/0235099A), the content of which is incorporated into the present specification. In addition, DIGLYCERIN EO (ethylene oxide)-denatured (meth)acrylate (M-460 as a commercially available product; manufactured by Toagosei Co., Ltd.) is preferred. Pentaerythritol tetraacrylate (manufactured by Shin-Nakamura Chemical Co., Ltd., A-TMMT) and 1,6-hexanediol diacrylate (manufactured by Nippon Kayaku Co., Ltd., KAYARAD HDDA) are also preferred. The oligomer types thereof can also be used.

Examples thereof include RP-1040 (manufactured by Nippon Kayaku Co., Ltd.) and the like.

The polymerizable monomer or the like may be a polyfunctional monomer having an acid group such as a carboxylic group, a sulfonic acid group, or a phosphoric acid group. Therefore, as in the case of a mixture as described above, when an ethylenic compound has an unreacted carboxyl group, it is possible to use the ethylenic compound as it is; however, if necessary, an acid group may be introduced into the ethylenic compound by reacting a non-aromatic carboxylic acid anhydride with a hydroxyl group in the ethylenic compound. In this case, specific examples of the non-aromatic carboxylic acid anhydride being used include anhydrous tetrahydrophthalic acid, alkylated anhydrous tetrahydrophthalic acid, anhydrous hexahydrophthalic acid, alkylated anhydrous hexahydrophthalic acid, anhydrous succinic acid, and anhydrous maleic acid.

In the present invention, the monomer having an acid group is an ester of an aliphatic polyhydroxy compound and an unsaturated carboxylic acid, preferably a polyfunctional monomer provided with an acid group by reacting an unreacted hydroxyl group in an aliphatic polyhydroxy compound and a non-aromatic carboxylic anhydride, and particularly preferably the ester in which the aliphatic polyhydroxy compound is pentaerythol and/or dipentaerythritol. Examples of commercially available products thereof include ARONIX series M-305, M-510, M-520, and the like which are polybasic acid-denatured acryl oligomers manufactured by Toagosei Co., Ltd.

The preferred acid value of the polyfunctional monomer having an acid group is in a range of 0.1 mg-KOH/g to 40 mg-KOH/g and particularly preferably in a range of 5 mg-KOH/g to 30 mg-KOH/g. In a case in which two or more polyfunctional monomers having different acid groups are jointly used or polyfunctional monomers having no acid groups are jointly used, the acid value of all of the polyfunctional monomers is adjusted so as to fall within the above-described range.

In addition, as the polymerizable monomer or the like, the composition preferably includes a polyfunctional monomer having a caprolactone-denatured structure.

The polyfunctional monomer having a caprolactone-denatured structure is not particularly limited as long as the monomer has a caprolactone-denatured structure in the molecule. Examples of the polyfunctional monomer having a caprolactone-denatured structure include polyhydric alcohols such as trimethylol ethan, ditrimethylol ethane, trimethylol propane, ditrimethylol propane, pentaerythritol, dipentaerythritol, tripentaerythritol, glycerin, diglycerol, and trimethylol melamine and ε-caprolactone-denatured polyfunctional (meth)acrylates obtained by esterifying a (meth)acrylic acid and ε-caprolactone. Among these, a polyfunctional monomer having a caprolactone-denatured structure represented by Formula (20) below is preferred.

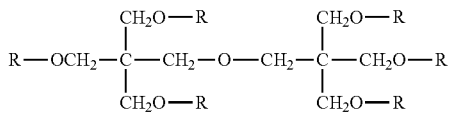

Formula (20)

(In the formula, six R's are all groups represented by Formula (21) below or one to five out of six R's are groups represented by Formula (21) below, and the remainder is a group represented by Formula (22) below.)

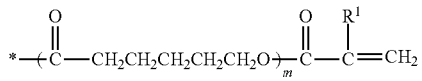

Formula (21)

(In the formula, $R^1$ represents a hydrogen atom or a methyl group, m represents a number of 1 or 2, and "*" represents a bond.)

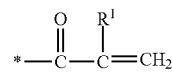

Formula (22)

(In the formula, $R^1$ represents a hydrogen atom or a methyl group, and "*" represents a bond.)

Polyfunctional monomers having the above-described caprolactone-denatured structure are commercially available, for example, under the name of KAYARAD DPCA series from Nippon Kayaku Co., Ltd., and examples thereof include DPCA-20 (m=1 in Formulae (20) to (22), the number of groups represented by Formula (21)=2, a compound in which $R^1$'s are all hydrogen atoms), DPCA-30 (m=1 in the same formulae, the number of groups represented by Formula (21)=3, a compound in which $R^1$'s are all hydrogen atoms), DPCA-60 (m=1 in the same formulae, the number of groups represented by Formula (21)=6, a compound in which $R^1$'s are all hydrogen atoms), DPCA-120 (m=2 in the same formulae, the number of groups represented by Formula (21)=6, a compound in which $R^1$'s are all hydrogen atoms), and the like.

In the present invention, it is possible to use the polyfunctional monomer having the caprolactone-denatured structure singly or use two or more polyfunctional monomers in a mixed form.

Examples of a commercially available product of the polymerizable monomer or the like include SR-494 manufactured by Sartomer which is a tetrafunctional acrylate having four ethyleneoxy chains, DPCA-60 manufactured by Nippon Kayaku Co., Ltd. which is a hexafunctional acrylate having six penthyleneoxy chains, TPA-330 which is a trifunctional acrylate having three isobutyleneoxy chains, and the like.

<<Compound Having Epoxy Group or Oxetanyl Group>>

A third preferred aspect of the present invention is an aspect in which a compound having an epoxy group or an oxetanyl group is included as the polymerizable compound. The compound having an epoxy group or an oxetanyl group is specifically a polymer having an epoxy group in the side chain and a polymerizable monomer or oligomer having two or more epoxy groups in the molecule, and examples thereof include bisphenol A-type epoxy resins, bisphenol F-type epoxy resins, phenol novolac-type epoxy resins, cresol novolac-type epoxy resins, aliphatic epoxy resins, and the like. In addition, examples thereof also include monofunctional or polyfunctional glycidyl ether compounds, and polyfunctional glycidyl ether compounds are preferred.

As the above-described compound, a commercially available product may be used or the compound can be obtained by introducing an epoxy group into the side chain in the polymer.

Regarding the commercially available product, for example, the description of Paragraphs "0191" and the like in JP2012-155288A can be referred to and the content thereof is incorporated into the specification of the present application.

Examples of the commercially available product include polyfunctional aliphatic glycidyl ether compounds such as DENACOL EX-212L, EX-214L, EX-216L, EX-321L, and EX-850L (all manufactured by Nagase ChemteX Corporation). The above-described products are low-chlorine products and EX-212, X-214, EX-216, EX-321, EX-850, and the like, which are not low-chlorine products, can also be used in a similar manner.

Additionally, examples thereof include ADEKA RESIN EP-4000S, ADEKA RESIN EP-4003S, ADEKA RESIN EP-4010S, ADEKA RESIN EP-4011S (all manufactured by Adeka Corporation), NC-2000, NC-3000, NC-7300, XD-1000, EPPN-501, EPPN-502 (all manufactured by Adeka Corporation), JER1031S, and the like.

Furthermore, examples of the commercially available product of the phenol novolac-type epoxy resins include JER-157S65, JER-152, JER-154, JER-157S70 (all manufactured by Mitsubishi Chemical Corporation), and the like.

Specific examples of the polymer having an oxetanyl group in the side chain and the above-described polymerizable monomer or oligomer having two or more oxetanyl groups in the molecule that can be used include ARONOX-ETANE OXT-121, OXT-221, OX-SQ, and PNOX (all manufactured by Toagosei Co., Ltd.).

The weight-average molecular weight is in a range of 500 to 5,000,000 and more preferably in a range of 1,000 to 500,000.

As the epoxy unsaturated compound, it is also possible to use any compound having a glycidyl group as the epoxy group such as glycidyl (meth)acrylate or allyl glycidyl ether, but an unsaturated compound having an aliphatic epoxy group is preferred. Regarding the above-described compound, it is possible to refer to, for example, the description of Paragraphs "0045" and the like of JP2009-265518A, the content of which is incorporated into the present specification.

The composition of the present invention may include a polymer having a crosslinking group such as an unsaturated double bond, an epoxy group, or an oxetanyl group. Specific examples thereof include polymers (copolymers) having the following repeating unit. The polymer having the following repeating unit is preferably a polymer having an epoxy group.

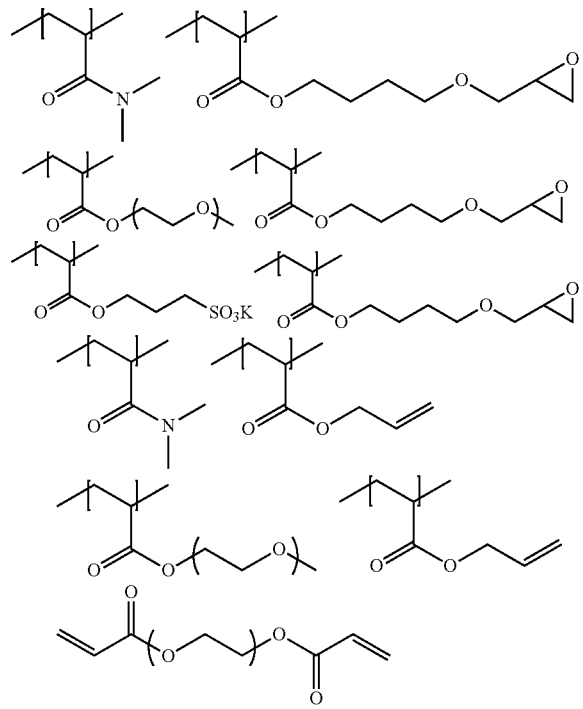

<<Compound Having Partial Structure Represented by Formula (30)>>

The curable compound that is used in the present invention may have a partial structure represented by Formula (30). The curable compound may have a crosslinking group such as an unsaturated double bond, an epoxy group, or an oxetanyl group.

Formula (30)

(In Formula (30), $R^1$ represents a hydrogen atom or an organic group.)

In Formula (30), $R^1$ represents a hydrogen atom or an organic group. Examples of the organic group include hydrocarbon groups, specifically, alkyl groups and aryl groups, and alkyl groups having 1 to 20 carbon atoms, aryl groups having 6 to 20 carbon atoms, or groups made of a combination of the above-described group and a divalent linking group are preferred.

Specific examples of the above-described organic group preferably include —OR', —SR', and groups made of a combination of the above-described group and at least one of —(CH$_2$)$_m$— (m is an integer of 1 to 10), cyclic alkylene groups having 5 to 10 carbon atoms, —O—, —CO—, —COO—, and —NH—. Here, R' is preferably a hydrogen atom, a linear alkyl group having 1 to 10 carbon atoms, a branched or circular alkyl group having 3 to 10 carbon atoms (preferably a linear alkyl group having 1 to 7 carbon atoms, a branched or circular alkyl group having 3 to 7 carbon atoms), an aryl group having 6 to 10 carbon atoms, or a group made of a combination of an aryl group having 6 to 10 carbon atoms and an alkylene group having 1 to 10 carbon atoms.

In addition, in Formula (30), $R^1$ and C may bond together and thus form a cyclic structure (heterocyclic structure). A hetero atom in the heterocyclic structure is a nitrogen atom in Formula (30). The heterocyclic structure is preferably a 5- or 6-membered cyclic structure and more preferably a 5-membered cyclic structure. The heterocyclic structure may be a fused ring, but is preferably a monocycle.

Specific examples of a particularly preferred $R^1$ include a hydrogen atom, alkyl groups having 1 to 3 carbon atoms, groups made of a combination of —OR' (R' is a linear alkyl group having 1 to 5 carbon atoms) and —(CH$_2$)$_m$— (m is an integer of 1 to 10 and preferably an integer of 1 to 5), and groups in which $R^1$ and C in Formula (30) bond together and thus form a heterocyclic structure (preferably a 5-membered cyclic structure).

The compound having the partial structure represented by Formula (30) is preferably represented by (the main chain structure of the polymer—the partial structure of Formula (30)-$R^1$) or represented by (A—the partial structure of Formula (30)-B). Here, A is a linear alkyl group having 1 to 10 carbon atoms, a branched alkyl group having 3 to 10 carbon atoms, or a cyclic alkyl group having 3 to 10 carbon atoms. In addition, B is a group made of a combination of —(CH$_2$)$_m$— (m is an integer of 1 to 10 and preferably an integer of 1 to 5), the partial structure of Formula (30), and a polymerizable group.

In addition, examples of the compound having the partial structure represented by Formula (30) include structures represented by Formula (1-1) to (1-5).

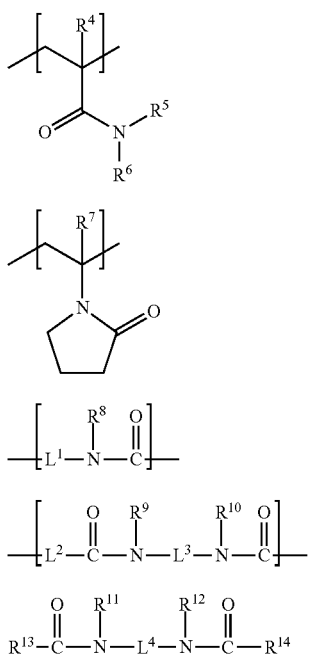

Formula (1-1)

Formula (1-2)

Formula (1-3)

Formula (1-4)

Formula (1-5)

(In Formula (1-1), $R^4$ represents a hydrogen atom or a methyl group, and each of $R^5$ and $R^6$ independently represents a hydrogen atom or an organic group. In Formula (1-2), $R^7$ represents a hydrogen atom or a methyl group. In Formula (1-3), $L^1$ represents a divalent linking group, and $R^8$ represent a hydrogen atom or an organic group. In Formula (1-4), each of $L^2$ and $L^3$ independently represents a divalent linking group, and each of $R^9$ and $R^{10}$ independently represents a hydrogen atom or an organic group. In Formula (1-5), $L^4$ represents a divalent linking group, and each of $R^{11}$ to $R^{14}$ independently represents a hydrogen atom or an organic group.)

In Formula (1-1), each of $R^5$ and $R^6$ independently represents a hydrogen atom or an organic group. The organic group is identical to $R^1$ in Formula (30), and a preferred range thereof is also identical.

In Formulae (1-3) to (1-5), $L^1$ to $L^4$ represent divalent linking groups. The divalent linking groups are preferably groups made of a combination of —$(CH_2)_m$— (m is an integer of 1 to 10), an cyclic alkylene group having 5 to 10 carbon atoms, and at least one of —O—, —CO—, —COO—, and —NH— and more preferably —$(CH_2)_m$— (m is an integer of 1 to 8).

In Formulae (1-3) to (1-5), each of $R^8$ to $R^{14}$ independently represents a hydrogen atom or an organic group. The organic group is preferably a hydrocarbon group, specifically, an alkyl group or an alkenyl group.

The alkyl group may be substituted. In addition, the alkyl group may have any one of a chain shape, a branched shape, or a cyclic shape and preferably has a linear shape or a cyclic shape. The alkyl group is preferably an alkyl group having 1 to 10 carbon atoms, more preferably an alkyl group having 1 to 8 carbon atoms, and more preferably an alkyl group having 1 to 6 carbon atoms.

The alkenyl group may be substituted. The alkenyl group is preferably an alkenyl group having 1 to 10 carbon atoms, more preferably an alkenyl group having 1 to 4 carbon atoms, and particularly preferably a vinyl group.

Examples of a substituent include polymerizable groups, halogen atoms, an alkyl group, a carboxylic acid ester group, a halogenated alkyl group, an alkoxy group, a methacryloyloxy group, an acryloyloxy group, an ether group, a sulfonyl group, a sulfide group, an amide group, an acyl group, a hydroxy group, a carboxyl group, and the like. Among these substituents, polymerizable groups (for example, a vinyl group and a (meth)acryloyloxy group, a (meth)acryloyl group, an epoxy group, an azinidinyl group, and the like) are preferred, and a vinyl group is more preferred.)

In addition, the compound having the partial structure represented by Formula (30) may be a monomer or a polymer, but is preferably a polymer. That is, the compound having the partial structure represented by Formula (30) is preferably a compound represented by Formula (1-1) or (1-2).

In addition, in a case in which the compound having the partial structure represented by Formula (30) is a polymer, the above-described partial structure is preferably included in a side chain of the polymer.

The molecular weight of the compound having the partial structure represented by Formula (30) is preferably in a range of 50 to 1,000,000 and more preferably in a range of 500 to 500,000. When the above-described molecular weight is provided, it is possible to more effectively achieve the effects of the present invention.

The content of the compound having the partial structure represented by Formula (30) is preferably in a range of 5% by mass to 80% by mass and more preferably in a range of 10% by mass to 60% by mass of the composition of the present invention.

Specific examples of the compound having the partial structure represented by Formula (30) include compounds having the following structures or exemplary compounds below, but are not limited thereto. In the present invention, particularly, the compound having the partial structure represented by Formula (30) is preferably polyacrylamide.

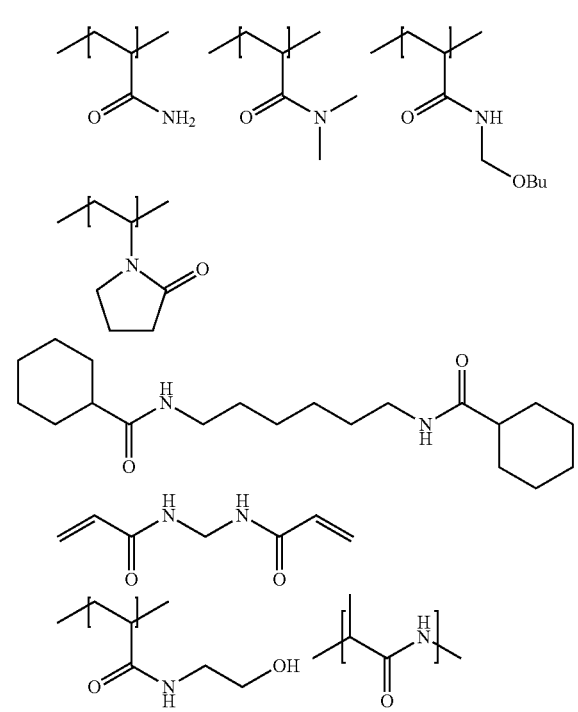

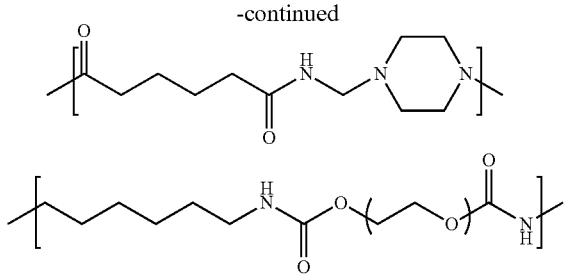

In addition, specific examples of the compound having the partial structure represented by Formula (30) include water-soluble polymers, and examples of a preferred main chain structure include polyvinyl pyrrolidone, poly(meth) acrylamide, polyamide, polyurethane, and polyurea. A water-soluble polymer may be a copolymer, and the copolymer may be a random copolymer.

As the polyvinyl pyrrolidone, trade names K-30, K-85, K-90, K-30W, K-85W, and K90W (manufactured by Nippon Shokubai Co., Ltd.) can be used.

Examples of the poly(meth)acrylamide include polymers such as (meth)acrylamide and copolymers. Specific examples of acrylamide include acrylamide, N-methyl acrylamide, N-ethyl acrylamide, N-propyl acrylamide, N-butyl acrylamide, N-benzyl acrylamide, N-hydroxyethyl acrylamide, N-phenyl acrylamide, N-tolyl acrylamide, N-(hydroxyphenyl) acrylamide, N-(sulfamoylphenyl) acrylamide, N-(phenylsulfonyl) acrylamide, N-(tolylsulfonyl) acrylamide, N,N-dimethyl acrylamide, N-methyl-N-phenyl acrylamide, N-hydroxyethyl-N-methyl acrylamide, and the like. In addition, methacrylamides corresponding to the above-described acrylamides can also be used in the same manner.

Examples of the water-soluble polyamide resin include, particularly, compounds obtained by copolymerizing a polyamide resin and a hydrophilic compound. A derivative of the water-soluble polyamide resin refers to, for example, a compound in which the structure of an amide bond is changed due to the substitution or addition reaction of an atom in a water-soluble polyamide resin molecule such as a compound obtained by substituting a water-soluble polyamide resin as a raw material with hydrogen atom with a methoxy methyl group (—CH$_2$OCH$_3$) in an amide bond (—CONH—).

Examples of the polyamide resin include so-called "n-nylons" that are synthesized by means of the polymerization of ω amino acid or so-called "n,m-nylons" synthesized by means of the copolymerization of diamine and dicarboxylic acid. Among these, from the viewpoint of imparting hydrophilic properties, a copolymer of diamine and dicarboxylic acid is preferred, and a reaction product between ε-caprolactame and dicarboxylic acid is more preferred.

Examples of the hydrophilic compound include hydrophilic nitrogen-containing cyclic compounds, polyalkylene glycols, and the like.

Here, the hydrophilic nitrogen-containing cyclic compounds refer to compounds having a tertiary amine component in a side chain or the main chain, and examples thereof include aminoethyl piperazine, bisaminopropyl piperazine, α-dimethylamino ε caprolactame, and the like.

Meanwhile, in the compound obtained by copolymerizing a polyamide resin and a hydrophilic compound, for example, at least one selected from a group consisting of hydrophilic nitrogen-containing cyclic compounds and polyalkylene glycols is copolymerized at the main chain of the polyamide resin, and thus the hydrogen bond capability of an amid bonding portion in the polyamide resin is greater than that of N-methoxymethylated nylon.

Among compounds obtained by copolymerizing a polyamide resin and a hydrophilic compound, 1) reaction products between ε-caprolactame, a hydrophilic nitrogen-containing cyclic compound, and dicarboxylic acid and 2) reaction products between ε-caprolactame, polyalkylene glycol, and dicarboxylic acid are preferred.

These compounds are commercially available under the trademark of, for example, "AQ NYLON" from Toray Fine Chemicals Co., Ltd. The reaction products between ε-caprolactame, a hydrophilic nitrogen-containing cyclic compound, and dicarboxylic acid can be procured from AQ NYLON A-90 manufactured by Toray Fine Chemicals Co., Ltd., and the reaction products between ε-caprolactame, polyalkylene glycol, and dicarboxylic acid can be procured from AQ NYLON A-70 manufactured by Toray Fine Chemicals Co., Ltd. AQ NYLON A-90, P-70, P-95, and T-70 (Toray Fine Chemicals Co., Ltd.) can be used.

The molar ratio of a polymer including a repeating unit having the partial structure represented by Formula (30) and a repeating unit having an epoxy resin is preferably in a range of 10/90 to 90/10 and more preferably in a range of 30/70 to 70/30. The weight-average molecular weight of the copolymer is preferably in a range of 3,000 to 1,000,000 and more preferably in a range of 5,000 to 200,000.

The amount of the polymerizable compound added to the composition of the present invention is in a range of 1% by mass to 90% by mass, more preferably 15% by mass to 80% by mass, and particularly preferably in a range of 40% by mass to 75% by mass of the total solid content excluding a solvent.

In addition, in a case in which a polymer including a repeating unit having a crosslinking group is used as the polymerizable compound, the amount of the polymerizable compound added to the composition is preferably 10% by mass to 75% by mass, more preferably 20% by mass to 65% by mass, and still more preferably 20% by mass to 60% by mass.

The number of the kinds of the polymerizable compounds may be one or more, and, in a case in which two or more kinds of polymerizable compounds are used, the total amount thereof is in the above-described range.

<Binder Polymer>

In the present invention, the composition may further include a binder polymer as necessary, in addition to the polymerizable compound, for the purpose of improving coat characteristics and the like. As the binder polymer, an alkali-soluble resin is preferably used. When an alkali-soluble resin is included, there is an effect of improving heat resistance and the like or finely adjusting coating aptitude.

Regarding the alkali-soluble resin, it is possible to refer to the description of Paragraphs "0558" to "0571" of JP2012-208494A ("0685" to "0700" in the specification of the corresponding US2012/0235099A), the content of which is incorporated into the present specification.

The content of the binder polymer in the present invention is preferably in a range of 1% by mass to 80% by mass, more preferably in a range of 5% by mass to 50% by mass, and still more preferably in a range of 7% by mass to 30% by mass of the total solid contents of the composition.

<Surfactant>

The composition of the present invention may include a surfactant. Only one kind of surfactant may be used, or two or more kinds of surfactants may be combined thereinto. The amount of the surfactant added to the composition is preferably in a range of 0.0001% by mass to 2% by mass, more preferably in a range of 0.005% by mass to 1.0% by mass, and still more preferably in a range of 0.01% by mass to 0.1% by mass of the solid content of the composition of the present invention.

As the surfactant, it is possible to use a variety of surfactants such as a fluorine-based surfactant, a nonionic surfactant, a cationic surfactant, an anionic surfactant, and a silicone-based surfactant.

Particularly, when the composition of the present invention includes at least any one of a fluorine-based surfactant and a silicone-based surfactant, liquid characteristics (particularly, fluidity) further improve when a coating fluid is prepared using the composition. Therefore, the uniformity of the coating thickness or liquid-saving properties further improves.

That is, in a case in which a film is formed using a coating fluid to which the composition including at least any one of a fluorine-based surfactant and a silicone-based surfactant, the interface tension between a surface being coated and the coating fluid decreases, and thus wettability to the surface to be coated improves, and the coating properties of the coating fluid to the surface to be coated improve. Therefore, even in a case in which an approximately several micrometer-thick film is formed using a small amount of a liquid, it is possible to more preferably form a film having little thickness evenness and a uniform thickness, which is advantageous.

The content ratio of fluorine in the fluorine-based surfactant is preferably in a range of 3% by mass to 40% by mass, more preferably in a range of 5% by mass to 30% by mass, and particularly preferably in a range of 7% by mass to 25% by mass. Fluorine-based surfactants having a fluorine content ratio in the above-described range are effective for the uniformity of the thickness of coated films or liquid-saving properties and also have favorable solubility in coloration photosensitive compositions.

Specific examples of the fluorine-based surfactant include surfactants described in Paragraph "0552" of JP2012-208494A ("0678" in the specification of the corresponding US2012/0235099A), the content of which is incorporated into the present specification.

Examples of the nonionic surfactant include polyoxyethylene alkyl ethers, polyoxyethylene alkyl allyl ethers, polyoxyethylene aliphatic esters, sorbitan aliphatic esters, polyoxyethylene sorbitan aliphatic esters, polyoxyethylene alkylamines, glycerol aliphatic esters, oxyethylene oxypropylene block copolymers, acetylenic glycol-based surfactants, acetylene-based polyoxyethylene oxides, and the like. These surfactants can be used singly or two or more kinds of surfactants can be used.

Specific trade names thereof include SURFYNOL 61, 82, 104, 104E, 104H, 104A, 104BC, 104DPM, 104PA, 104PG-50, 104S, 420, 440, 465, 485, 504, CT-111, CT-121, CT-131, CT-136, CT-141, CT-151, CT-171, CT-324, DF-37, DF-58, DF-75, DF-110D, DF-210, GA, OP-340, PSA-204, PSA-216, PSA-336, SE, SE-F, TG, GA, DYNOL 604 (all manufactured by Nissin Chemical Co., Ltd. and Air Products & Chemicals Inc.), OLFINE A, B, AK-02, CT-151W, E1004, E1010, P, SPC, STG, Y, 32W, PD-001, PD-002W, PD-003, PD-004, EXP. 4001, EXP. 4036, EXP. 4051, AF-103, AF-104, SK-14, AE-3 (all manufactured by Nissin Chemical Co., Ltd.), ACETYLENOL E00, E13T, E40, E60, E81, E100, E200 (all trade names, manufactured by Kawaken Fine Chemical Co., Ltd.), and the like. Among these, OLEFINE E1010 is preferred.

Additionally, specific examples of the nonionic surfactant include nonionic surfactants described in Paragraph "0553" of JP2012-208494A ("0679" in the specification of the corresponding US2012/0235099A), the content of which is incorporated into the present specification.

Specific examples of the cationic surfactant include cationic surfactants described in Paragraph "0554" of JP2012-208494A ("0680" in the specification of the corresponding US2012/0235099A), the content of which is incorporated into the present specification.

Specific examples of the anionic surfactant include W004, W005, W017 (manufactured by Yusho Co., Ltd.), and the like.

Examples of the silicone-based surfactant include silicone-based surfactants described in Paragraph "0556" of JP2012-208494A ("0682" in the specification of the corresponding US2012/0235099A), the content of which is incorporated into the present specification. In addition, examples thereof also include "TORAY SILICONE SF8410", "TORAY SILICONE SF8427", "TORAY SILICONE SH8400", "ST80PA", "ST83PA", and "ST86PA" manufactured by Dow Corning Toray Co., Ltd., "TSF-400", "TSF-401", "TSF-410", and "TSF-4446" manufactured by Momentive Performance Materials Inc., "KP321", "KP323", "MP324", and "KP340", manufactured by Shin-Etsu Chemical Co., Ltd. and the like.

<Polymerization Initiator>

The composition of the present invention may include a polymerization initiator. The polymerization initiator is not particularly limited as long as the polymerization initiator has the capability of initiating the polymerization of the polymerizable compounds using either or both light and heat and can be appropriately selected depending on the purpose, but is preferably a photopolymerizable compound. In a case in which polymerization is initiated using light, the polymerization initiator preferably has sensitivity to light rays in an ultraviolet to visible light range.

In addition, in a case in which polymerization is initiated using heat, a polymerization initiator that is decomposed at a temperature in a range of 150° C. to 250° C. is preferred.

The polymerization initiator that can be used in the present invention is preferably a compound having at least an aromatic group, and examples thereof include acylphosphine compounds, acetophenone-based compounds, α-aminoketone compounds, benzophenone-based compounds, benzoin ether-based compounds, ketal derivative compounds, thioxanthone compounds, oxime compounds, hexaaryl biimidazole compounds, trihalomethyl compounds, azo compounds, organic peroxides, diazonium compounds, iodonium compounds, sulfonium compounds, azinium compounds, onium salt compounds such as metallocene compounds, organic boron salt compounds, disulfone compounds, thio compounds, and the like.

Regarding the acetophenone-based compounds, the trihalomethyl compounds, the hexaaryl biimidazole compounds, and the oxime compounds, specifically, the description of Paragraphs "0506" to "0510" in JP2012-208494A ("0622" to "0628" in the specification of the corresponding US2012/0235099A) and the like can be referred to, and the content thereof is incorporated into the specification of the present application.

In addition, it is also possible to preferably use cyclic oxime compounds described in JP2007-231000A (the specification of the corresponding US2011/0123929A) and JP2007-322744A.

Additionally, examples thereof include oxime compounds having a specific substituent described in JP2007-269779A (the specification of the corresponding US2010/0104976A)

and oxime compounds having a thioaryl group described in JP2009-191061A (the specification of the corresponding US2009/023085A).

It is possible to refer to the description of compounds represented by Formula (OX-1), (OX-2), or (OX-3) of Paragraph "0513" in JP2012-208494A ("0632" in the specification of the corresponding US2012/235099A), the content of which is incorporated into the present specification.

In addition, regarding specific examples of the oxime compound, it is possible to refer to the description of Paragraphs "0090" to "0106" in JP2009-191061A (Paragraph "0393" in the specification of the corresponding US2009/023085A), Paragraph "0054" of JP2012-032556A, Paragraph "0054" of JP2012-122045A, and the like, the contents of which are incorporated into the present specification.

The photopolymerization initiator is preferably an oxime compound, an acetophenone-based compound, or an acylphosphine compound. More specifically, it is also possible to use, for example, the aminoacetophenone-based initiators described in JP1998-291969A (JP-H10-291969A), the acylphosphine oxide-based initiators described in JP4225898B, and the above-described oxime-based initiators, and, furthermore, as the oxime-based initiators, the compounds described in JP2001-233842A.

As the oxime compound, it is possible to use a commercially available product IRGACURE-OXE01 (manufactured by BASF) or IRGACURE-OXE02 (manufactured by BASF). As the acetophenone-based initiator, it is possible to use commercially available products IRGACURE-907, IRGACURE-369, and IRGACURE-379 (trade names, all manufactured by BASF Japan Ltd.). In addition, as the acylphosphine-based initiator, it is possible to use a commercially available product IRGACURE-819 or DAROCUR-TPO (trade name, all manufactured by BASF Japan Ltd.).

The content of the polymerization initiator is preferably in a range of 0.01% by mass to 30% by mass, more preferably in a range of 0.1% by mass to 20% by mass, and particularly preferably in a range of 0.1% by mass to 15% by mass of the solid contents of the composition of the present invention. The number of the kinds of the polymerization initiators may be one or more, and, in a case in which two or more kinds of polymerization initiators are used, the total amount thereof is in the above-described range.

<Other Components>

Examples of other components that can be jointly used with the above-described components in the composition of the present invention include a dispersing agent, a sensitizer, a crosslinking agent, a curing accelerator, a filler, a thermal curing accelerator, a thermopolymerization inhibitor, a plasticizer, and the like, and, furthermore, an adhesion accelerator to the surface of a base material and other auxiliary agents (for example, conductive particles, a filler, a defoamer, a flame retardant, a levelling agent, a peeling accelerator, an antioxidant, a fragrance, a surface tension adjuster, a chain transfer agent, and the like) may also be jointly used.

When the composition of the present invention appropriately includes the above-described components, it is possible to adjust properties such as stability and film properties of the target near infrared radiation-absorbing filter.

Regarding the above-described components, it is possible to refer to, for example, the descriptions of Paragraphs "0183" and thereafter in JP2012-003225A, Paragraphs "0101" and "0102" in JP2008-250074A, Paragraphs "0103" and "0104" in JP2008-250074A, and Paragraphs "0107" to "0109" in JP2008-250074A, Paragraphs "0159" to "0184" in JP2013-195480A, and the like, the contents of which are incorporated into the present specification.

<Preparation and Application of Near Infrared Radiation-Absorbing Composition>

The near infrared radiation-absorbing composition of the present invention can be prepared by mixing the respective components described above.

During the preparation of the composition, the respective components constituting the composition may be collectively formulated or each of the components may be dissolved and dispersed in an organic solvent and then be sequentially formulated. In addition, there are no particular limitations regarding the injection order or the operation conditions when formulating the components.

In the present invention, the composition is preferably filtered using a filter for the purpose of removing foreign substances, reducing defects, and the like. As the filter, any filters can be used without any particular limitations as long as the filters have thus far been used for filtration applications and the like. Examples thereof include filters made of a fluorine resin such as polytetrafluoroethylene (PTFE), a polyamide-based resin such as nylon-6 or nylon 6,6, a polyolefin resin such as polyethylene or polypropylene (PP) (including a high density and an ultrahigh molecular weight) or the like. Among these materials, polypropylenes (including high-density polypropylene) and nylons are preferred.

The pore diameter of the filter is preferably in a range of 0.1 μm to 7.0 μm, more preferably in a range of 0.2 μm to 2.5 μm, still more preferably in a range of 0.2 μm to 1.5 μm, and far still more preferably in a range of 0.3 μm to 0.7 μm. When the pore diameter of the filter is set in this range, it is possible to reliably remove fine foreign substances such as impurities, agglomerates, and the like in the composition while suppressing filtration clogging.

When a filter is used, a combination of different filters may be used. At this time, filtering using a first filter may be carried out once or more. In a case in which different filters are combined together and filtering is carried out two or more times, it is preferable that the pore diameter used in the first filtering is equal to or larger than the pore diameter used in the second or later filtering. In addition, the first filters having pore diameters that are different in the above-described range may be combined together. Here, regarding the pore diameter, it is possible to refer to nominal values of filter makers. As commercially available filters, the filter can be selected from a variety of filters provided by, for example, Nippon Pall Ltd., Toyo Roshi Kaisha, Ltd., Nihon Entegris K.K. (formerly Nihon Mykrolis Corporation), Kitz Microfilter Corporation, and the like.

As a second filter, it is possible to use a filter formed of the same material as that of the above-described first filter. The pore diameter of the second filter is preferably in a range of 0.2 μm to 10.0 μm, more preferably in a range of 0.2 μm to 7.0 μm, and still more preferably in a range of 0.3 μm to 6.0 μm. When the pore diameter of the filter is set in this range, it is possible to remove fine foreign substances while leaving component particles that are included in the composition.

The applications of the near infrared radiation-absorbing composition of the present invention are not particularly limited, and examples thereof include a near infrared radiation cut-off filter on the light-receiving side of a solid image pickup element substrate (for example, a near infrared radiation cut-off filter for a wafer-level lens), a near infrared radiation cut-off filter on the back surface side (the side opposite to the light-receiving side) of a solid image pickup element substrate, and the like. A preferred application thereof is a near infrared radiation cut-off filter on the light-receiving side of a solid image pickup element substrate. In addition, the near infrared radiation-absorbing composition of the present invention is preferably directly applied onto an imaging sensor for a solid image pickup element so as to form a coated film.

In a case in which a near infrared radiation cut-off layer is formed by coating the near infrared radiation-absorbing composition of the present invention, the viscosity of the near infrared radiation-absorbing composition of the present invention is preferably in a range of 1 mPa·s to 3,000 mPa·s, more preferably in a range of 10 mPa·s to 2,000 mPa·s, and still more preferably in a range of 100 mPa·s to 1,500 mPa·s.

Since the composition of the present invention can be supplied in a coatable state, it is possible to easily form near infrared radiation cut-off filters at desired members or positions in solid image pickup elements.

The light transmittance of near infrared radiation cut-off filters obtained using the composition of the present invention preferably satisfies at least one condition of the following (1) to (9), more preferably satisfies all conditions of the following (1) to (8), and still more preferably satisfies all conditions of the following (1) to (9).

(1) The transmittance at a wavelength of 400 nm is preferably 80% or higher, more preferably 90% or higher, still more preferably 92% or higher, and particularly preferably 95% or higher.

(2) The transmittance at a wavelength of 450 nm is preferably 80% or higher, more preferably 90% or higher, still more preferably 92% or higher, and particularly preferably 95% or higher.

(3) The transmittance at a wavelength of 500 nm is preferably 80% or higher, more preferably 90% or higher, still more preferably 92% or higher, and particularly preferably 95% or higher.

(4) The transmittance at a wavelength of 550 nm is preferably 80% or higher, more preferably 90% or higher, still more preferably 92% or higher, and particularly preferably 95% or higher.

(5) The transmittance at a wavelength of 700 nm is preferably 20% or lower, more preferably 15% or lower, still more preferably 10% or lower, and particularly preferably 5% or lower.

(6) The transmittance at a wavelength of 750 nm is preferably 20% or lower, more preferably 15% or lower, still more preferably 10% or lower, and particularly preferably 5% or lower.

(7) The transmittance at a wavelength of 800 nm is preferably 20% or lower, more preferably 15% or lower, still more preferably 10% or lower, and particularly preferably 5% or lower.

(8) The transmittance at a wavelength of 850 nm is preferably 20% or lower, more preferably 15% or lower, still more preferably 10% or lower, and particularly preferably 5% or lower.

(9) The transmittance at a wavelength of 900 nm is preferably 20% or lower, more preferably 15% or lower, still more preferably 10% or lower, and particularly preferably 5% or lower.

Near infrared radiation cut-off filters can be appropriately selected depending on purposes, but the film thickness is preferably set to 300 μm or smaller, more preferably set to 200 μm or smaller, and still more preferably set to 100 μm or smaller. The lower limit of the film thickness is, for example, preferably 1 μm or greater, more preferably 5 μm or greater, and more preferably 20 μm or greater. According to the composition of the present invention, the composition has favorable near infrared radiation-shielding properties, and thus it is possible to reduce the film thicknesses of near infrared radiation cut-off filters.

In near infrared radiation cut-off filters, the visible light transmittance at a film thickness of 300 μm or smaller in the entire wavelength range of 400 nm to 550 nm is preferably 85% or higher and more preferably 90% or higher. In addition, the transmittance is still more preferably 20% or lower in at least one point in a wavelength range of 700 nm to 800 nm and is still more preferably 20% or lower in the entire wavelength range of 700 nm to 800 nm. According to the present invention, it is possible to ensure a wide visible range with a high transmittance and to provide near infrared radiation cut-off filters having favorable infrared radiation-shielding properties.

The near infrared radiation cut-off filter is used for lenses having a function of absorbing and cutting near infrared radiation (optical lenses such as a lens for a camera such as a digital camera, a mobile phone, or an in-vehicle camera, an f-θ lens, and a pick-up lens), optical filters for a light-receiving element in a semiconductor device, near infrared radiation-absorbing films or near infrared radiation-absorbing plates shielding heat rays for energy saving, agricultural coating agents intended for selective use of sunlight, recording media in which near infrared radiation-absorbed heat is used, near infrared radiation filters for an electronic device or a photograph, protective glasses, sunglasses, heat ray-shielding films, optical letter-read recording, prevention of copying classified documents, electrophotographic photoreceptors, laser fusion, and the like. In addition, the near infrared radiation cut-off filter is also useful for a noise cut-off filter for a CCD camera and a filter for a CMOS image sensor.

The present invention also relates to a production method for a near infrared radiation cut-off filter including a step of forming a film by applying the near infrared radiation-absorbing composition (preferably through a dropwise addition method, coating or printing) and a step of drying the film. The film thickness, the laminate structure, and the like can be appropriately selected depending on the purpose.

A support body may be a transparent substrate made of glass or the like, a solid image pickup element substrate, another substrate provided on the light-receiving side of the solid image pickup element substrate, or a layer such as a flattened layer provided on the light-receiving side of the solid image pickup element substrate.

Examples of a method for applying the infrared radiation-absorbing composition to the support include immersion, coating, printing, and the like. Specifically, a dropwise addition method (drop casting), dip coating, slit coating, screen printing, spray coating, or spin coating is preferred. In the case of the dropwise addition method (drop casting), it is preferable to form a dropwise addition region of the near infrared radiation-absorbing composition on a glass substrate using photoresists as partition walls so as to obtain a uniform film having a predetermined film thickness. Meanwhile, the film thickness can be adjusted using the dropwise addition amount and solid content concentration of the composition and the area of the dropwise addition region.

In addition, the conditions for drying the coated film vary depending on the kind and used proportions of individual components and a solvent; however, generally, the coated film is dried at a temperature in a range of 60° C. to 150° C. for approximately 30 seconds to 15 minutes.

A method for forming a near infrared radiation cut-off filter using the near infrared radiation-absorbing composition of the present invention may include other steps. The other steps are not particularly limited and can be appropriately selected depending on the purpose. Examples thereof include a surface treatment step of the base material, a preheating step (prebaking step), a curing treatment step, a post heating step (post baking step), and the like.

<Preheating Step and Post Heating Step>

The heating temperatures in the preheating step and the post heating step are generally in a range of 80° C. to 200° C. and preferably in a range of 90° C. to 150° C. The heating times in the preheating step and the post heating step are generally in a range of 30 seconds to 240 seconds and preferably in a range of 60 seconds to 180 seconds.

<Curing Treatment Step>

The curing treatment step refers to a step of carrying out a curing treatment on the formed film as necessary and the curing treatment improves the mechanical strength of the near infrared radiation cut-off filter.

The curing treatment step is not particularly limited and can be appropriately selected depending on the purpose and preferred examples thereof include a full-surface exposure treatment, a full-surface thermal treatment, and the like. In the present invention, the meaning of "exposure" includes the irradiation of the surface with radioactive rays such as electron beams or X rays as well as light rays having a variety of wavelengths.

The exposure is preferably carried out through irradiation with radioactive rays and, as the radioactive rays that can be used in the exposure, particularly, ultraviolet rays such as electron beams, KrF, ArF, g-rays, h-rays, or i-rays or visible light are preferably used.

Examples of the exposure method include stepper exposure, exposure using a high-pressure mercury lamp, and the like.

The exposure amount is preferably in a range of 5 mJ/cm$^2$ to 3,000 mJ/cm$^2$, more preferably in a range of 10 mJ/cm$^2$ to 2,000 mJ/cm$^2$, and particularly preferably in a range of 50 mJ/cm$^2$ to 1,000 mJ/cm$^2$.

Examples of a method for the full-surface exposure treatment include a method in which the full surface of the above-described formed film is exposed. In a case in which the near infrared radiation-absorbing composition includes the polymerizable compound, the full-surface exposure accelerates the curing of a polymerizable component in the film formed of the composition, makes the film cured to a greater extent, and improves the mechanical strength and the durability.

An apparatus for carrying out the full-surface exposure is not particularly limited and can be appropriately selected depending on the purpose, and preferred examples thereof include UV steppers such as ultrahigh-pressure mercury lamps.

In addition, examples of the method for the full-surface thermal treatment include a method in which the full surface of the above-described formed film is heated. The heating of the full surface increases the film strength of a pattern.

The heating temperature during the full-surface heating is preferably in a range of 120° C. to 250° C. and more preferably in a range of 120° C. to 250° C. When the heating temperature is 120° C. or higher, the film strength is improved by the heating treatment and, when the heating temperature is 250° C. or lower, components in the film are decomposed and it is possible to prevent the film from becoming weak and brittle.

The heating time in the full-surface heating is preferably in a range of 3 minutes to 180 minutes and more preferably in a range of 5 minutes to 120 minutes.

An apparatus for carrying out the full-surface heating is not particularly limited and can be appropriately selected from well-known apparatuses depending on the purpose, and examples thereof include a drying oven, a hot plate, an IR heater, and the like.

A camera module of the present invention is a camera module having a solid image pickup element substrate and a near infrared radiation cut-off filter disposed on the light-receiving side of the solid image pickup element substrate, in which the near infrared radiation cut-off filter is the above-described near infrared radiation cut-off filter.

In addition, a production method for a camera module of the present invention is a production method for a camera module having a solid image pickup element substrate and a near infrared radiation cut-off filter disposed on the light-receiving side of the solid image pickup element substrate, including a step of forming a film by applying the above-described near infrared radiation-absorbing composition of the present invention to a light-receiving side of a solid image pickup element substrate.

FIG. 1 is a schematic sectional view illustrating the configuration of a camera module having a solid image pickup element substrate and a near infrared radiation cut-off filter disposed on the light-receiving side of the solid image pickup element substrate.

A camera module 10 includes, for example, a solid image pickup element substrate 11, a flattening layer 12 provided on a main surface side (light-receiving side) of the solid image pickup element substrate, a near infrared radiation cut-off filter 13, and a lens holder 15 which is disposed above the near infrared radiation cut-off filter and includes an imaging lens 14 in a space inside thereof.

In the camera module 10, incidence light hv from the outside sequentially passes through the imaging lens 14, the near infrared radiation cut-off filter 13, and the flattening layer 12 and then reaches an imaging element unit in the solid image pickup element substrate 11.

The solid image pickup element 11 includes, for example, the imaging element 16, an interlayer insulating film (not illustrated), a base layer (not illustrated), a color filter 17, an overcoat (not illustrated), and a micro lens 18 in this order on the main surface of a silicon substrate which is a base body. The color filter 17 (a red color filter, a green color filter, or a blue color filter) or the micro lens 18 are respectively disposed so as to correspond to the imaging element 16.

In addition, instead of providing the near infrared radiation cut-off filter 13 on the surface of the flattening layer 12, the near infrared radiation cut-off filter 13 may be provided on the surface of the micro lens 18, between the base layer and the color filter 17, or between the color filter 17 and the overcoat. For example, the near infrared radiation cut-off filter 13 may be provided at a location 2 mm or less (more preferably 1 mm or less) away from the surface of the micro lens. When the near infrared radiation cut-off filter is provided at this location, a step of forming the near infrared radiation cut-off filter can be simplified, and it is possible to sufficiently cut unnecessary near infrared radiation, and thus it is possible to further enhance the near infrared radiation-shielding properties.

The near infrared radiation cut-off filter of the present invention can be subjected to a solder reflow step. When the camera module is produced by means of the solder reflow step, the automatic mounting of electronic component-mounted substrates or the like which requires soldering becomes possible, and it is possible to significantly improve the productivity compared with a case in which the solder reflow step is not used. Furthermore, since the solder reflow step is automatically carried out, it is also possible to reduce the cost. In a case in which the near infrared radiation cut-off filter is subjected to the solder reflow step, the near infrared radiation cut-off filter is exposed to a temperature in a range of approximately 250° C. to 270° C., and thus the near infrared radiation cut-off filter is preferably heat-resistant enough to withstand the solder reflow step (hereinafter, also referred to as the "solder reflowability").

In the present specification, "having solder reflowability" means that the infrared radiation cut-off filter maintains its characteristics before and after being heated at 200° C. for 10 minutes. More preferably, the infrared radiation cut-off filter maintains its characteristics before and after being heated at 230° C. for 10 minutes. Still more preferably, the infrared radiation cut-off filter maintains its characteristics before and after being heated at 250° C. for three minutes. In a case in which the near infrared radiation cut-off filter does not have solder reflowability, when being held under the above-described conditions, there are cases in which the near infrared radiation-absorbing performance of the infrared radiation cut-off filter degrades or the functions become insufficient for films.

In addition, the present invention also relates to a method for producing a camera module including a step of a reflow treatment. Even when the reflow step is provided, the infrared radiation cut-off filter of the present invention is capable of maintaining its near infrared radiation-absorbing performance, and thus there are no cases in which the characteristics of the camera module having reduced size and weight and having improved performance are impaired.

Figure 2:
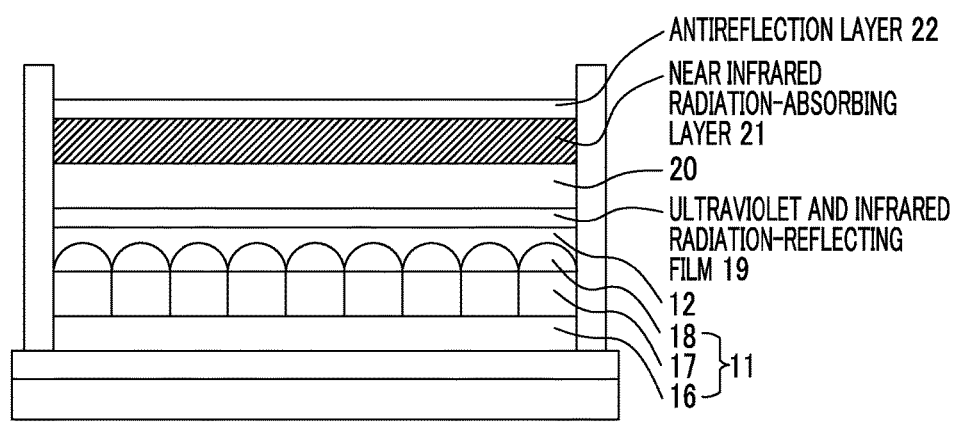
FIG. 2 is a schematic sectional view illustrating an example of a peripheral area of the near infrared radiation cut-off filter in the camera module.
Figure 3:
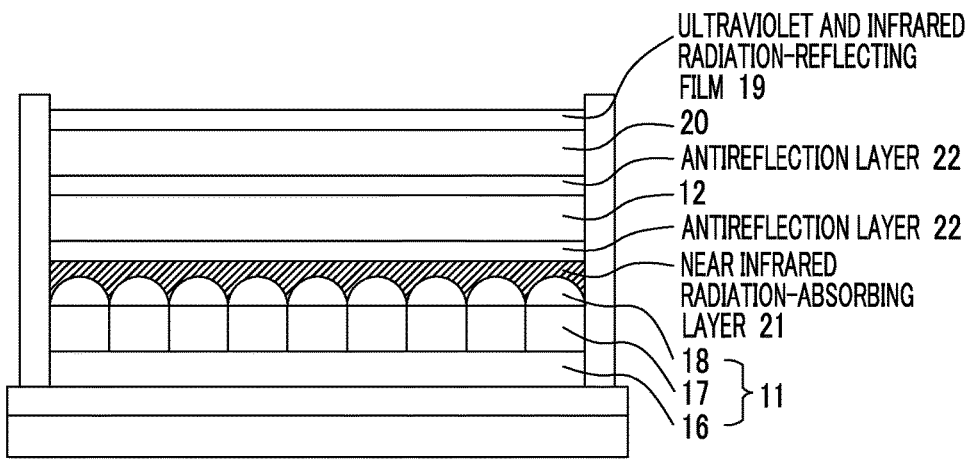
FIG. 3 is a schematic sectional view illustrating an example of the peripheral area of the near infrared radiation cut-off filter in the camera module.
Figure 4:
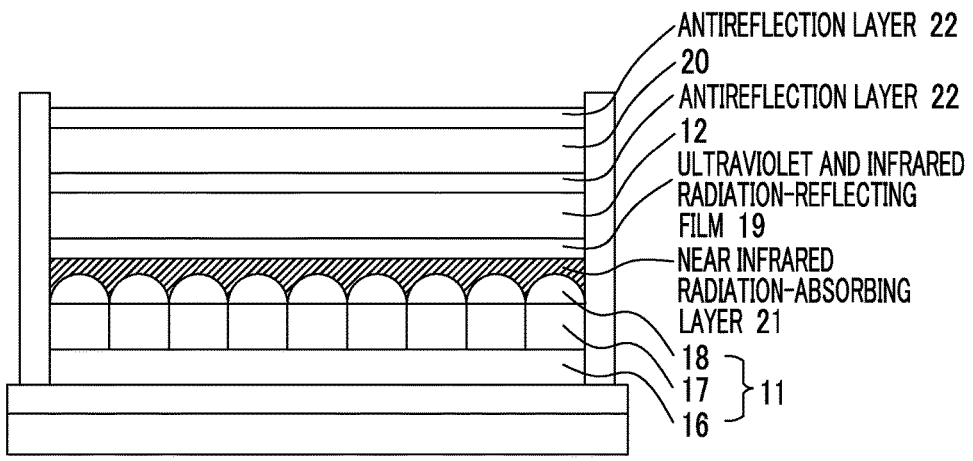
FIG. 4 is a schematic sectional view illustrating an example of the peripheral area of the near infrared radiation cut-off filter in the camera module.

FIGS. 2 to 4 are schematic sectional views illustrating examples of the solid image pickup element substrate and a near infrared radiation cut-off filter peripheral portion in the camera module.

As illustrated in FIG. 2, the camera module may have the solid image pickup element substrate 11, the flattening layer 12, an ultraviolet and infrared radiation-reflecting film 19, a transparent base material 20, a near infrared radiation-absorbing layer 21, and an antireflection layer 22 in this order.

The ultraviolet and infrared light-reflecting film 19 has an effect of imparting and enhancing the functions of the near infrared radiation cut-off filter, and it is possible to refer to, for example, Paragraphs [0033] to [0039] in JP2013-68688A, the content of which is incorporated into the present specification.

The transparent base material 20 transmits light having wavelengths in the visible light range, and it is possible to refer to, for example, Paragraphs [0026] to [0032] in JP2013-68688A, the content of which is incorporated into the present specification.

The near infrared radiation-absorbing layer 21 can be formed by applying the above-described near infrared radiation-absorbing composition of the present invention.

The antireflection layer 22 has a function of preventing the reflection of light incident on the near infrared radiation cut-off filter so as to improve the transmittance and allowing the efficient use of the incidence light, and it is possible to refer to, for example, Paragraph [0040] in JP2013-68688A, the content of which is incorporated into the present specification.

As illustrated in FIG. 3, the camera module may have the solid image pickup element substrate 11, the near infrared radiation-absorbing layer 21, the antireflection layer 22, the flattening layer 12, the antireflection layer 22, the transparent base material 20, and the ultraviolet and infrared light-reflecting film 19 in this order.

As illustrated in FIG. 4, the camera module may have the solid image pickup element substrate 11, the near infrared radiation-absorbing layer 21, the ultraviolet and infrared light-reflecting film 19, the flattening layer 12, the antireflection layer 22, the transparent base material 20, and the antireflection layer 22 in this order.

In addition, the solid image pickup element can also be provided with a constitution of an image pickup element according to any one of the first to fourteenth embodiments described in Sections 0049 and thereafter in WO14/061188A.

EXAMPLES

Hereinafter, the present invention will be more specifically described using examples. Materials, amounts used, proportions, the contents of treatments, the orders of treatments, and the like described in the following examples can be appropriately changed within the scope of the gist of the present invention. Therefore, the scope of the present invention is not limited to specific examples described below. Particularly, unless particularly otherwise described, "%" and "parts" are on the basis of mass.

In the present examples, the following abbreviations were employed.

<Compound (A)>
Compounds A-1 to A-10

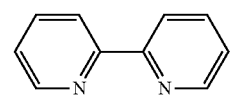

A-1

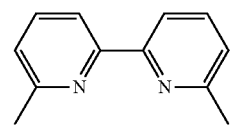

A-2

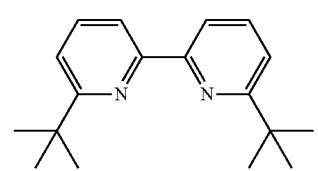

A-3

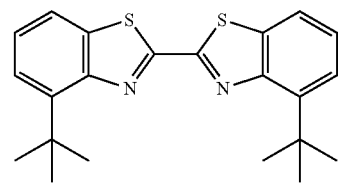

A-4

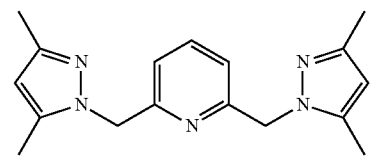

A-5

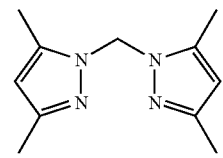

A-6

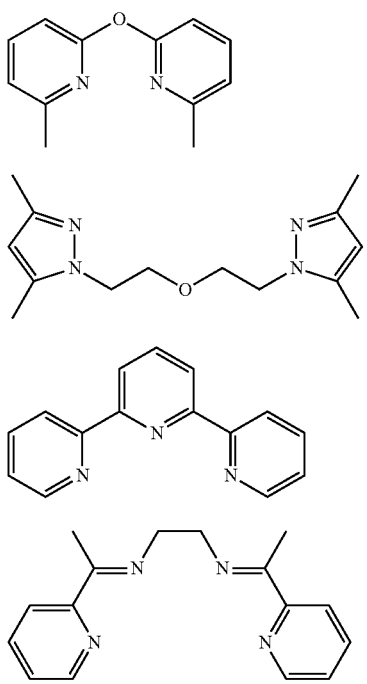

<Curable Compounds>

KAYARAD DPHA: (manufactured by Nippon Kayaku Co., Ltd., a mixture of dipentaerythritol pentaacrylate and dipentaerythritol hexaacrylate)

JER157S65: (manufactured by Mitsubishi Chemical Corporation, special novolac-type epoxy resin)

KAYARAD D-320: (manufactured by Nippon Kayaku Co., Ltd., dipentaerythritol tetraacrylate)

M-510: (manufactured by Toagosei Co., Ltd., polybasic acid-denatured acryl oligomer)

M-520: (manufactured by Toagosei Co., Ltd., polybasic acid-denatured acryl oligomer)

DPCA-60: (manufactured by Nippon Kayaku Co., Ltd., hexafunctional acrylate having six pentyleneoxy chains)

<Solvent>

PGMEA: Propylene glycol monomethyl ether acetate

<Compounds A-1 to A-10>

Compound A-1: 2,2'-bipyridine, manufactured by Tokyo Chemical Industry Co., Ltd.

Compound A-2: 6,6'-dimethyl-2,2'-bipyridine, manufactured by Tokyo Chemical Industry Co., Ltd.

Compound A-3 was synthesized using the method described in Angewandte Chemie-International. Edition, 2008, 47, 8246 to 8250.

Compound A-4 was synthesized using the method described in HELVETICA CHMICA ACTA, 2000, 83, 1161-1167.

Compound A-5 was synthesized using the method described in Journal of Organometallic Chemistry, 2009, 694, 2636 to 2641.

Compound A-6 was synthesized using the method described in POLYHEDRON, 2008, 27, 1432 to 1446.

Compound A-7 was synthesized as described below.

2-Bromo-6-methylpyridine (10 g, 58.1 mol) manufactured by Tokyo Chemical Industry Co., Ltd., 2-hydroxy-6-methyl pyridine (7.6 g, 69.8 mmol) manufactured by Tokyo Chemical Industry Co., Ltd., tetramethylethylenediamine (1.02 g, 8.72 mmol) manufactured by Tokyo Chemical Industry Co., Ltd., potassium carbonate (16.0 g, 116.3 mmol) manufactured by Wako Pure Chemical Industries, Ltd., and copper iodide (0.56 g, 2.91 mmol) manufactured by Wako Pure Chemical Industries, Ltd. were heated and refluxed in DMF (200 mL) for 12 hours. Water was added thereto, and extraction using ethyl acetate, washing with water, and dehydration of magnesium sulfate were carried out. After concentration, column-purification was carried out, and a target substance (4.0 g) was obtained.

400 MHz (CDCl3, 7.60 (2H, t), 6.94 (2H, d), 6.83 (2H, d), 1.59 (6H, s))

Compound A-8 was synthesized using the method described in European Journal of Organic Chemistry, 2007, 30, 5112 to 5116.

Compound A-9: α,α',α"-tripyridyl manufactured by Tokyo Chemical Industry Co., Ltd.

Compound A-10 was synthesized using the method described in European Journal of Inorganic Chemistry, 2004, 12, 2533 to 2541.

Synthesis Example of Copper Component

Copper methane sulfonate was synthesized by reacting methanesulfonic acid (0.1 g, 2.05 mmol) and copper hydroxide (0.197 g, 1.03 mmol) in ethanol at 70° C. for 0.5 hours.

Copper diphenylphosphate was synthesized by reacting diphenylphosphoric acid (0.5 g, 2.29 mmol) and copper acetate (0.21 g, 1.15 mmol) in ethanol at 70° C. for 0.5 hours.

<Synthesis of Copper Complex>

(Synthesis of Copper Complex 1)

Compound A-1 (0.2 g, 1.1 mmol) was dissolved in ethanol (5 ml). After this solution was heated to 70° C., an ethanol solution (5 ml) of copper acetate (0.2 g, 1.1 mmol) was added dropwise thereto, and the components were reacted with each other at 70° C. for two hours. After the end of the reaction, the generated water and a solvent were distilled away using an evaporator, thereby obtaining Copper Complex 1 (0.6 g).

Copper Complexes 2 to 17 were obtained in the same manner as Copper Complex 1 except for the fact that the compound (A) or the copper component was changed as shown in Table 2 below.

Evaluation of Near Infrared Radiation-Absorbing Composition

Preparation of Near Infrared Radiation-Absorbing Composition

Example 1

The following compounds were mixed together, thereby preparing a near infrared radiation-absorbing composition of Example 1.

| | |
|---|---|
| Copper Complex 1 | 20 parts by mass |
| KAYARAD DPHA | 20 parts by mass |
| JER157S65 | 20 parts by mass |
| PGMEA | 120 parts by mass |

Near infrared radiation-absorbing compositions of individual examples and individual comparative examples were prepared by producing the same composition as that of Example 1 except for the fact that Copper Complex 1 was changed to Copper Complexes 2 to 17.

<<Production of Near Infrared Radiation Cut-Off Filter>>

A photoresist was applied onto a glass substrate, and patterning was carried out by means of lithography, thereby forming a dropwise addition region for the near infrared radiation-absorbing composition. Each (3 ml) of the near infrared radiation-absorbing compositions prepared in the examples and the comparative examples was added dropwise thereto. The coated film-attached substrate was left to stand at room temperature for 24 hours so as to be dried, and then the thickness of the coated film was evaluated and was found to be 192 μm.

<<Evaluation of Near Infrared Radiation-Shielding Properties>>

The transmittance at a wavelength of 800 nm of the obtained near infrared radiation cut-off filters were measured using a spectrophotometer U-4100 (manufactured by Hitachi High-Technologies Corporation). The near infrared radiation-shielding properties were evaluated using the following standards.

A: Transmittance at 800 nm≤5%
B: 5%<Transmittance at 800 nm≤7%
C: 7%<Transmittance at 800 nm≤10%
D: 10%<Transmittance at 800 nm <<Evaluation of Heat Resistance>>

The obtained near infrared radiation cut-off filters were left to stand at 200° C. for five minutes. The maximum absorbance (Absλmax) at a wavelength in a range of 700 nm to 1,400 nm and the minimum absorbance (Absλmin) at a wavelength in a range of 400 nm to 700 nm of the near infrared radiation cut-off filters were measured using a spectrophotometer U-4100 (manufactured by Hitachi High-Technologies Corporation) respectively before and after the heat resistance test and the absorbance ratios represented by "Absλmax/Absλmin" were obtained.

The percentages of absorbance ratio change represented by |(the absorbance ratio before the test−the absorbance ratio after the test)/the absorbance ratio before the test×100| (%) were evaluated using the following standards. The results are shown in the following tables.

A: Percentage of absorbance ratio change≤2%
B: 2%<Percentage of absorbance ratio change≤4%
C: 4%<Percentage of absorbance ratio change≤7%
D: 7%<Percentage of absorbance ratio change

TABLE 8

|  | Compound (A) | Copper component | Copper complex | Molar ratio between compound (A) and copper compound | Near infrared radiation-shielding properties | Heat resistance |
|---|---|---|---|---|---|---|
| Example 1 | A-1 | Copper acetate | 1 | 1:1 | A | B |
| Example 2 | A-1 | Copper acetate | 2 | 2:1 | B | B |
| Example 3 | A-1 | Copper chloride | 3 | 1:1 | B | A |
| Example 4 | A-1 | Copper phosphinate | 4 | 1:1 | A | A |
| Example 5 | A-1 | Copper diphenyl phosphate | 5 | 1:1 | A | B |
| Example 6 | A-1 | Copper methansulfonate | 6 | 1:1 | A | A |
| Example 7 | A-2 | Copper methansulfonate | 7 | 1:1 | A | A |
| Example 8 | A-3 | Copper methansulfonate | 8 | 1:1 | A | A |
| Example 9 | A-4 | Copper methansulfonate | 9 | 1:1 | A | A |
| Example 10 | A-5 | Copper methansulfonate | 10 | 1:1 | B | B |
| Example 11 | A-6 | Copper methansulfonate | 11 | 1:1 | A | A |
| Example 12 | A-7 | Copper methansulfonate | 12 | 1:1 | A | A |
| Example 13 | A-8 | Copper methansulfonate | 13 | 1:1 | B | B |
| Example 14 | A-9 | Copper methansulfonate | 14 | 1:1 | B | B |
| Example 15 | A-10 | Copper methansulfonate | 15 | 1:1 | B | B |
| Comparative Example 1 | — | Copper acetate | 16 | — | C | B |
| Comparative Example 2 | — | Copper chloride | 17 | — | C | A |

As is clear from the tables shown above, it was found that the near infrared radiation-absorbing compositions of the examples were capable of enhancing shielding properties in the near infrared range when cured films were produced. Furthermore, it was found that all of the near infrared radiation cut-off filters of the examples had a transmittance of 80% or higher at a wavelength of 550 nm and were capable of enhancing transmitting properties in the visible light range and shielding properties in the near infrared range. In addition, it was also found that the near infrared radiation cut-off filters of the examples were capable of ensuring a wide visible light range with a high transmittance and had excellent spectral characteristics.

On the other hand, it was found that, in the near infrared radiation-absorbing compositions of the comparative examples, the shielding properties were insufficient in the near infrared range when cured films were produced.

In addition, near infrared radiation cut-off filters were obtained in the same manner as in Example 1 except for the fact that the polymerizable compound (KAYARAD DPHA) was changed to KAYARAD D-320, M-510, M-520, or DPCA-60 in the near infrared radiation-absorbing composition of Example 1. In these near infrared radiation cut-off filters as well, it was confirmed that it was possible to enhance the shielding properties in the near infrared range when cured films were produced.

In the near infrared radiation-absorbing compositions of Examples 1 to 15, even in a case in which the compositions were filtered using a DFA4201NXEY (a 0.45 μm nylon filter) manufactured by Nippon Pall Ltd. after being prepared, the same effects could be obtained.

Synthesis of Copper Complex

Synthesis Example of Copper Complex Cu3-6a

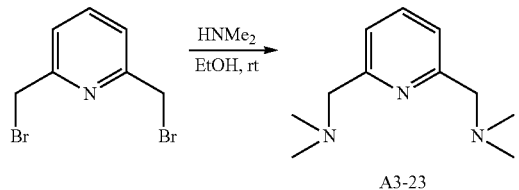

A3-23

2,6-Bis(bromomethyl)pyridine (manufactured by Tokyo Chemical Industry Co., Ltd.) (4.0 g) and a 33% ethanol solution of dimethylamine (manufactured by Sigma-Aldrich Co. LLC.) (30 mL) were introduced into a 200 mL flask, were stirred at room temperature for three hours, and then were left to stand at room temperature for two days. The precipitated white solid (dimethylamine hydrogen bromide salt) was recovered by means of filtration, a rough product obtained by depressurizing and concentrating the filtrate was separated from liquid using an aqueous solution of saturated sodium hydrogen carbonate and ethyl acetate, and the obtained organic phase was preliminarily dried using anhydrous sodium sulfate and then was depressurized and concentrated, thereby obtaining Compound A3-23 (1.0 g).

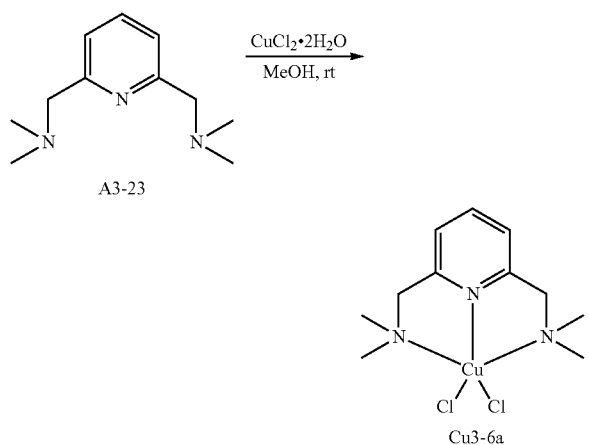

Cu3-6a

Compound A3-23 (38 mg) and methanol (1 mL) were added to a 10 mL flask, copper (II) chloride dihydrate (manufactured by Wako Pure Chemical Industries, Ltd.) (34 mg) was introduced thereinto while stirring the mixture at room temperature, and the components were stirred for 10 minutes. The obtained blue solution was depressurized and solidified, thereby obtaining Copper Complex Cu3-6a in a green solid form.

Synthesis Example of Copper Complex Cu3-7a

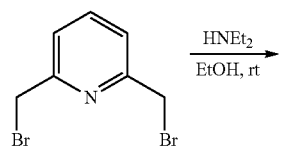

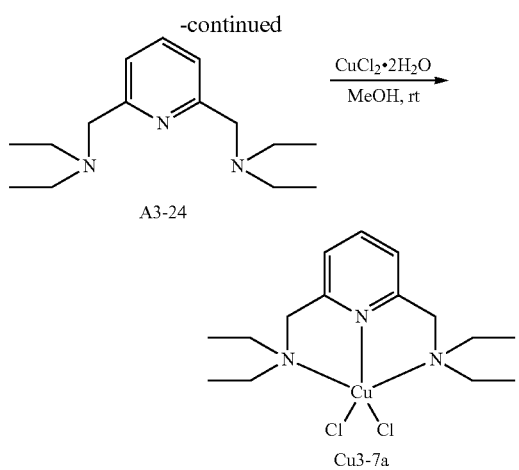

Cu3-7a

A copper complex was synthesized suing the same method as for Copper Complex Cu3-6 according to the above-described scheme.

Synthesis Example of Copper Complex Cu3-10a

Compound A3-43 was synthesized using the method described in the document (J. Organomet. Chem. 2009, 694, 2636) and was made into a copper complex using the same method as for Copper Complex Cu3-6a.

Synthesis Example of Copper Complex Cu3-15a

Compound A3-52 was synthesized using the method described in the document (Tetrahedron 1998, 54, 2365) and was made into a copper complex using the same method as for Copper Complex Cu3-6a.

Synthesis Example of Copper Complex Cu3-16a

Compound A3-54 was made commercially available by Tokyo Chemical Industry Co., Ltd. and was made into a copper complex using the same method as for Copper Complex Cu3-6a.

Synthesis Example of Copper Complex Cu3-35a

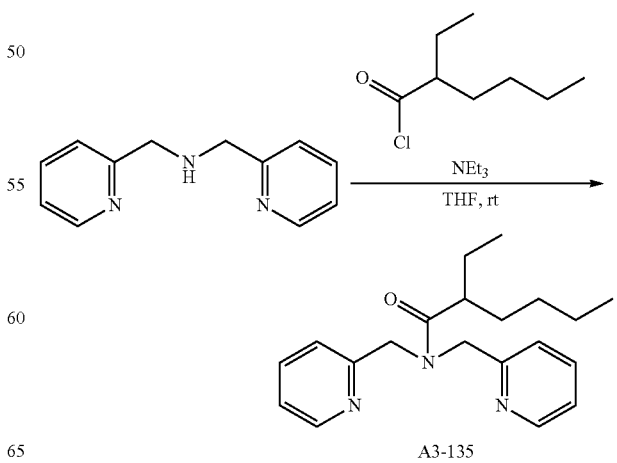

A3-135

Bis(2-pyridylmethyl)amine (19.9 g), trimethylamine (13.3 g), and tetrahydrofuran (150 mL) were introduced into a 300 mL flask and were stirred at room temperature. 2-Ethylhexanoyl chloride (16.5 g) was added dropwise thereto while cooling the mixture with water, and the components were stirred at room temperature for three hours. The mixture was separated from liquid using water and ethyl acetate, and the obtained organic phase was preliminarily dried using anhydrous sodium sulfate and then was depressurized and concentrated. This rough product was purified by means of silica gel chromatography (development solvent: hexane/ethyl acetate), thereby obtaining Compound A3-135 (10 g). The compound was made into a copper complex using the obtained Compound A3-135 and the same method as for Copper Complex Cu3-6a.

Synthesis Example of Copper Complex Cu3-56a

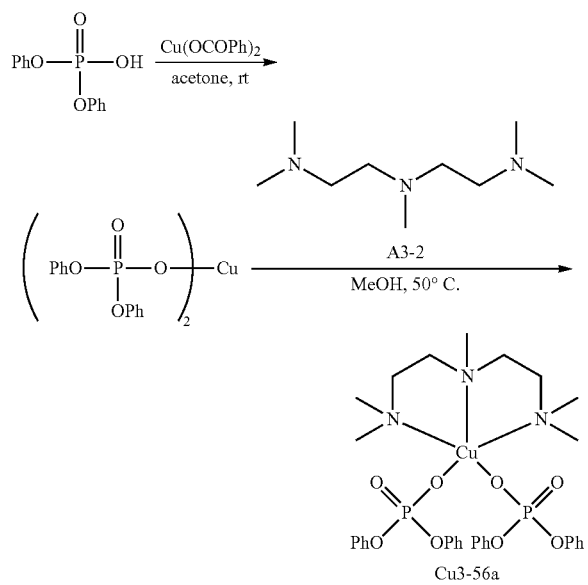

Diphenyl phosphate (manufactured by Tokyo Chemical Industry Co., Ltd.) (2 moles) was added to copper benzoate (manufactured by Kanto Kagaku) (1 mole), the components were stirred in acetone at room temperature for three hours, and then hexane was added thereto, thereby obtaining copper (II) bis(diphenyl phosphate). Copper (II) bis(diphenyl phosphate) was dissolved in methanol, Compound A3-2 (manufactured by Tokyo Chemical Industry Co., Ltd.) (1 mole) was added thereto, and the components were stirred for 10 minutes. The obtained blue solution was depressurized and solidified, thereby obtaining Copper Complex Cu3-56a.

Synthesis Example of Copper Complex Cu3-63a

A copper complex was synthesized suing the same method as for Copper Complex Cu3-35a using copper (II) acetate monohydrate (manufactured by Wako Pure Chemical Industries, Ltd.) instead of copper (II) chloride dihydrate.

Synthesis Example of Copper Complex Cu4-36a

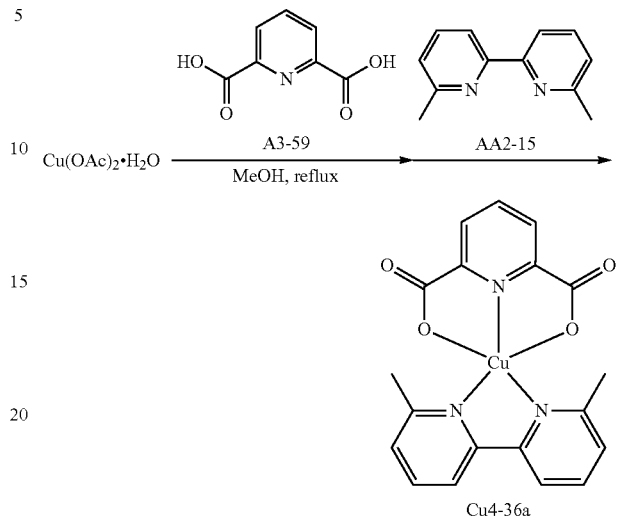

Copper (II) acetate monohydrate (manufactured by Wako Pure Chemical Industries, Ltd.) (1.99 g), Compound A3-59 (manufactured by Wako Pure Chemical Industries, Ltd.) (1.67 g), and methanol (20 mL) were introduced into a 100 mL flask and were heated and refluxed for 10 minutes. Compound AA2-15 (Tokyo Chemical Industry Co., Ltd.) (1.84 g) was added thereto and, furthermore, the components were heated and refluxed for 10 minutes. The solvent was depressurized and concentrated to approximately 5 mL, and the precipitated solid was reformed by means of filtration by adding water (20 mL) thereto, thereby obtaining Copper Complex Cu4-36a in a blue solid form.

Synthesis Example of Copper Complex Cu4-39a

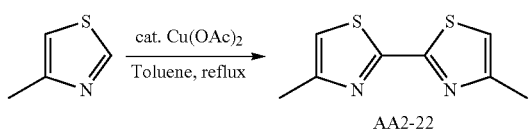

4-Methylthiazole (manufactured by Tokyo Chemical Industry Co., Ltd.) (5.0 g), (anhydrous) copper acetate (manufactured by Wako Pure Chemical Industries, Ltd.) (1.83 g), and toluene (100 mL) were added to a 200 mL flask, and were heated and refluxed for 12 hours. After the components were cooled to room temperature, precipitates were filtered out by adding water, and ethyl acetate was added to the filtrate, thereby separating the filtrate from liquid and extracting the filtrate. The obtained organic phase was preliminarily dried using anhydrous magnesium sulfate, and a brown rough product obtained by depressurizing and concentrating the organic phase (containing a small amount of raw materials) was recrystallized suing methanol, thereby obtaining Compound AA2-22 in a light yellow solid form. The compound was made into a copper complex using the same method as for Copper Complex Cu4-36a.

Synthesis Example of Copper Complex Cu4-45a

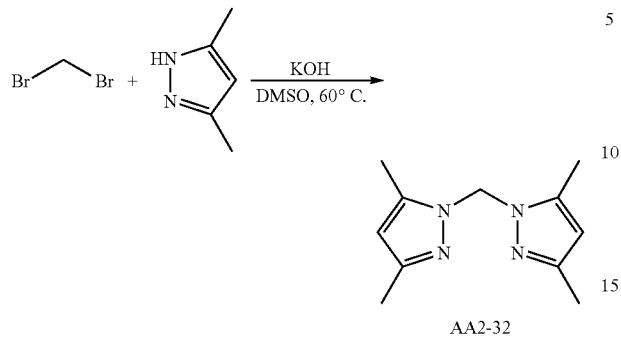

3,5-Dimethylpyrazole (manufactured by Tokyo Chemical Industry Co., Ltd.) (10 g) and dimethyl sulfoxide (60 mL) were added to a 500 ml three-neck flask in a nitrogen atmosphere, and the components were stirred. Potassium hydroxide (manufactured by Wako Pure Chemical Industries, Ltd.) (23.3 g) was added thereto little by little, and the components were stirred at 60 degrees for one hour. Dibromomethane (Dibromomethane (manufactured by Wako Pure Chemical Industries, Ltd.) (9 g) dissolved in dimethyl sulfoxide (40 mL) was added dropwise thereto, and the components were stirred at 60 degrees for four hours. After the mixture was cooled to room temperature, water (200 mL) was added dropwise thereto, an organic phase obtained by means of extraction using chloroform and washing using water and saturated saline water was depressurized and concentrated, thereby obtaining Compound AA2-32 in a white solid form. The compound was made into a copper complex using the same method as for Copper Complex Cu4-36a.

Synthesis Example of Copper Complex Cu4-49a

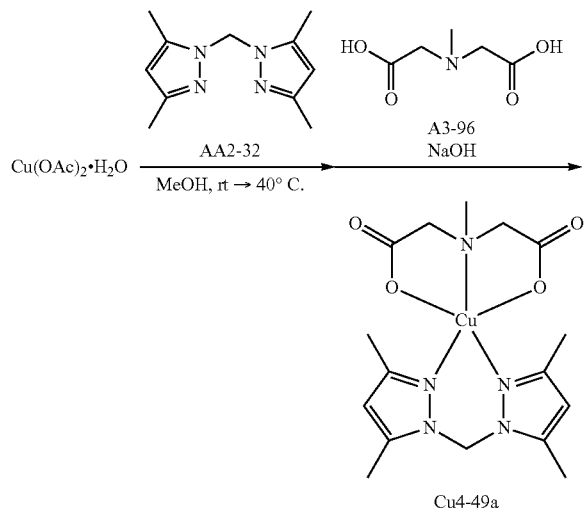

Compound A2-32 (0.20 g), copper (II) acetate monohydrate (manufactured by Wako Pure Chemical Industries, Ltd.) (0.19 g), and methanol (10 mL) were added to a 100 ml flask, the components were heated from room temperature to 40 degrees under stirring and were stirred for 30 minutes. After the components were slowly dissolved so as to form a blue solution, a methanol solution (10 mL) in which Compound A3-96 (manufactured by Tokyo Chemical Industry Co., Ltd.) (0.15 g) and an aqueous solution of 50% by mass of sodium hydroxide (0.16 g) were dissolved was added dropwise thereto. A slowly-precipitated whitish blue solid was collected by means of filtration, thereby obtaining Copper Complex Cu4-49a (0.16 g).

Synthesis Example of Copper Complex Cu4-50a

A copper complex was synthesized using Compound A3-97 which was made commercially available by Wako Pure Chemical Industries, Ltd. and the same method as for Copper Complex Cu4-49a.

Synthesis Example of Copper Complex Cu4-52a

A copper complex was synthesized using Compound A3-103 which was made commercially available as 4-hydroxypyridine-2,6-dicarboxylic acid monohydrate by Tokyo Chemical Industry Co., Ltd. and the same method as for Copper Complex Cu4-49a.

Synthesis Example of Copper Complex Cu4-55a

Compound AA2-36 synthesized using 3,5-diisopropylpyrazole (manufactured by Tokyo Chemical Industry Co., Ltd.) instead of 3,5-dimethylpyrazole and the same method as for Compound AA2-32 was made into a copper complex using the same method as for Copper Complex Cu4-36a.

Synthesis Example of Copper Complex Cu4-62a

Compound AA2-26 synthesized using 3,5-diisopropylpyrazole (manufactured by Tokyo Chemical Industry Co., Ltd.) instead of 3,5-dimethylpyrazole, 2-chloromethyl pyridine hydrochloride (manufactured by Tokyo Chemical Industry Co., Ltd.) instead of dibromomethane, and the same method as for Compound AA2-32 was made into a copper complex using the same method as for Copper Complex Cu4-36a.

Synthesis Example of Copper Complex Cu4-63a

A copper complex was synthesized using Compound AA2-28 which was made commercially available by Tokyo Chemical Industry Co., Ltd. and the same method as for Copper Complex Cu4-36a.

Synthesis Example of Copper Complex Cu5-1a

Compound A4-1 (manufactured by Tokyo Chemical Industry Co., Ltd.) and copper (II) chloride dihydrate (manufactured by Wako Pure Chemical Industries, Ltd.) were mixed together in methanol in a molar ratio of 1:1, and a reaction liquid obtained by stirring the mixture for ten minutes was depressurized and solidified, thereby obtaining Copper Complex Cu5-1a.

Synthesis Example of Copper Complex Cu5-18a

A copper complex was synthesized using Compound A4-61 (manufactured by Tokyo Chemical Industry Co., Ltd.) and the same method as for Copper Complex Cu5-1a.

Synthesis Example of Copper Complex Cu5-20a

A copper complex was synthesized using Compound A4-63 (manufactured by Tokyo Chemical Industry Co., Ltd.) and the same method as for Copper Complex Cu5-1a.

Synthesis Example of Copper Complex Cu5-22a

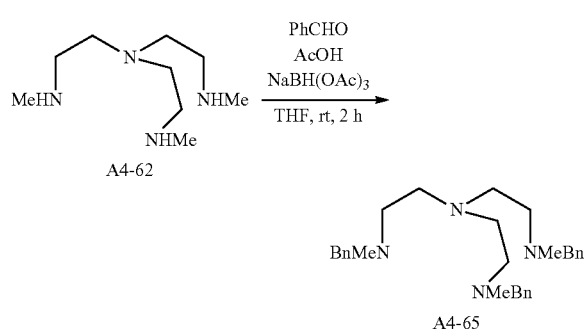

Compound 4-62 (0.93 g), tetrahydrofuran (30 mL), benzaldehyde (2.34 g), and acetic acid (0.90 g) were added to a 100 ml three-neck flask in a nitrogen atmosphere, and the components were stirred at 0 degrees. Sodium triacetoxyborohydride (manufactured by Tokyo Chemical Industry Co., Ltd.) (3.78 g) was added thereto, and the components were stirred at room temperature for two hours. After water (50 mL) was added dropwise thereto, concentrated hydrochloric acid was added thereto little by little so as to obtain a pH of equal to or smaller than 10, separation and extraction were carried out three times using ethyl acetate (50 mL), thereby collecting a water phase. An aqueous solution of 50% by weight of sodium hydroxide was added to this water phase little by little so as to obtain a pH of equal to or smaller than 1, separation and extraction were carried out three times using ethyl acetate (50 mL), thereby collecting an organic phase. The organic phase was preliminarily dried using anhydrous magnesium sulfate and then was depressurized and concentrated, thereby obtaining Compound 4-65 (1.90 g) in a light yellow oil form. Copper Complex Cu5-22a was synthesized using Compound A4-65 and the same method as for Cu5-1a.

Synthesis Example of Copper Complex Cu5-37a

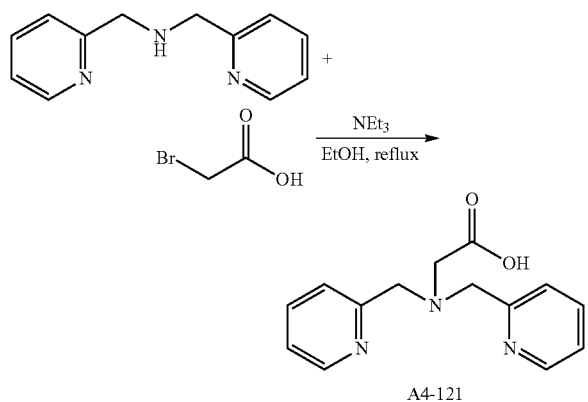

Bis(2-pyridylmethyl)amine (manufactured by Tokyo Chemical Industry Co., Ltd.) (1.99 g), ethanol (20 mL), and trimethylamine (1.01 g) were added to a 100 mL flask, bromoacetate (manufactured by Kanto Kagaku) (1.49 g) was added dropwise thereto while stirring the components at room temperature, and then the components were heated and refluxed for five hours. After the components were cooled to room temperature, a solid precipitated by adding ethyl acetate to a rough product obtained by depressurizing and concentrating a reaction liquid was dispersed and washed using methanol and was filtered, thereby obtaining Compound A4-121 (0.5 g). This compound was made into a complex using the same method as for Copper Complex Cu5-1a.

Synthesis Example of Copper Complex Cu5-46a

Compound A4-1 (manufactured by Tokyo Chemical Industry Co., Ltd.) and copper (II) sulfate pentahydrate (manufactured by Wako Pure Chemical Industries, Ltd.) were mixed together in methanol in a molar ratio of 1:1, and the components were stirred for 30 minutes. Ethyl acetate was added to this reaction liquid, and the precipitated solid was collected by means of filtration, thereby obtaining Copper Complex Cu5-46a.

Synthesis Example of Copper Complex Cu5-50a

A copper complex was synthesized using Compound A4-61 (manufactured by Tokyo Chemical Industry Co., Ltd.) and the same method as for Copper Complex Cu5-46a.

Synthesis Example of Copper Complex Cu5-51a

A copper complex was synthesized using Compound A4-62 (manufactured by Sigma-Aldrich Co. LLC.) and the same method as for Copper Complex Cu5-46a.

Synthesis Example of Copper Complex Cu5-52a

A copper complex was synthesized using Compound A4-63 (manufactured by Tokyo Chemical Industry Co., Ltd.) and the same method as for Copper Complex Cu5-46a.

Synthesis Example of Copper Complex Cu5-72a

Copper Complex Cu5-1a was dissolved in water, and an aqueous solution of an excess amount of saturated sodium tetrafluoroborate (manufactured by Wako Pure Chemical Industries, Ltd.) was added thereto under stirring. A precipitated solid was collected by means of filtration, thereby obtaining Copper Complex Cu5-72a.

Synthesis Example of Copper Complex Cu5-82a

A copper complex was synthesized using Compound A4-62 (manufactured by Sigma-Aldrich Co. LLC.) instead of Copper Complex Cu5-1a, lithium tetrakis(pentafluorophenyl)borate (manufactured by Tokyo Chemical Industry Co., Ltd.) instead of sodium tetrafluoroborate, and the same method as for Copper Complex Cu5-72a.

Synthesis Example of Copper Complex Cu5-83a

A copper complex was synthesized using Compound A4-63 (manufactured by Tokyo Chemical Industry Co., Ltd.) and the same method as for Copper Complex Cu5-82a.

Synthesis Example of Copper Complex Cu5-92a

Copper Complex Cu5-92a was synthesized using lithium bis(trifluoromethanesulfone)imide instead of sodium tetrafluoroborate and the same method as for Copper Complex Cu5-72a.

Synthesis Example of Copper Complex Cu5-95a

A copper complex was synthesized using Compound A4-63 (manufactured by Tokyo Chemical Industry Co., Ltd.) and the same method as for Copper Complex Cu5-92a.

Synthesis Example of Copper Complex Cu5-96a

A copper Complex was synthesized using copper (II) bromide (manufactured by Kanto Kagaku) instead of copper (II) chloride dihydrate and the same method as for Copper Complex Cu5-18a.

Synthesis Example of Copper Complex Cu5-97a

A copper complex was synthesized using Compound A4-188 (manufactured by Sigma-Aldrich Co. LLC.) and the same method as for Copper Complex Cu5-82a.

Synthesis Example of Copper Complex Cu5-98a

Copper Complex Cu5-98a was synthesized using potassium tris(trifluoromethanesulfonyl)methide instead of lithium tetrakis(pentafluorophenyl)borate and the same method as for Copper Complex Cu5-83a.

Synthesis Example of Copper Complex Cu5-99a

Copper Complex Cu5-99a was synthesized using copper (II) acetate monohydrate instead of copper (II) chloride dihydrate and the same method as for Copper Complex Cu5-83a.

Synthesis Example of Copper Complex Cu5-100a

Copper Complex Cu5-100a was synthesized using copper (II) bromide instead of copper (II) chloride dihydrate and the same method as for Copper Complex Cu5-83a.

Synthesis Example of Copper Complex Cu5-101a

Copper Complex Cu5-101a was synthesized by reacting 1 equivalent of trifluoromethansuulfoneamide (manufactured by Wako Pure Chemical Industries, Ltd.) with Cu5-46a and precipitating a complex using the same method as for Cu5-80a.

Synthesis Example of Copper Complex Cu5-102a

Copper Complex Cu5-102a was synthesized using copper (II) acetate monohydrate instead of copper (II) chloride dihydrate and the same method as for Copper Complex Cu5-82a.

Synthesis Example of Copper Complex Cu5-103a

Copper Complex Cu5-103a was synthesized using copper (II) benzoate instead of copper (II) chloride dihydrate and the same method as for Copper Complex Cu5-82a.

Synthesis Example of Copper Complex Cu5-104a

Copper Complex Cu5-104a was synthesized by adding lithium bis(trifluoromethanesulfone)imde with an aqueous solution of Cu5-46a so as to precipitate a complex.

Synthesis Example of Copper Complex Cu5-105a

Copper Complex Cu5-105a was synthesized using Compound A4-65 and the same method as for Cu5-72a.

Synthesis Example of Copper Complex Cu5-106a

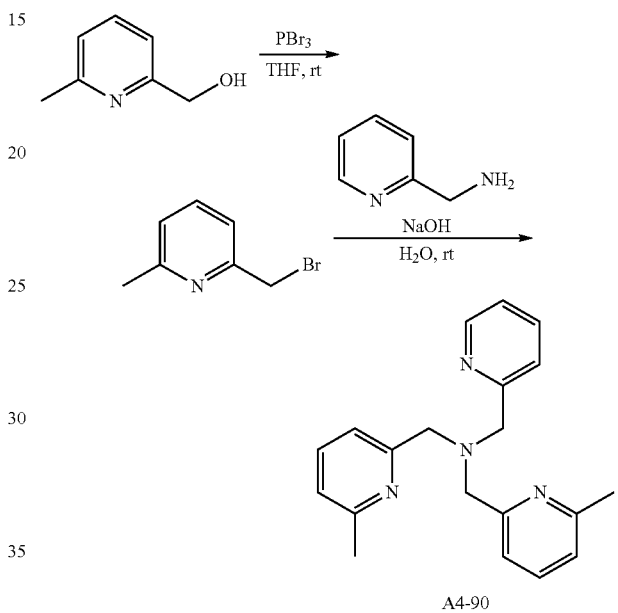

A4-90

6-Methyl-2-pyrizine methanol (manufactured by Tokyo Chemical Industry Co., Ltd.) (12 g) and tetrahydrofuran (100 mL) were added to a 300 mL three-neck flask in a nitrogen atmosphere, and the components were stirred at room temperature. After phosphorus tribromide (manufactured by Tokyo Chemical Industry Co., Ltd.) (25 g) was added dropwise thereto under ice cooling, the components were stirred all night at room temperature. An organic phase obtained by adding an aqueous solution of saturated ammonium chloride and ethyl acetate and separating the mixture from liquid and extracting the mixture was concentrated and generated by means of silica gel chromatography (development solvent: hexane/ethyl acetate), thereby obtaining 6-methyl-2-(bromomethyl)pyridine in a light yellow oil form.

The synthesized 6-methyl-2-(bromomethyl)pyridine (1.86 g) and water (10 mL) were added to a 100 mL flask, water (10 mL) was added thereto, and the components were stirred at 0 degrees. 2-Pyridylmethylamine (1.08 g) was added thereto, and the components were stirred at 0 degrees. An aqueous solution of 1 M sodium hydroxide (2 mL) was added thereto, and the components were stirred at room temperature all night. An organic phase obtained by adding water and chloroform and separating the mixture from liquid and extracting the mixture was washed with water three times, was preliminarily dried using anhydrous sodium sulfate and then was depressurized and concentrated, thereby obtaining Compound A4-90 in a light yellow solid form.

Copper Complex Cu5-106a was synthesized using Compound A4-90 and the same method as for Copper Complex Cu5-1a.

Synthesis Example of Copper Complex Cu5-117a

Copper Complex Cu5-117a was synthesized using Compound A4-29 synthesized using the method described in the document (Eur. J. Inorg. Chem. 2009, 3921) and the same method as for Copper Complex Cu5-72a.

Synthesis Example of Copper Complex Cu5-118a

Copper Complex Cu5-118a was synthesized using Compound A4-65 and the same method as for Copper Complex Cu5-82a.

Synthesis Example of Copper Complex Cu5-119a

Copper Complex Cu5-119a was synthesized using Compound A4-65 and the same method as for Copper Complex Cu5-46a.

<Measurement of Maximum Absorption Wavelength, Molar Absorption Coefficient, and Gram Absorption Coefficient of Copper Complex>

Each of the copper complexes was dissolved in a solvent shown in the following table, thereby preparing a solution having a concentration of 1 g/L. Next, the absorption spectrum of the solution in which the copper complex was dissolved was measured using UV-1800 manufactured by Shimadzu Corporation, the maximum absorption wavelength, the molar absorption coefficient and gram absorption coefficient at the maximum absorption wavelength, and the molar absorption coefficient and gram absorption coefficient at 800 nm were measured. Meanwhile, in the table, DMF represents N,N-dimethylformamide, and MFG represents propylene glycol monomethyl ether.

—Evaluation Standards of Maximum Absorption Wavelength—

A: The maximum absorption wavelength was present in a wavelength range of 700 nm to 1,200 nm B: The maximum absorption wavelength was present in a wavelength range of lower than 700 nm and higher than 1,200 nm

TABLE 9

| Copper complex | Maximum absorption wavelength (nm) | Evaluation | Absorption coefficient at maximum absorption wavelength | | Absorption coefficient at 800 nm | | Measurement solvent |
|---|---|---|---|---|---|---|---|
| | | | Molar absorption coefficient (L/mol · cm) | Gram absorption coefficient (L/g · cm) | Molar absorption coefficient (L/mol · cm) | Gram absorption coefficient (L/g · cm) | |
| Cu3-6a | 780 | A | 249 | 0.725 | 244 | 0.710 | DMF |
| Cu3-7a | 802 | A | 257 | 0.626 | 257 | 0.626 | DMF |
| Cu3-10a | 786 | A | 178 | 0.327 | 176 | 0.323 | DMF |
| Cu3-15a | 890 | A | 170 | 0.369 | 134 | 0.291 | DMF |
| Cu3-16a | 936 | A | 426 | 1.556 | 316 | 1.154 | DMF |
| Cu3-35a | 836 | A | 186 | 0.394 | 181 | 0.383 | DMF |
| Cu3-56a | 740 | A | 189 | 0.236 | 173 | 0.216 | DMF |
| Cu3-63a | 708 | A | 180 | 0.355 | 105 | 0.207 | DMF |
| Cu4-36a | 748 | A | 124 | 0.305 | 107 | 0.263 | DMF |
| Cu4-39a | 760 | A | 126 | 0.291 | 113 | 0.261 | DMF |
| Cu4-45a | 756 | A | 123 | 0.284 | 110 | 0.254 | DMF |
| Cu4-49a | 730 | A | 139 | 0.337 | 107 | 0.259 | $H_2O$ |
| Cu4-50a | 726 | A | 118 | 0.241 | 84 | 0.172 | $H_2O$ |
| Cu4-52a | 756 | A | 121 | 0.268 | 106 | 0.235 | DMF |
| Cu4-55a | 754 | A | 116 | 0.213 | 104 | 0.191 | DMF |
| Cu4-62a | 756 | A | 121 | 0.252 | 108 | 0.225 | DMF |
| Cu4-63a | 754 | A | 120 | 0.291 | 106 | 0.257 | DMF |
| Cu5-1a | 950 | A | 186 | 0.429 | 97 | 0.224 | MFG |
| Cu5-18a | 892 | A | 101 | 0.361 | 92 | 0.329 | MFG |
| Cu5-20a | 932 | A | 450 | 1.233 | 197 | 0.540 | MFG |
| Cu5-22a | 930 | A | 695 | 1.171 | 294 | 0.495 | MFG |
| Cu5-37a | 896 | A | 158 | 0.446 | 135 | 0.381 | DMF |
| Cu5-46a | 874 | A | 197 | 0.421 | 163 | 0.348 | $H_2O$ |
| Cu5-50a | 858 | A | 133 | 0.409 | 122 | 0.375 | $H_2O$ |
| Cu5-51a | 860 | A | 245 | 0.670 | 217 | 0.593 | $H_2O$ |
| Cu5-52a | 878 | A | 462 | 1.132 | 349 | 0.855 | $H_2O$ |
| Cu5-72a | 954 | A | 191 | 0.401 | 99 | 0.208 | MFG |
| Cu5-82a | 920 | A | 195 | 0.202 | 135 | 0.140 | MFG |
| Cu5-83a | 944 | A | 458 | 0.454 | 192 | 0.190 | MFG |
| Cu5-92a | 968 | A | 217 | 0.323 | 111 | 0.165 | MFG |
| Cu5-95a | 936 | A | 524 | 0.861 | 229 | 0.376 | MFG |
| Cu5-96a | 862 | A | 121 | 0.327 | 112 | 0.303 | $H_2O$ |
| Cu5-97a | 882 | A | 156 | 0.149 | 132 | 0.126 | MFG |
| Cu5-98a | 936 | A | 605 | 0.817 | 262 | 0.354 | MFG |
| Cu5-99a | 874 | A | 383 | 0.380 | 299 | 0.297 | MFG |
| Cu5-100a | 970 | A | 411 | 0.390 | 164 | 0.156 | MFG |
| Cu5-101a | 876 | A | 189 | 0.160 | 162 | 0.137 | MFG |
| Cu5-102a | 886 | A | 156 | 0.143 | 131 | 0.120 | MFG |
| Cu5-103a | 882 | A | 171 | 0.149 | 145 | 0.126 | MFG |
| Cu5-104a | 880 | A | 452 | 0.518 | 341 | 0.391 | MFG |
| Cu5-105a | 934 | A | 737 | 1.144 | 301 | 0.467 | MFG |
| Cu5-106a | 700 | A | 141 | 0.312 | 134 | 0.297 | MFG |

TABLE 9-continued

| Copper complex | Maximum absorption wavelength Maximum absorption wavelength (nm) | Evaluation | Absorption coefficient at maximum absorption wavelength | | Absorption coefficient at 800 nm | | Measurement solvent |
|---|---|---|---|---|---|---|---|
| | | | Molar absorption coefficient (L/mol · cm) | Gram absorption coefficient (L/g · cm) | Molar absorption coefficient (L/mol · cm) | Gram absorption coefficient (L/g · cm) | |
| Cu5-117a | 724 | A | 159 | 0.302 | 143 | 0.272 | DMF |
| Cu5-118a | 936 | A | 708 | 0.573 | 286 | 0.231 | MFG |
| Cu5-119a | 872 | A | 660 | 1.037 | 498 | 0.782 | H$_2$O |

Examples 101 to 145

The following compounds were mixed together, thereby preparing near infrared radiation-absorbing compositions of Examples 101 to 145.

| | |
|---|---|
| Copper Complex shown in Table 10 | 20 parts by mass |
| KAYARAD DPHA | 20 parts by mass |
| JER157S65 | 20 parts by mass |
| PGMEA | 120 parts by mass |

<Production of Near Infrared Radiation Cut-Off Filter>

Near infrared radiation cut-off filters were produced using the near infrared radiation-absorbing compositions.

A photoresist was applied onto a glass substrate, and patterning was carried out by means of lithography so as to form partition walls for the photoresist, thereby forming a dropwise addition region for the near infrared radiation-absorbing composition. Each (3 ml) of the near infrared radiation-absorbing compositions was added dropwise to the dropwise addition region on the glass substrate and was left to stand at room temperature for 24 hours so as to be dried. The film thickness of the dried coated film was evaluated and was found to be 100 μm.

<Evaluation of Near Infrared Radiation Shielding Properties>

The transmittances at a wavelength of 800 nm of the near infrared radiation cut-off filters obtained as described above were measured using a spectrophotometer U-4100 (manufactured by Hitachi High-Technologies Corporation). The near infrared radiation shielding properties were evaluated using the following standards. The results are shown in the following table.

A: Transmittance at 800 nm≤5%

B: 5%<Transmittance at 800 nm≤25%

C: 25%<Transmittance at 800 nm

<Evaluation of Visible Light-Transmitting Properties>

The transmittances at a wavelength of 550 nm of the near infrared radiation cut-off filters obtained as described above were measured using a spectrophotometer U-4100 (manufactured by Hitachi High-Technologies Corporation). The visible light-transmitting properties were evaluated using the following standards. The results are shown in the following table.

A: 85%≤Transmittance at a wavelength of 550 nm

B: 45%≤Transmittance at a wavelength of 550 nm<85%

C: Transmittance at a wavelength of 550 nm<45%

TABLE 10

| | Copper complex | Visible light-transmitting properties | Near infrared radiation-shielding properties |
|---|---|---|---|
| Example 101 | Cu3-6a | A | A |
| Example 102 | Cu3-7a | B | A |
| Example 103 | Cu3-10a | A | A |
| Example 104 | Cu3-15a | A | A |
| Example 105 | Cu3-16a | A | A |
| Example 106 | Cu3-35a | A | A |
| Example 107 | Cu3-56a | A | B |
| Example 108 | Cu3-63a | B | B |
| Example 109 | Cu4-36a | A | A |
| Example 110 | Cu4-39a | A | A |
| Example 111 | Cu4-45a | A | A |
| Example 112 | Cu4-49a | B | A |
| Example 113 | Cu4-52a | A | B |
| Example 114 | Cu4-62a | A | B |
| Example 115 | Cu4-63a | A | A |
| Example 116 | Cu5-1a | A | B |
| Example 117 | Cu5-20a | A | A |
| Example 118 | Cu5-37a | A | A |
| Example 119 | Cu5-48a | A | A |
| Example 120 | Cu5-50a | B | A |
| Example 121 | Cu5-51a | B | A |
| Example 122 | Cu5-52a | A | A |
| Example 123 | Cu5-72a | A | B |
| Example 124 | Cu5-82a | A | B |
| Example 125 | Cu5-83a | A | B |
| Example 126 | Cu5-92a | A | B |
| Example 127 | Cu5-95a | A | A |
| Example 128 | Cu5-96a | A | A |
| Example 129 | Cu5-97a | A | B |
| Example 130 | Cu5-98a | A | A |
| Example 131 | Cu5-99a | A | A |
| Example 132 | Cu5-100a | A | B |
| Example 133 | Cu5-101a | A | B |
| Example 134 | Cu5-102a | A | B |
| Example 135 | Cu5-103a | A | B |
| Example 136 | Cu5-104a | A | A |
| Example 137 | Cu5-105a | A | A |
| Example 138 | Cu5-106a | B | A |
| Example 139 | Cu5-117a | A | A |
| Example 140 | Cu5-118a | A | B |
| Example 141 | Cu5-119a | A | A |
| Example 142 | Cu5-22a | A | A |
| Example 143 | Cu4-50a | B | B |
| Example 144 | Cu4-55a | A | B |
| Example 145 | Cu5-18a | B | A |

As shown in the table described above, it was found that the near infrared radiation-absorbing compositions of Examples 101 to 145 were capable of enhancing shielding properties in the near infrared range when cured films were produced. Furthermore, the visible light-transmitting properties were also favorable.

In the near infrared radiation-absorbing compositions of Examples 101 to 145, in a case in which each of the compositions was filtered using a DFA4201NXEY (a 0.45

μm nylon filter) manufactured by Nippon Pall Ltd. after being prepared, the same effects can be obtained.

EXPLANATION OF REFERENCES

10: camera module
11: solid image pickup element substrate
12: flattening layer
13: near infrared radiation cut-off filter
14: imaging lens
15: lens holder
16: imaging element
17: color filter
18: micro lens
19: ultraviolet and infrared radiation-reflecting film
20: transparent base material
21: near infrared radiation-absorbing layer
22: antireflection layer

What is claimed is:

1. A near infrared radiation-absorbing composition comprising:
a copper complex formed by reacting a compound (A) having two or more coordinating atoms that form bonds using unshared electron pairs with a copper component, wherein:
in the compound (A), the coordinating atoms that form bonds using the unshared electron pairs are at least one selected from an oxygen atom, a nitrogen atom and a phosphorus atom;
in the compound (A), the number of atoms that link two coordinating atoms is in a range of 1 to 3; and
the compound (A) is a compound represented by at least one of general formulas (IV-1), (IV-2) and (IV-11) to (IV-20):

$$Y^3\text{-}L^2\text{-}Y^4\text{-}L^3\text{-}Y^5 \quad \text{(IV-1)}$$

$$Y^6\text{-}L^6\text{-}Y^7\text{-}L^7\text{-}Y^8\text{-}L^8\text{-}Y^9 \quad \text{(IV-2)}$$

wherein $Y^3$, $Y^5$, $Y^6$ and $Y^9$ each independently represents a group made of a ring including the coordinating atom or at least one selected from Group (UE);
$Y^4$, $Y^7$ and $Y^8$ each independently represents a group made of a ring including the coordinating atom or at least one selected from Group (UE-1);
$L^2$, $L^3$, $L^6$, $L^7$ and $L^8$ each independently represents a single bond or a divalent linking group;

(IV-11)

(IV-12)

(IV-13)

(IV-14)
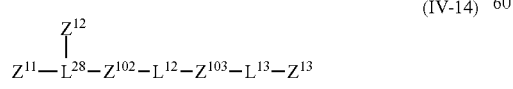

(IV-15)
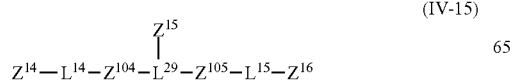

-continued

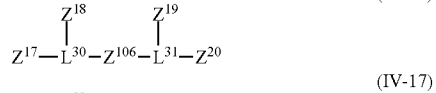
(IV-16)

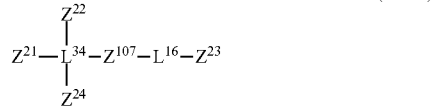
(IV-17)

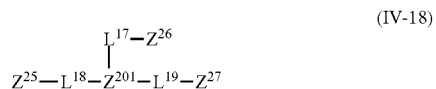
(IV-18)

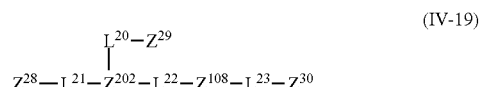
(IV-19)

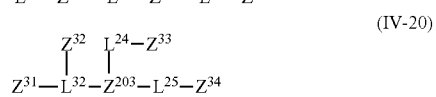
(IV-20)

wherein $Z^1$ to $Z^{34}$ each independently represents a group made of a ring including the coordinating atom or at least one selected from Group (UE);
$Z^{101}$ to $Z^{108}$ each independently represents a group made of a ring including the coordinating atom or at least one selected from Group (UE-1);
$Z^{201}$ to $Z^{203}$ each independently represents at least one selected from Group (UE-2);
$L^{11}$ to $L^{25}$ each independently represents a single bond or a divalent linking group;
$L^{26}$ to $L^{32}$ each independently represents a trivalent linking group;
$L^{33}$ and $L^{34}$ each independently represents a tetravalent linking group;

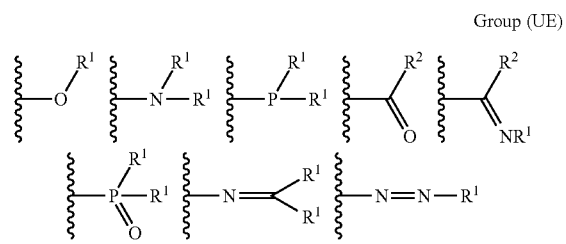

Group (UE)

wherein wavy lines represent bonding positions to atomic groups that constitute the compound (A), each $R^1$ independently represents a hydrogen atom, an alkyl group, an alkenyl group, an alkynyl group, an aryl group or a heteroaryl group, and each $R^2$ independently represents a hydrogen atom, an alkyl group, an alkenyl group, an alkynyl group, an aryl group, a heteroaryl group, an alkoxy group, an aryloxy group, a heteroaryloxy group, an alkylthio group, an arylthio group, a heteroarylthio group, an amino group or an acyl group;

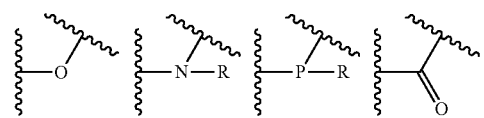

Group (UE-1)

-continued

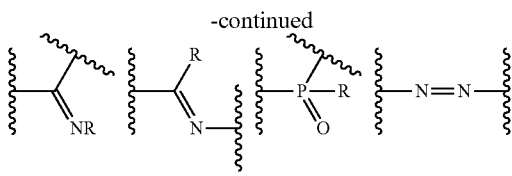

wherein wavy lines represent bonding positions to atomic groups that constitute the compound (A), and each R independently represents a hydrogen atom, an alkyl group, an alkenyl group, an alkynyl group, an aryl group or a heteroaryl group; and Group (UE-2)

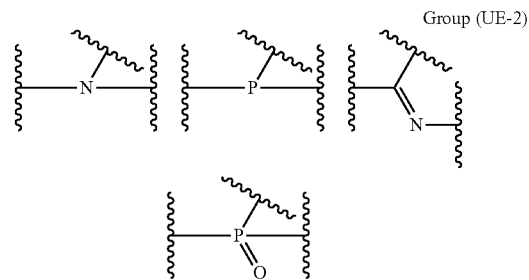

wherein wavy lines represent bonding positions to atomic groups that constitute the compound (A).

2. The near infrared radiation-absorbing composition according to claim 1,
wherein, in the copper complex, a 5-membered ring and/or a 6-membered ring is formed of copper and the compound (A).

3. The near infrared radiation-absorbing composition according to claim 1,
wherein the compound (A) has 2 to 5 coordinating atoms that form bonds using unshared electron pairs.

4. The near infrared radiation-absorbing composition according to claim 1,
wherein the molecular weight of the compound (A) is in the range of 50 to 1,000.

5. The near infrared radiation-absorbing composition according to claim 1,
wherein the compound (A) is represented by General Formula (IV-18).

6. The near infrared radiation-absorbing composition according to claim 1,
wherein the compound (A) is a compound including a 5-membered ring or a 6-membered ring, and coordinating atoms that form bonds using the unshared electron pairs constitute the 5-membered ring or the 6-membered ring.

7. The near infrared radiation-absorbing composition according to claim 1,
wherein the coordinating atom that forms a bond using the unshared electron pair is a nitrogen atom.

8. The near infrared radiation-absorbing composition according to claim 1, further comprising:
a curable compound; and
a solvent.

9. A near infrared radiation cut-off filter formed by curing the near infrared radiation-absorbing composition according to claim 1.

10. A production method for a near infrared radiation cut-off filter, comprising:
a forming a film on a light-receiving side of a solid image pickup element substrate by applying the near infrared radiation-absorbing composition according to claim 1 thereto.

11. A camera module comprising:
a solid image pickup element substrate; and
a near infrared radiation cut-off filter disposed on a light-receiving side of the solid image pickup element substrate,
wherein the near infrared radiation cut-off filter is a near infrared radiation cut-off filter formed by curing the near infrared radiation-absorbing composition according to claim 1.

12. A production method for a camera module including a solid image pickup element substrate and a near infrared radiation cut-off filter disposed on a light-receiving side of the solid image pickup element substrate, the method comprising: a forming a film by applying the near infrared radiation-absorbing composition according to claim 1 to a light-receiving side of the solid image pickup element substrate.

13. A near infrared radiation-absorbing composition comprising:
a copper complex in which copper is a central metal and a compound (A) having two or more coordinating atoms that form bonds using unshared electron pairs,
wherein:
in the compound (A), the coordinating atoms that form bonds using the unshared electron pairs are at least one selected from an oxygen atom, a nitrogen atom and a phosphorus atom;
in the compound (A), the number of atoms that link two coordinating atoms is in a range of 1 to 3; and
the compound (A) is a compound represented by at least one of general formulas (IV-1), (IV-2) and (IV-11) to (IV-20):

$$Y^3\text{-}L^2\text{-}Y^4\text{-}L^3\text{-}Y^5 \qquad (IV\text{-}1)$$

$$Y^6\text{-}L^6\text{-}Y^7\text{-}L^7\text{-}Y^8\text{-}L^8\text{-}Y^9 \qquad (IV\text{-}2)$$

wherein $Y^3$, $Y^5$, $Y^6$ and $Y^9$ each independently represents a group made of a ring including the coordinating atom or at least one selected from Group (UE);
$Y^4$, $Y^7$ and $Y^8$ each independently represents a group made of a ring including the coordinating atom or at least one selected from Group (UE-1);
$L^2$, $L^3$, $L^6$, $L^7$ and $L^8$ each independently represents a single bond or a divalent linking group;

 (IV-11)

 (IV-12)

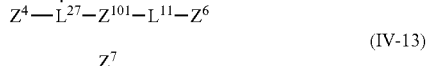 (IV-13)

 (IV-14)

-continued (IV-15)

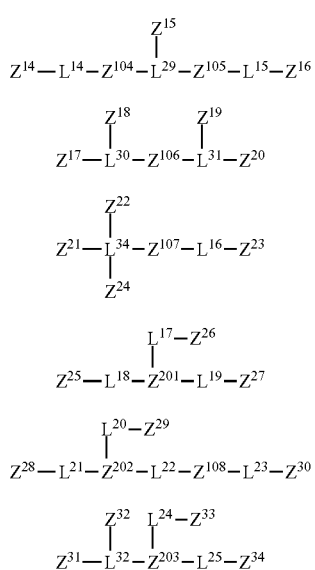

(IV-16)

(IV-17)

(IV-18)

(IV-19)

(IV-20)

wherein $Z^1$ to $Z^{34}$ each independently represents a group made of a ring including the coordinating atom or at least one selected from Group (UE);
$Z^{101}$ to $Z^{108}$ each independently represents a group made of a ring including the coordinating atom or at least one selected from Group (UE-1);
$Z^{201}$ to $Z^{203}$ each independently represents at least one selected from Group (UE-2);
$L^{11}$ to $L^{25}$ each independently represents a single bond or a divalent linking group;
$L^{26}$ to $L^{32}$ each independently represents a trivalent linking group;
$L^{33}$ and $L^{34}$ each independently represents a tetravalent linking group;

Group (UE)

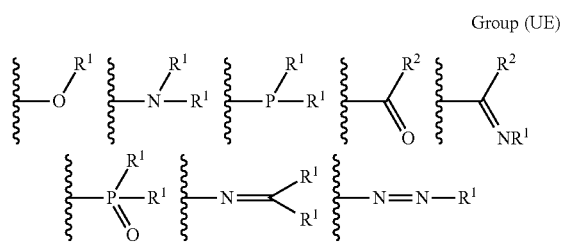

wherein wavy lines represent bonding positions to atomic groups that constitute the compound (A), each $R^1$ independently represents a hydrogen atom, an alkyl group, an alkenyl group, an alkynyl group, an aryl group or a heteroaryl group, and each $R^2$ independently represents a hydrogen atom, an alkyl group, an alkenyl group, an alkynyl group, an aryl group, a heteroaryl group, an alkoxy group, an aryloxy group, a heteroaryloxy group, an alkylthio group, an arylthio group, a heteroarylthio group, an amino group or an acyl group;

Group (UE-1)

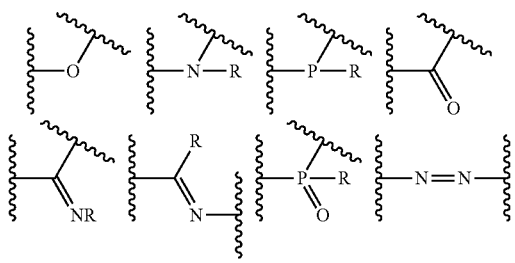

wherein wavy lines represent bonding positions to atomic groups that constitute the compound (A), and each R independently represents a hydrogen atom, an alkyl group, an alkenyl group, an alkynyl group, an aryl group or a heteroaryl group; and Group (UE-2)

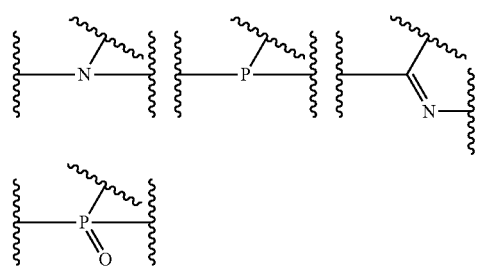

wherein wavy lines represent bonding positions to atomic groups that constitute the compound (A).

14. The near infrared radiation-absorbing composition according to claim 13,
wherein the compound (A) has 2 to 5 coordinating atoms that form bonds using unshared electron pairs.

15. The near infrared radiation-absorbing composition according to claim 13,
wherein the molecular weight of the compound (A) is in the range of 50 to 1,000.

16. The near infrared radiation-absorbing composition according to claim 13,
wherein the compound (A) is represented by General Formula (IV-18).

17. The near infrared radiation-absorbing composition according to claim 13,
wherein the compound (A) is a compound including a 5-membered ring or a 6-membered ring, and coordinating atoms that form bonds using the unshared electron pairs constitute the 5-membered ring or the 6-membered ring.

\* \* \* \* \*